(12) United States Patent
Yamauchi et al.

(10) Patent No.: US 9,639,967 B2
(45) Date of Patent: May 2, 2017

(54) CIRCUIT DIAGRAM SUPPLYING APPARATUS, CIRCUIT DIAGRAM SUPPLYING METHOD AND CIRCUIT DIAGRAM SUPPLYING SYSTEM

(71) Applicant: Shintec Hozumi Co., Ltd., Aichi (JP)

(72) Inventors: Kazunori Yamauchi, Aichi (JP);
Kousuke Naka, Aichi (JP);
Shouichirou Ooshima, Aichi (JP);
Yuusuke Toriyama, Aichi (JP)

(73) Assignee: SHINTEC HOZUMI CO., LTD., Miyoshi-Shi, Aichi (JP)

( * ) Notice: Subject to any disclaimer, the term of this patent is extended or adjusted under 35 U.S.C. 154(b) by 0 days.

(21) Appl. No.: 14/909,439

(22) PCT Filed: Aug. 5, 2014

(86) PCT No.: PCT/JP2014/004086
§ 371 (c)(1),
(2) Date: Feb. 1, 2016

(87) PCT Pub. No.: WO2015/019606
PCT Pub. Date: Feb. 12, 2015

(65) Prior Publication Data
US 2016/0171729 A1 Jun. 16, 2016

(30) Foreign Application Priority Data

Aug. 8, 2013 (JP) .................................. 2013-164651

(51) Int. Cl.
*G06F 17/50* (2006.01)
*G06T 11/20* (2006.01)
(Continued)

(52) U.S. Cl.
CPC .......... *G06T 11/206* (2013.01); *G06F 3/0484* (2013.01); *G06F 17/5045* (2013.01);
(Continued)

(58) Field of Classification Search
None
See application file for complete search history.

(56) References Cited

U.S. PATENT DOCUMENTS 5,784,591 A * 7/1998 Kageshima ......... G06F 17/5022
703/14
7,853,442 B2 * 12/2010 Inaishi ................ G06F 17/5081
703/13
(Continued)

FOREIGN PATENT DOCUMENTS

| CN | 101419586 A | 4/2009 |
|---|---|---|
| CN | 103034230 A | 4/2013 |

(Continued)

OTHER PUBLICATIONS

WO patent application No. PCT/JP2014/004086, International Search Report mailed Sep. 2, 2014.
(Continued)

*Primary Examiner* — Joni Richer
(74) *Attorney, Agent, or Firm* — Weaver Austin Villeneuve & Sampson LLP

(57) ABSTRACT

A circuit diagram supplying apparatus 10, for supplying a user with whole contents of an device system circuit diagram, then requests a server 30 for first-of-all transmission of part-connection-drawing overall circuit diagram data in which connection diagrams LSd are added to a part placement diagram included in the circuit diagram and having electrical component parts PSd arranged therein. Then, after displaying a part-connection-drawing overall circuit diagram based on the transmitted and received part-connection-drawing overall circuit diagram data, the circuit diagram supplying apparatus 10 requests the server 30 for sequential transmission of circuit-element-drawing divisional circuit diagram data (a)-(e).

14 Claims, 40 Drawing Sheets

(51) Int. Cl.
   *G06F 3/0484* (2013.01)
   *G09G 5/377* (2006.01)
   *G06F 3/14* (2006.01)

(52) U.S. Cl.
   CPC ...... *G06F 17/5068* (2013.01); *G06F 17/5095* (2013.01); *G09G 5/377* (2013.01); *G06F 3/14* (2013.01); *G09G 2370/02* (2013.01); *G09G 2370/022* (2013.01); *G09G 2370/027* (2013.01); *G09G 2380/10* (2013.01)

(56) References Cited

U.S. PATENT DOCUMENTS

| | | | | |
|---|---|---|---|---|
| 2008/0140323 | A1* | 6/2008 | Kumagai | G06F 17/5045 702/57 |
| 2008/0244489 | A1* | 10/2008 | Tanamoto | G06F 17/5068 716/118 |
| 2011/0066994 | A1* | 3/2011 | Kunimoto | G06F 17/5045 716/122 |

FOREIGN PATENT DOCUMENTS

| | | |
|---|---|---|
| JP | 2002-315124 | 10/2002 |
| JP | 2004-200831 | 7/2004 |
| JP | 2010-199717 | 9/2010 |

OTHER PUBLICATIONS

JP publication No. 2002-315124, "Presentation of connection state," English machine translation. Oct. 25, 2002.

JP publication No. 2004-200831, "Server apparatus, terminal, data transmission method, data processing program, and data transmission system," English machine translation. Jul. 15, 2004.

JP publication No. 2010-199717, "In-vehicle device and communication system," English machine translation. Sep. 9, 2010.

* cited by examiner

Fig.12

LINK DATA BETWEEN OVERALL CIRCUIT DIAGRAM
AND DIVISIONAL CIRCUIT DIAGRAM

D1; UNIT NUMBER OF CIRCUIT-ELEMENT
       DIVISIONAL CIRCUIT DIAGRAM; 5
   D2; SUPERIMPOSED WRITING START COORDINATES
       OF DIVISIONAL CIRCUIT DIAGRAM (a); (Xa, Ya)
   D3; SUPERIMPOSED WRITING START COORDINATES
       OF DIVISIONAL CIRCUIT DIAGRAM (b); (Xb, Yb)
   D4; SUPERIMPOSED WRITING START COORDINATES
       OF DIVISIONAL CIRCUIT DIAGRAM (c); (Xc, Yc)
   D5; SUPERIMPOSED WRITING START COORDINATES
       OF DIVISIONAL CIRCUIT DIAGRAM (d); (Xd, Yd)
   D6; SUPERIMPOSED WRITING START COORDINATES
       OF DIVISIONAL CIRCUIT DIAGRAM (e); (Xe, Ye)

•
                •
                •

CIRCUIT DIAGRAM SUPPLYING APPARATUS, CIRCUIT DIAGRAM SUPPLYING METHOD AND CIRCUIT DIAGRAM SUPPLYING SYSTEM

TECHNICAL FIELD

The present invention relates to a circuit diagram supplying apparatus, a circuit diagram supplying method and a circuit diagram supplying system.

BACKGROUND ART

In recent years, to improve performance in various types of device systems, for example, for improvement of brake control in vehicles or improvement of fuel efficiency in hybrid systems, electrical component to be used in device systems have been advanced toward further diversification and more varieties of product models, so that circuit diagrams of device systems have been complicated. Various techniques have been proposed for presenting connection condition among electrical component contained in such complicated device system circuit diagrams, as well as methods for divisionally transmitting various types of data via networks have also been proposed.

For example, various types of device systems in vehicles vary depending on vehicle types, vehicle grades and the like and have been being improved day by day. Vehicle maintenance departments or maintenance contract companies are required to check wiring statuses among electrical component in maintenance and inspection of those systems. On such occasions, circuit diagrams in which systems' design circuits are rewritten with interconnecting lines and various types of connectors for connection of interconnecting lines to electrical component are used. However, those rewritten circuit diagrams are also complicated naturally due to complications of the systems and increases in electrical component counts as described above, and system improvements involve latest and older circuit diagrams. Therefore, for vehicle maintenance departments and maintenance contract companies, it would be impracticable to accumulate circuit diagrams for all device systems, and there have been proposed methods relying on supply of necessary circuit diagram data from a server each time it is required. Even if a data dividing-and-transmitting method is used for such data transmission, circuit diagrams are not displayed until data received by the divisional transmission is restructured on the receiver side. Standby time required until circuit diagrams obtained through data divisional transmission and data restructuring are displayed becomes increasingly longer as the communication frequency band of a data communications network that provides data transmission with the server becomes narrower. Due to this, in an environment in which broadband data communications cannot be expected or under a condition of a low processing speed for data restructuring by a apparatus on the divisional-transmission reception side, the wait time is elongated such that the user may feel a sense of incompatibility as if a system abnormality occurred. Such an incompatible feeling would last increasingly longer with increasing amount of circuit diagram data to be transmitted, or the incompatible feeling becomes increasingly more noticeable with decreasing processing speed of data restructuring, hence a desire for improvement of the case. In addition, it is also desirable to provide circuit diagram ready for improvement of equipment systems as well as to accomplish improvement of generality and cost reduction involved. Although vehicles are described as an example, the case is similar also with ships and aircraft, machine tools, plant facilities, and the like.

SUMMARY OF THE INVENTION

In order to achieve at least part of the above-described problems, the present invention may be embodied in various aspects as described below.

In a first aspect, a circuit diagram supplying apparatus that acquires, from an external apparatus, a circuit diagram for a device system including a plurality of electrical component and display the circuit diagram on a display unit is provided. The circuit diagram supplying apparatus according to the first aspect includes: a transmission requester configured to, upon receiving specification of the device system as a supply object of the circuit diagrams, request the external apparatus for transmission of circuit diagram drawing data for displaying an image of the circuit diagram of the specified device system, wherein the circuit diagram drawing data includes part placement drawing data for displaying an image of a part placement diagram locating electrical component part diagram for each electrical component included in the specified device system; and remaining circuit-diagram-element drawing data for displaying an image of the remaining circuit diagram elements other than the electrical component part diagram in association with a drawing position of the electrical component part diagram in the part placement diagram, and a display controller configured to display an image of the circuit diagram on the display unit based on the circuit diagram drawing data received from the external apparatus. The transmission requester requests the external apparatus for transmission of at least the part placement drawing data of the circuit diagram drawing data for the specified device system; and after request of transmission of the part placement drawing data, requests for transmission of the remaining circuit-diagram-element drawing data in transmission units of divided drawing data, the divided drawing data is data a result of dividing the remaining circuit-diagram-element drawing data in units of a display area displayable on the display unit, and the display controller, after displaying an image, on the display unit, of the part placement diagram based on the part placement drawing data received from the external apparatus, displays an image based on the divided drawing data divided-circuit-diagram drawing data received in the transmission units by superimposing on the part placement diagram being displayed on the display unit.

With the circuit diagram supplying apparatus according to the first aspect, an incompatible feeling of system abnormality for the user can be suppressed.

In the circuit diagram supplying apparatus according to the first aspect, the transmission requester, upon receiving specification of an electrical component included in the specified device system, may further request transmission of the divided drawing data including the electrical component part diagram corresponding to the specified electrical component unit in a transmission request to the external apparatus for the remaining circuit-diagram-element drawing data in the transmission units of the divided drawing data, and thereafter may request sequential transmission of the divided drawing data placed next to the divided drawing data including the electrical component part diagram corresponding to the specified electrical component, and the display controller may display on the display unit an image of the part placement diagram based on the part placement drawing data received from the external apparatus so that the electrical component part diagram corresponding to the specified electrical component unit is contained in the display area of the display unit. In this case, the user can be supplied with the part placement diagram including the electrical component part diagram corresponding to the electrical component specified by the user himself/herself in an initial state. Thus, the user is allowed to present scroll display or the like of a part placement diagram around the electrical component part diagram corresponding to the electrical component specified by the user himself/herself.

In the circuit diagram supplying apparatus according to the first aspect, the display controller may display the electrical component part diagram corresponding to the specified electrical component in highlight display when displaying the part placement diagram based on the part placement drawing data received from the external apparatus. In this case, the user can be impressed with the electrical component part diagram corresponding to the electrical component specified by the user himself/herself.

In the circuit diagram supplying apparatus according to the first aspect, the remaining circuit-diagram-element drawing data may include: connection drawing data for displaying an image of a connection diagram for connecting the electrical component part diagram in the part placement diagram by reflecting actual connections between the electrical component by superimposing on the part placement diagram; connection information drawing data for displaying an image of connection information for connections of the connection diagram and terminal information for connecting terminals of the connections by superimposing on the part placement diagram; and electrical-component information drawing data for displaying an image of electrical-component information as to an electrical component corresponding to the electrical component part diagram in the part placement diagram by superimposing on the part placement diagram, the transmission requester may further request transmission of the connection drawing data before transmission request of the remaining circuit-diagram-element drawing data, and the display controller may display an image of the connection diagram based on the connection drawing data by superimposing on the part placement diagram based on the part placement drawing data. In this case, from the beginning an image in which connection diagrams are superimposed on the part placement diagram can be supplied to a user.

In the circuit diagram supplying apparatus according to the first aspect, the display controller, when sequentially receiving the remaining circuit-diagram-element drawing data in transmission units of the divided drawing data, may receive data necessary for calculating a ratio of the received divided drawing data to the whole remaining circuit-diagram-element drawing data to be sequentially received, and displaying an image of the calculated ratio on the display unit. In this case, since a circuit diagram supplying status can be presented to a user, the incompatible feeling of system abnormality for the user can be further suppressed.

In a second aspect, a circuit diagram supplying system is provided. The circuit diagram supplying system of the second aspect includes: any one of the circuit diagram supplying apparatus of the first aspect; and a server as the external apparatus, including: a storage unit configured to store the part placement drawing data and the remaining circuit-diagram-element drawing data; and a transmitter configured to transmit, to the circuit diagram supplying apparatus, the part placement drawing data and the remaining circuit-diagram-element drawing data requested from the circuit diagram supplying apparatus. According to the circuit diagram supplying system of the second aspect, functions and effects similar to those of the circuit diagram supplying apparatus according to the first aspect can be obtained.

In a third aspect, a circuit diagram supplying method of acquiring, from an external apparatus, a circuit diagram for a device system including a plurality of electrical components and displaying the circuit diagrams on a display unit is provided. The circuit diagram supplying method of the third aspect comprises: receiving specification of the device system as a supply object of the circuit diagrams; in implementation of request to the external apparatus for transmission of circuit diagram drawing data for displaying an image of the circuit diagrams of the specified device system, requesting transmission of at least the part placement drawing data of the circuit diagram drawing data for the specified device system, and after that requesting sequential transmission of the remaining circuit-diagram-element drawing data in transmission units of divided drawing data, the divided drawing data is data a result of dividing the remaining circuit-diagram-element drawing data in units of display areas displayable on the display unit, the circuit diagram drawing data including: part placement drawing data for displaying an image of a part placement diagram locating electrical component part diagram for each electrical component included in the specified device system; and remaining circuit-diagram-element drawing data for displaying an image of remaining circuit diagram elements other than the electrical component part diagram in association with drawing positions of the electrical component part diagrams in the part placement diagram; and in displaying an image, on the display unit, of the circuit diagram based on the circuit diagram drawing data received from the external apparatus, displaying the part placement diagram based on the part placement drawing data received from the external apparatus on the display unit, and after that displaying images based on the divided drawing data received in the transmission units by superimposing on the part placement diagram already displayed on the display unit.

According to the circuit diagram supplying method according to the third aspect, functions and effects similar to those of the circuit diagram supplying apparatus according to the first aspect can be obtained. Also, the circuit diagram supplying method according to the third aspect can be implemented in various embodiments in the same fashion as the circuit diagram supplying apparatus according to the first aspect.

The present invention can be implemented in various embodiments. For example, the invention may be implemented in such embodiments as methods for supplying a user with circuit diagrams on a basis of an device system, programs for acquiring circuit diagrams on a basis of an device system from a server and supplying a user with those circuit diagrams, recording mediums in which those programs are stored, and the like. Moreover, the invention can also be implemented in such embodiments as apparatus and methods for supplying a user with circuit diagrams on a basis of an device system in vehicles and ships, aircraft, machine tools, plant facilities, and the like.

BRIEF DESCRIPTION OF THE DRAWINGS

FIG. 12 is an explanatory view schematically showing contents of link data on the device system circuit diagram shown in FIG. 5;

DESCRIPTION OF THE EMBODIMENTS

With the circuit diagram supplying apparatus according to an embodiment of the invention, transmission of part placement drawing data for displaying an image of a part placement diagram having electrical component part diagram arranged therein is first received from an external apparatus, and then a part placement diagram based on the received part placement drawing data is displayed on a display unit. The part placement drawing data are data sufficient to display an image of the part placement diagram having the electrical component part diagram arranged therein, so that its data amount is limited as compared with the circuit diagram drawing data that are all the data for displaying an image of the circuit diagrams on the basis of each device system. Thus, with the circuit diagram supplying apparatus according to the embodiment of the invention, after transmission of circuit diagram drawing data as to an device system specified by the user is requested of the external apparatus, image display of the part placement diagram can promptly be displayed on the display unit. Thus, an incompatible feeling of system abnormality for the user can be suppressed. Also, the circuit diagram supplying apparatus according to the embodiment of the invention, after requesting the external apparatus for transmission of the part placement drawing data, sequentially requests transmission of remaining circuit-diagram-element drawing data in units of divided drawing data which are limited in data amount as compared with the circuit diagram drawing data, and displays images based on the divided drawing data received in the transmission units sequentially as they are superimposed on the part placement diagram. With the circuit diagram supplying apparatus according to the embodiment of the invention, since there is no need for reconstructing the received divided drawing data to the state before the division, the incompatible feeling of system abnormality for the user can be suppressed also in this respect. Otherwise, since circuit diagram drawing data for displaying an image of circuit diagrams on the basis of each device system are transmitted from the external apparatus and subjected to corrections and additions and the like, as required, on the server side as the external apparatus, the circuit diagram supplying apparatus according to the embodiment of the invention can receive circuit diagram drawing data that have been subjected to such corrections, additions and the like, enhancing the general-purpose utility of the apparatus. The feature that there is no need for storing circuit diagram drawing data on the circuit diagram supplying apparatus side contributes also to cost reduction of the circuit diagram supplying apparatus.

Figure 1:
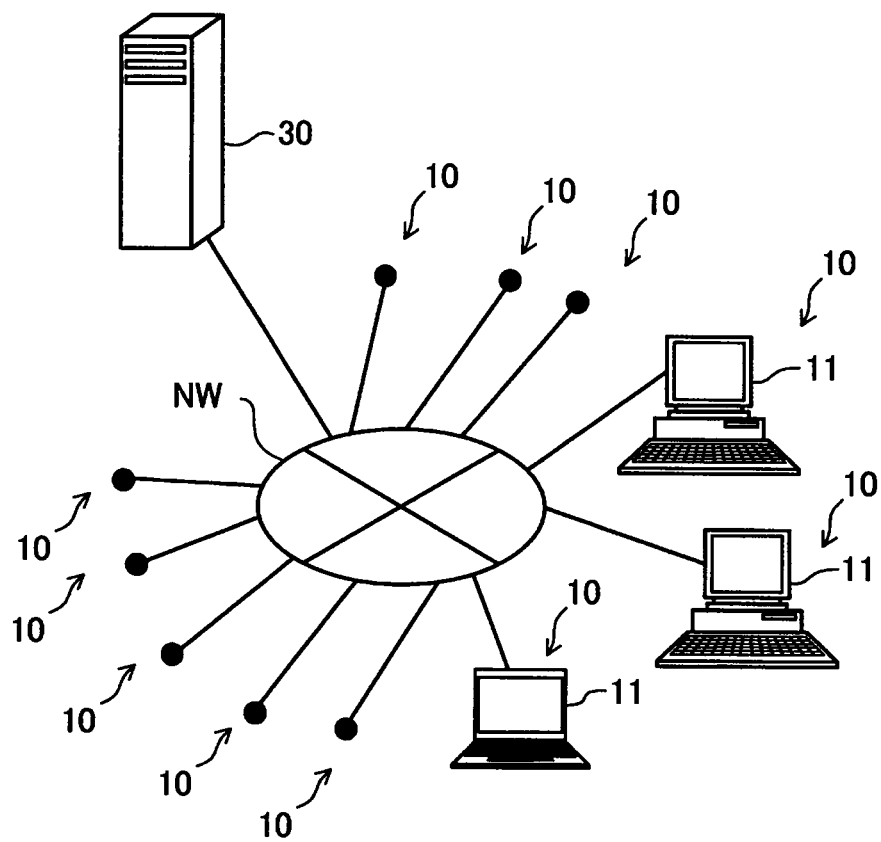
FIG. 1 is an explanatory view for conceptually explaining a relationship between a circuit diagram supplying apparatus 10, which is an embodiment of the present invention, and a server 30.
Figure 2:
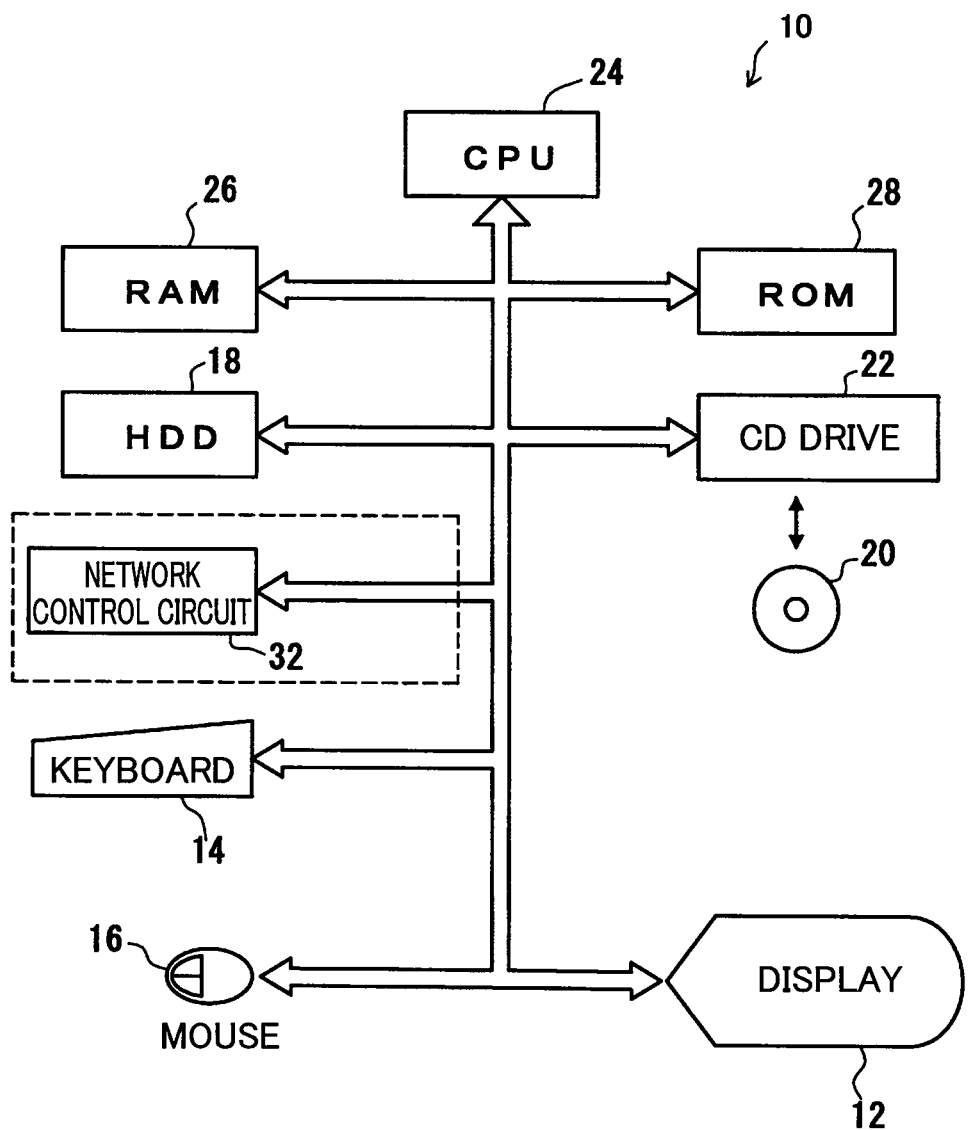
FIG. 2 is a block diagram showing an outlined configuration of the circuit diagram supplying apparatus 10.

Hereinafter, embodiments of the present invention will be described with reference to the accompanying drawings. FIG. 1 is an explanatory view for conceptually explaining a relationship between a circuit diagram supplying device 10, which is an embodiment of the invention, and a server 30. FIG. 2 is a block diagram showing an outlined configuration of the circuit diagram supplying apparatus 10.

The circuit diagram supplying apparatus 10 (circuit diagram display device), which is to be used in vehicle maintenance departments, maintenance contract companies and the like, is connected to the server 30, so as to be enabled to perform intercommunications of data with the server 30, via a network NW (e.g., public line and private line or Internet, intranet, local area network (LAN), etc.), as shown in FIG. 1. The circuit diagram supplying apparatus 10 is implemented by a dedicated apparatus specialized in circuit diagram supply, otherwise may be implemented by a general-purpose computer 11. The circuit diagram supplying apparatus 10, as shown in FIG. 2. includes a display 12 as a display unit composed of a liquid crystal screen and the like, a keyboard 14 as an input/output unit, and a mouse 16. It is noted that instead of the keyboard 14 and the mouse 16 or in combination with these devices, a tablet terminal may be used. The circuit diagram supplying apparatus 10 includes a hard disk drive (hereinafter, referred to as HDD) 18 for storing data, a CD drive 22 for reading data stored in a CD-ROM 20, and a network control circuit 32, and further includes a CPU 24 which is a central processing unit for integrally controlling those members and which is connected to the above equipment members as well as a RAM 26 and a ROM 28 via buses so as to be interactively communicable therewith.

The CPU 24 executes various programs stored in the HDD 18 by developing those programs in the RAM 26, in which case the CPU 24 executes data read from the HDD 18 and the CD drive 22, temporary data write and read to and from the RAM 26, display control for the display 12, and the like. The CD-ROM 20 has preparatorily stored therein programs to be transferred to the HDD 18 as well as later-described various types of data, where these programs and data are to be read by the CD drive 22 and transferred to the HDD 18. In addition, programs and data may be stored not only in the CD-ROM 20 but also in floppy disks and magneto-optical disks as well as in various portable recording mediums (carrying-type recording mediums) such as IC cards. Further, the various programs and data may be transferred from the server 30 as an external apparatus via a network NW to which the network control circuit 32 is connected. In addition, the external apparatus may be, in addition to the server 30, a network attached device (NAS) which is connected to the network, a calculator which is physically different from the circuit diagram supplying apparatus 10, or a storage device. When the external apparatus is a storage device having no function of transmitting drawn image data in a later-described transmission procedure (a function of executing application programs), an application program for sequentially acquiring data from the storage device may be provided on the circuit diagram supplying apparatus 10 side. In this case, individual circuit diagram drawing data may be accompanied with identifiers representing an order of data acquisition so that the circuit diagram supplying apparatus 10 can easily discriminate the acquisition order.

Figure 3:
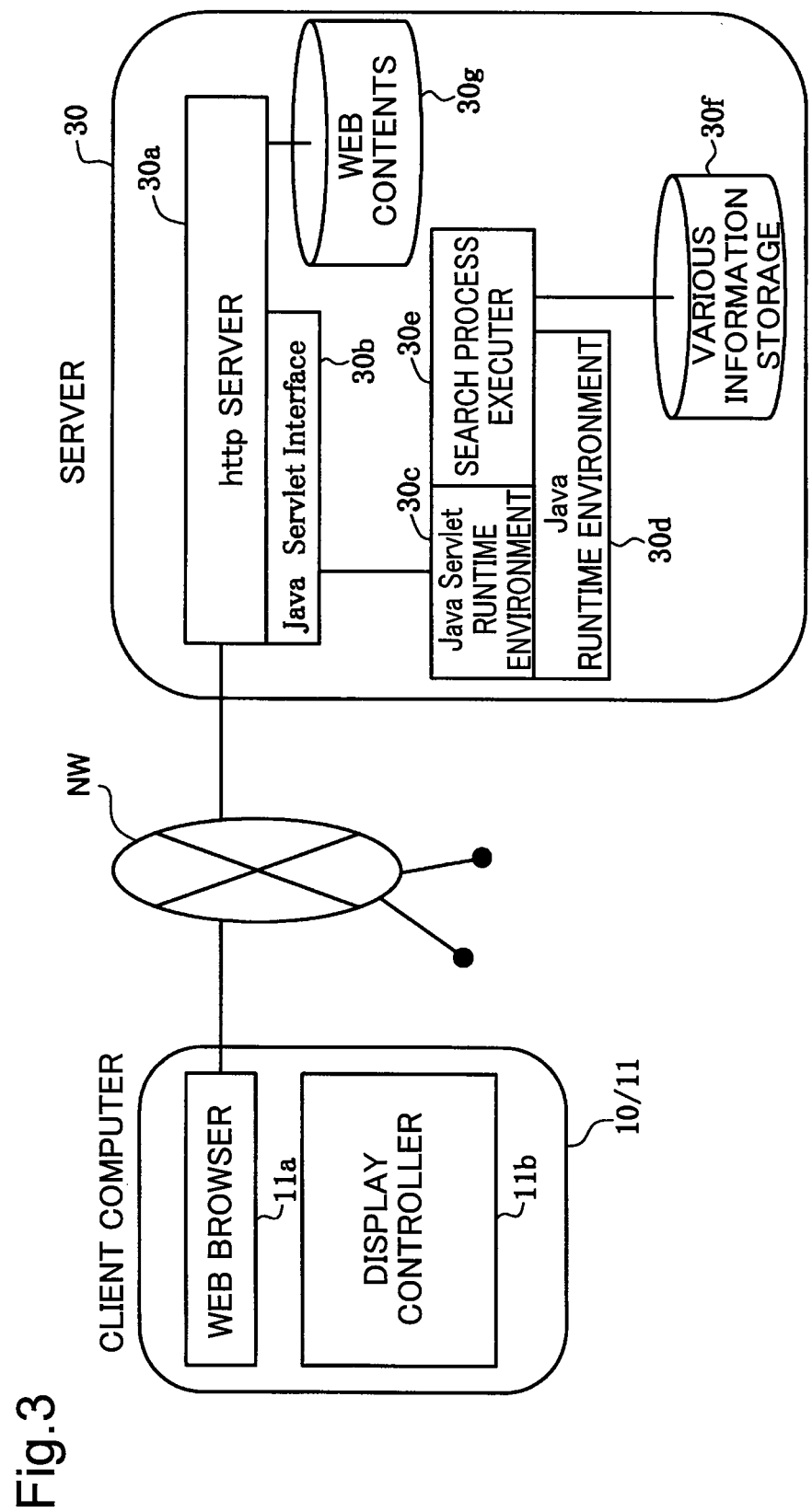
FIG. 3 is a functional block diagram of search and display process to be established in a circuit diagram supplying system made up with the server 30 and a computer 11 connected to each other.

The server 30, which is generally similar to the circuit diagram supplying apparatus 10 in terms of hardware configuration including CPU, ROM, RAM and the like, updates and stores circuit diagram data to be supplied to the circuit diagram supplying apparatus 10 as required, and transmits the circuit diagram data or the like on request from the circuit diagram supplying apparatus 10. FIG. 3 is a functional block diagram of search and display process to be established in a circuit diagram supplying system made up with the server 30 and a computer 11 connected to each other. As shown in the figure, in order that functions necessary for circuit diagram supply are distributed to and executed by the computer 11 and the server 30, the computer 11 has a Web browser 11a (Web browser section) and a display controller 11b. Therefore, the computer 11, by executing the Web browser 11a (by the Web browser section), receives drawing data (image data) necessary for displaying an image of a circuit diagram or other various data from the server 30 via the Internet, and displays an image based on the received drawing data onto the display 12 by the display controller 11b.

The server 30, including a http server 30a, has a server environment of high generality that does not depend on the connected circuit diagram supplying apparatus 10, i.e. on the OS of the computer 11. That is, the server 30 includes the Java Servlet Interface 30b, a Java Servlet execution environment 30c, a Java execution environment 30d, a search process execution section 30e, and a various information storage section 30f for storing therein later-described various data. Then, on request from the Web browser (computer 11), the server 30 executes later-described search process, and transmits its results to the requester Web browser (computer 11) while storing the results in Web contents 30g as HTML files. In addition, although the Java Servlet is used to enhance the process generality, yet it is also allowable, only if the computer 11 is fixed as a specified-OS-mounted client computer, to adopt an execution environment capable of distributed processing only with the computer.

Figure 4:
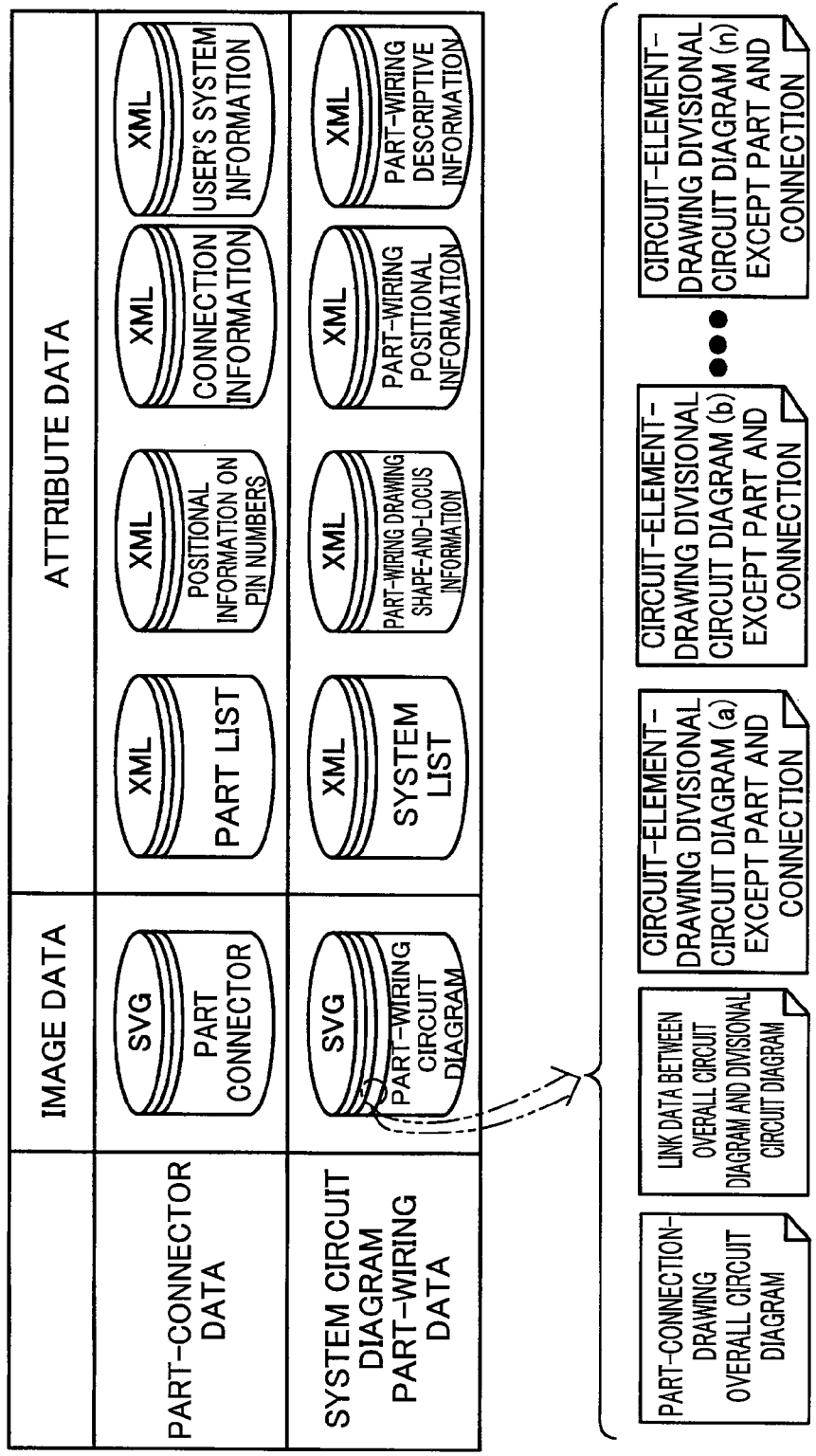
FIG. 4 is an explanatory view for explaining circuit diagram data to be transmitted from the server 30 and received by the circuit diagram supplying apparatus 10.

Next, circuit diagram data to be acquired from the server 30 by the circuit diagram supplying apparatus 10 will be described. This embodiment features in that drawing data are stored in the server 30 and transmitted to the circuit diagram supplying apparatus 10 for implementation of image drawing of circuit diagrams of various device systems such as anti-lock braking system (ABS), exhaust gas circulation system, antiknocking system, idle speed control system, traction control system and the like in vehicles, where those circuit diagrams are drawn by using part placement drawing data, which are to provide image display of a part placement diagram with electrical component part diagrams disposed in units of plural electrical component units constituting each system, as well as by using other drawing data. FIG. 4 is an explanatory view for explaining circuit diagram data to be transmitted from the server 30 and received by the circuit diagram supplying apparatus 10.

As shown in FIG. 4, the server 30 has stored in the various information storage section 30f (see FIG. 3), as circuit diagram data, data as to electrical component (components) and connectors as well as data as to parts and wiring to be connection-objects for connectors. This makes it possible to first specify a system circuit diagram, which is a display object, via connectors and parts and then transmit data necessary for displaying an image of the specified system circuit diagram in response to a request from the circuit diagram supplying apparatus 10 as will be described later. In addition, examples of the electrical component (components) to be connection-objects for the connectors include various actuators and their control devices, e.g. as engine-related examples, injectors for individual engine cylinders, knocking sensors, engine rotational speed sensors or the like as well as electronic control devices for their control (ECU, control module, etc.) or the like.

The data as to parts and connectors include, as shown in FIG. 4, image data dedicated to drawing of end face shapes of parts and connectors as well as pin numbers included in the parts or connectors, and attribute data such as part list data of the individual parts and connectors, positional information data of the pin numbers, connection information data, user's system information data, and the like.

The image data of parts and connectors are image data for displaying an image of 12 of appearances (profiles) and pin numbers of parts and connectors as will be described later. These image data are stored on a basis of each component or connector, where code number data for specifying parts and connectors and color data for specifying colors of those connectors are associated with the image data.

The part list data are data showing part list names and part codes that allow parts and connectors to be specified, as well as data showing on which electrical component unit a connector is mounted and in which or what device system the connector is to be used. The part list data are used as a key for later-described search process. The positional information data of the pin numbers are data for specifying positions of pins contained in parts or connectors. The connection information data are data including information on individual pins contained in parts and connectors as well as interconnecting lines connected to the pins (e.g., numbers or color data for discriminating the interconnecting lines), connection-destination pin numbers for connection via the interconnecting lines, above-described code data for specifying connectors containing the pins, and part list names of the connectors, as these data are associated with one another on the part-and-connector basis.

Part-and-wiring data contained in the system circuit diagram are prepared on a basis of each system contained in a vehicle, e.g. for each device system such as an engine control system, an ABS system, a light control system, or an indoor illumination system, and the data are built up based on design circuits for actuators, sensors, other electronic control devices and the like in each device system. Then, the part-and-wiring data include image data for display an image of circuit diagrams containing parts and wirings, as well as attribute data such as system list data, drawing shape-and-locus information data of parts and wirings, positional information data, and descriptive information data. The image data of parts are data necessary for drawing parts in their circuit diagrams, such as data for schematically representing functions to be fulfilled by the individual parts with inclusion of image data for drawing as a part placement diagram in which electrical component parts on a basis of an electrical component unit contained in the device system are disposed by, e.g., schematic representation in a block-diagram fashion on an xy-plane circuit diagram. The image data as to wirings are data for displaying an image in which connection diagrams for making connections of electrical component part diagrams in a part placement diagram by reflecting actual part-to-part connections are superimposed on the part placement diagram as loci of straight lines or bent lines.

The system list data are data showing titles of systems, including data for discriminating series of connection systems including line-connected parts in each system such as an in-vehicle communication system, a front-wheel brake sensor system, an air-conditioning system and the like, as well as data for discriminating parts and wirings included in those individual connection systems (e.g., part names and symbols, wiring symbols, etc.). That is, based on the title of an device system and the connection systems in the system, parts and interconnecting lines included in the connection system can be specified. All of parts and interconnecting lines included in the device system can also be specified.

The drawing shape-and-locus data of parts and wirings are data for prescribing drawing shapes of parts and wiring loci in the already-described image data. The part-and-wiring positional data are data necessary for prescribing a drawing position, which is the position where to dispose a part image by the already-described image data in the xy-plane circuit diagram, or data necessary for prescribing a drawing position in drawing of wiring loci on the xy-plane circuit diagram while parts are being connected to one another. The part-and-wiring descriptive data are data necessary for display an image in which information for text description of colors of actual part-to-part connections or terminal numbers representing connecting terminals of actual connection, part name and function and the like is superimposed on the part placement diagram. By using such data, images of individual parts are drawn on the xy-plane circuit diagram and moreover individual interconnecting lines are drawn as images of their interconnecting loci. In this case, the above-described drawing locus data and drawing positional data as to wirings include data for implementing drawing of branch and junction points in wiring mounting together with interconnecting lines, where branch and junction points are also drawn in the wiring loci.

The part-and-wiring data are associated with information for discriminating parts and wirings (e.g., part names, part symbols, wiring codes, etc.). Therefore, as will be described later, when a part is specified or an interconnect line is specified, the specified part and wiring can be drawn by using the image data or the like as already described.

Figure 5:
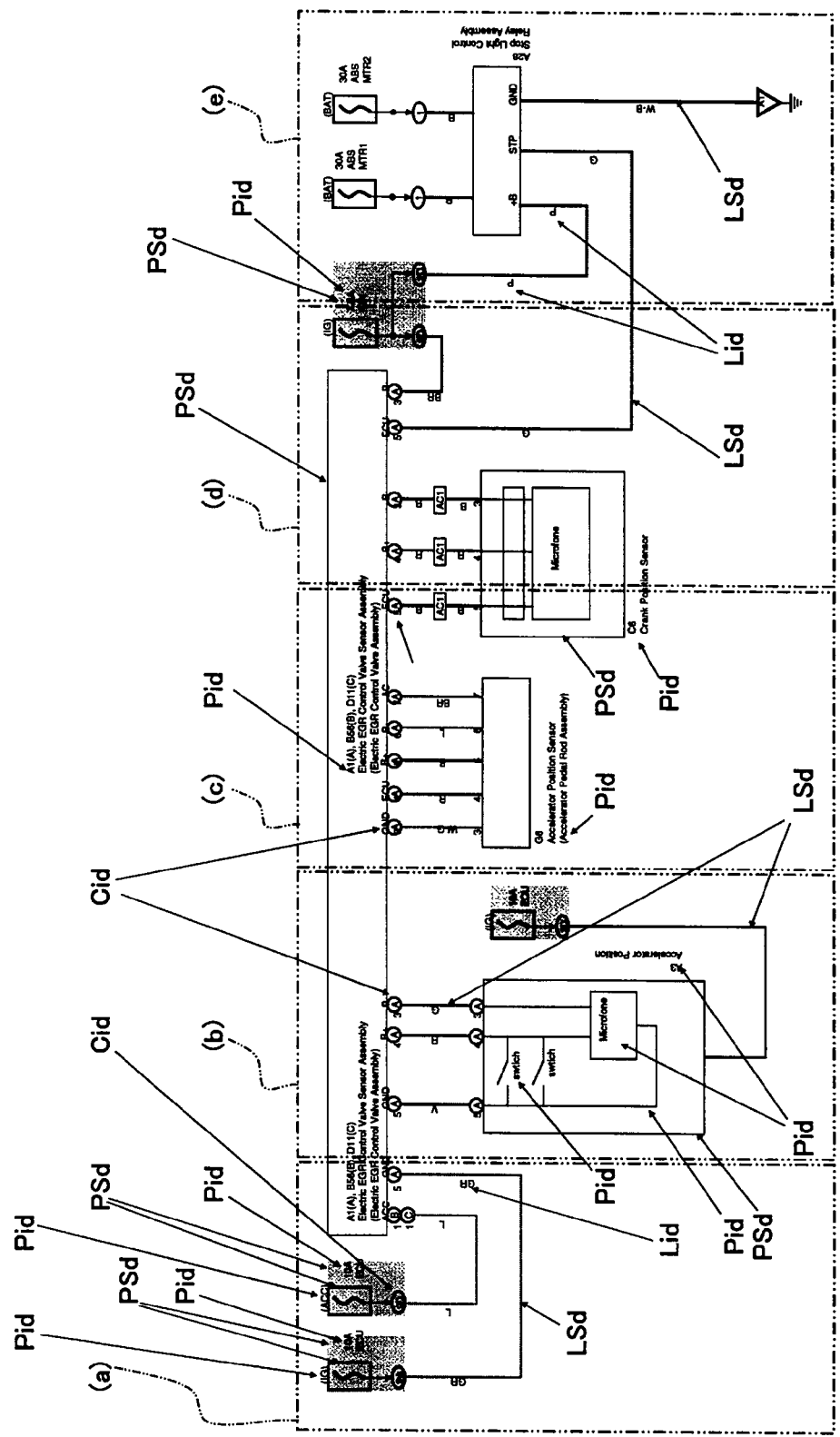
FIG. 5 is an explanatory view showing a circuit diagram of an device system as an example, showing an image display in which electrical component part diagrams, connections and the like contained in the system are included.

For example, an engine control system is made up by including the above-described data as to such parts as an injector, a power source, a fuse box and an ignition switch, as well as the above-described data as to wirings for connecting these parts, in all. Therefore, using all of the above-described data on the parts (electrical component) included as well as the above-described data on the wirings in one device system makes it possible to provide image display of circuit diagrams of this device system. FIG. 5 is an explanatory view showing a circuit diagram of an device system as an example, showing an image display in which electrical component part diagrams, connections and the like contained in the system are included.

The device system circuit diagram shown in FIG. 5 includes a part placement diagram in which electrical component parts PSd on a basis of an electrical component unit included in the device system are arranged in the circuit diagram as they are drawn in framed rectangular shapes, non-framed rectangular shapes and the like. This device system circuit diagram also includes connection diagrams LSd for connecting individual electrical component parts PSd in the part placement diagram as they are superimposed on the part placement diagram as straight or bent line loci in the part placement diagram by reflecting actual connections. In addition to this, the device system circuit diagram shown in FIG. 5 includes connection text information Lid such as colors of actual part-to-part connections of electrical component parts PSd, terminal text information Cid such as part terminal numbers of actual part-to-part connections of electrical component parts PSd, part text information Pid such as part name, part's exerting function, and in-part connection statuses of electrical component parts PSd, as they are superimposed and drawn on the part placement diagram. Drawing positions of the respective electrical component parts PSd in the part placement diagram are prescribed by xy-coordinates at left upper corner portion of the electrical component parts PSd as an example. The connection diagrams LSd are prescribed by xy-coordinates and locus coordinates of an origin, where the origin is assumed as a terminal position in the electrical component parts PSd. The connection text information Lid, the terminal text information Cid, and the part text information Pid are prescribed by xy-coordinates at left upper corner portion of a text description area. Then, the xy-coordinates that define drawing positions in the circuit diagram of FIG. 5 are stored in the various types of attribute data shown in FIG. 4.

Figure 6:
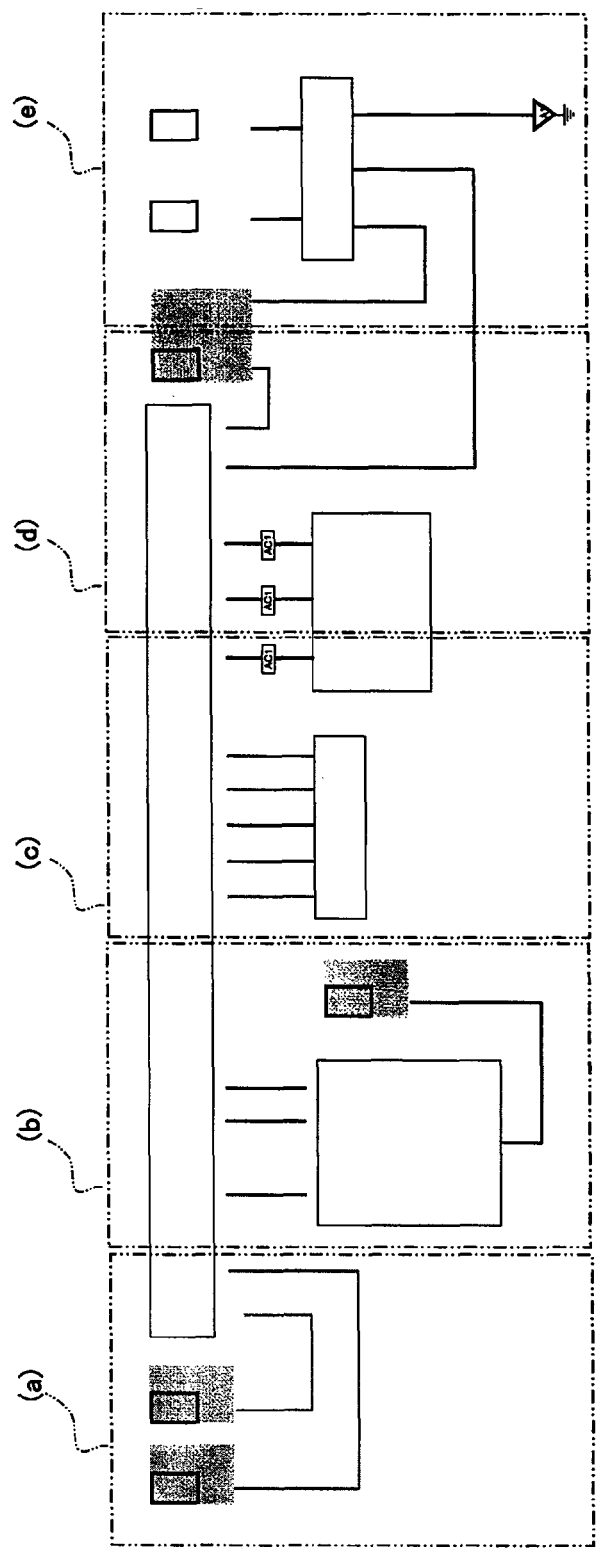
FIG. 6 is an explanatory view showing an aspect that a part-connection-drawing overall circuit diagram of the device system of FIG. 5 is drawn based on part-connection-drawing overall circuit diagram data.

In this embodiment, image data that enable image display of such a circuit diagram as shown in FIG. 5 are stored in the various information storage section 30f of the server 30 on the basis of each device system. For this processing, circuit diagram drawing data for each device system are stored as they are divided, as shown in FIG. 4, into part-connection-drawing overall circuit diagram data, link data, and circuit-element-drawing divisional circuit diagram data (a)-(n). The circuit diagram drawing data are circuit diagram data that allow the circuit diagram to be displayed in image over the its full region including the electrical component parts PSd and the connection diagrams LSd. FIG. 6 is an explanatory view showing an aspect that a part-connection-drawing overall circuit diagram of the device system of FIG. 5 is drawn based on the part-connection-drawing overall circuit diagram data. Drawing based on the part-connection-drawing overall circuit diagram data included in the circuit diagram drawing data on the basis of each device system allows obtainment of a part-connection-drawing overall circuit diagram in which part-to-part connection diagrams LSd are superimposed on the part placement diagram with arrangement of electrical component parts PSd included in the device system of FIG. 5, as shown in FIG. 6.

The circuit-element-drawing divisional circuit diagram data (a)-(n) are circuit diagram data that enable image display in such a fashion that, with each device system circuit diagram divided into specified areas, such circuit elements as the part text information Pid, the connection text information Lid and the terminal text information Cid except electrical component parts PSd and connection diagrams LSd included in each divisional area can be displayed in image as shown in FIG. 5. In this embodiment, the divisional areas for dividing an device system circuit diagram are defined in consideration of a display area of the display 12 in the circuit diagram supplying apparatus 10 that performs image display based on data transmitted from the server 30. For example, since the display 12 of the circuit diagram supplying apparatus 10 normally has a display resolution of 1024×768 pixels or so, an area narrower than those displayable at this display resolution is taken as a divisional area for division of the device system circuit diagram. Then, the server 30 stores circuit-element-drawing divisional circuit diagram data (a)-(n) of each device system circuit diagram together with the above-described part-connection-drawing overall circuit diagram data in the various information storage section 30f. In addition, the display resolution may be set to a higher or lower resolution.

Figure 7:
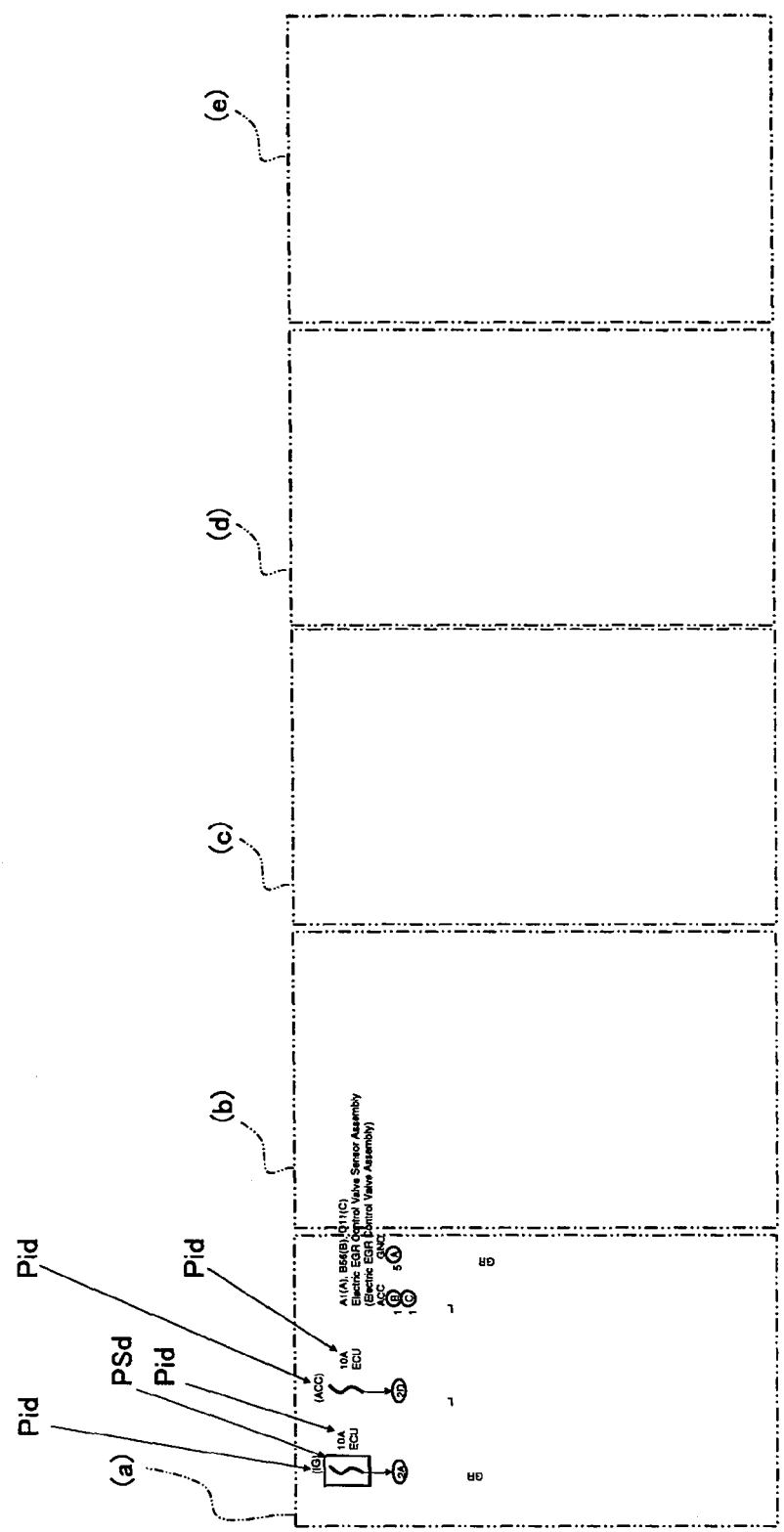
FIG. 7 is an explanatory view showing an aspect that circuit elements of a divisional area (a) in the device system circuit diagram of FIG. 5 are drawn based on circuit-element-drawing divisional circuit diagram data (a)
Figure 8:
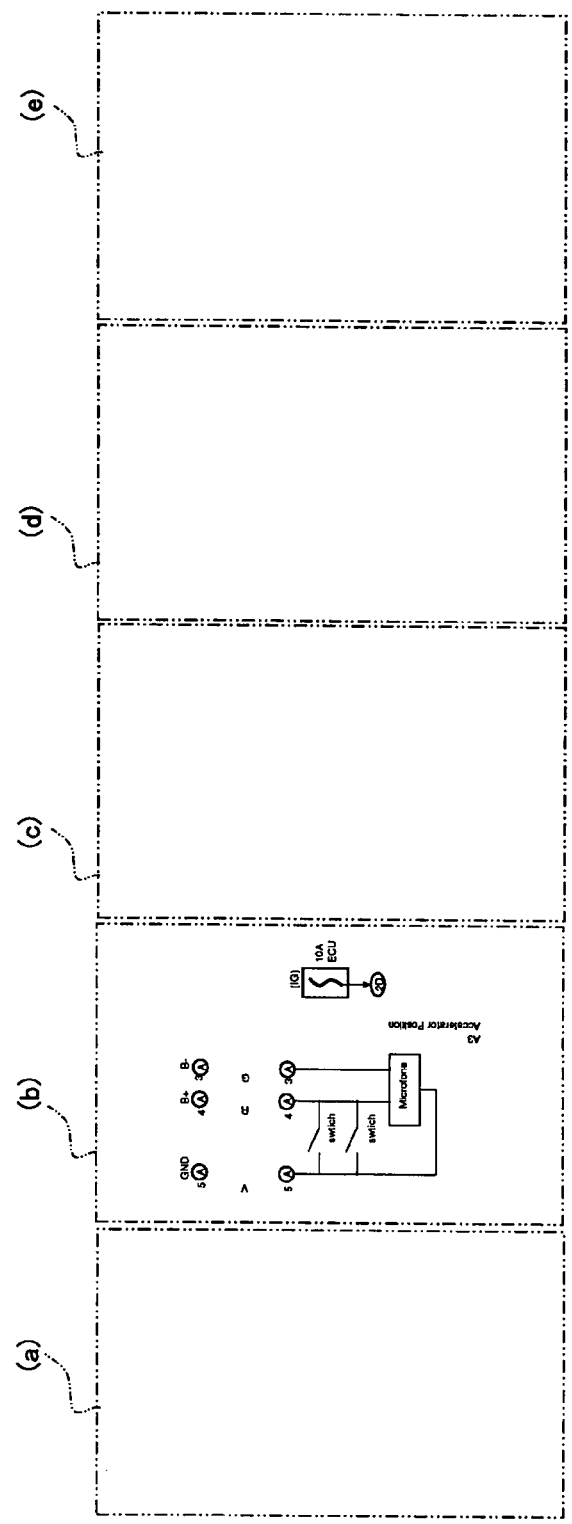
FIG. 8 is an explanatory view showing an aspect that circuit elements of a divisional area (b) in the device system circuit diagram of FIG. 5 are drawn based on circuit-element-drawing divisional circuit diagram data (b)
Figure 9:
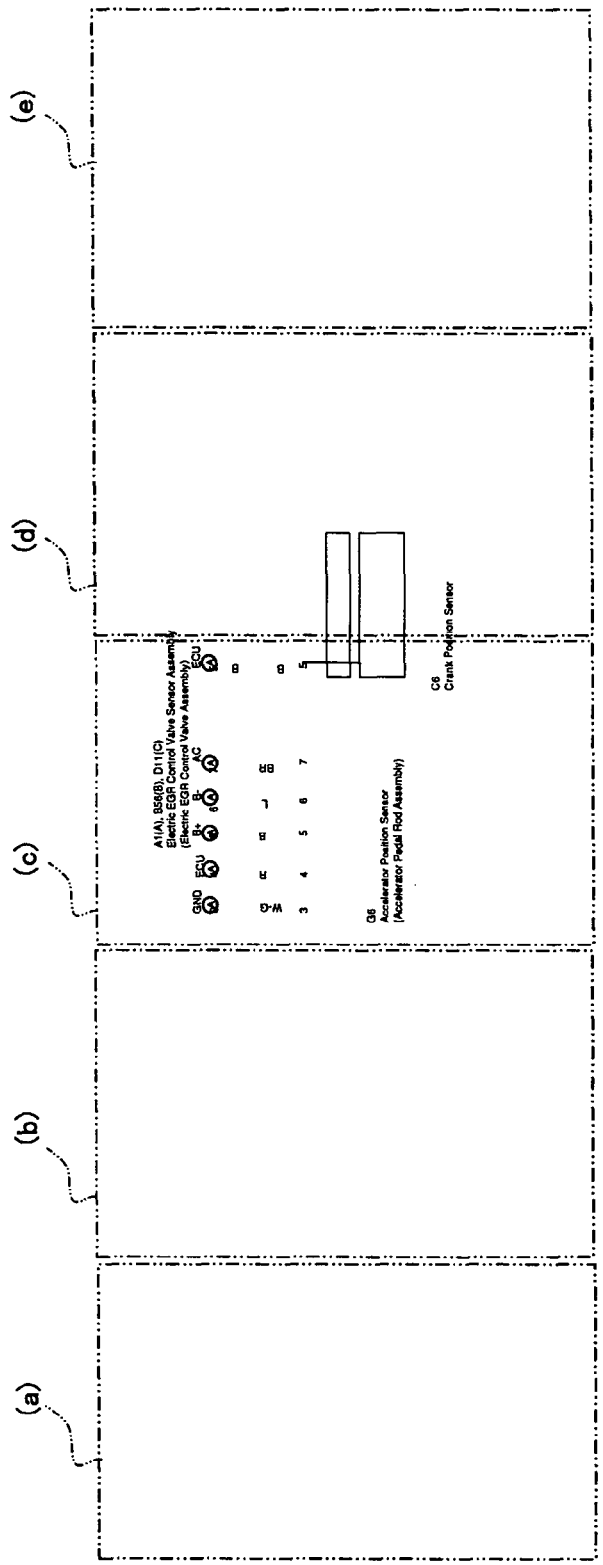
FIG. 9 is an explanatory view showing an aspect that circuit elements of a divisional area (c) in the device system circuit diagram of FIG. 5 are drawn based on circuit-element-drawing divisional circuit diagram data (c)
Figure 10:
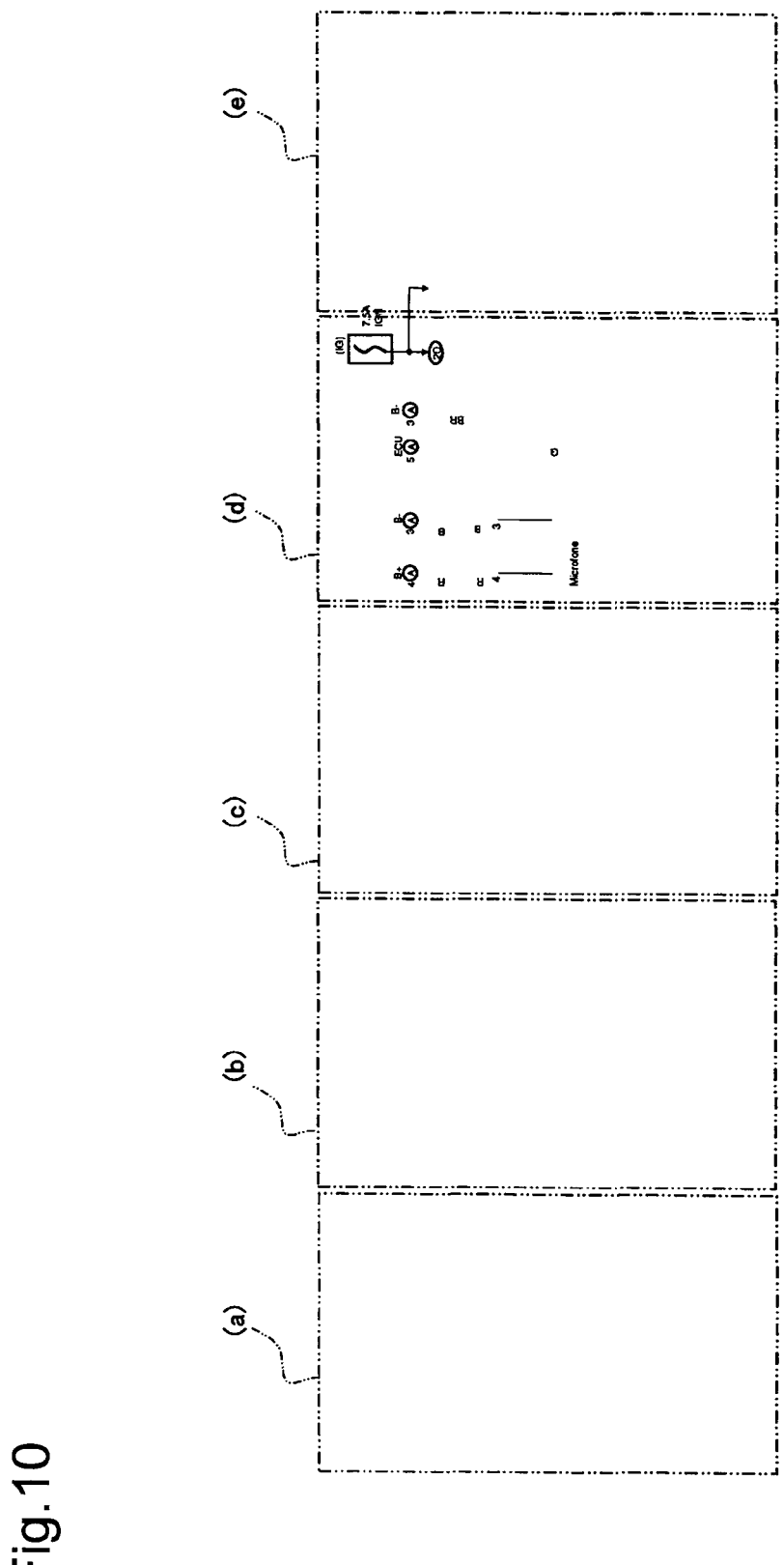
FIG. 10 is an explanatory view showing an aspect that circuit elements of a divisional area (d) in the device system circuit diagram of FIG. 5 are drawn based on circuit-element-drawing divisional circuit diagram data (d)
Figure 11:
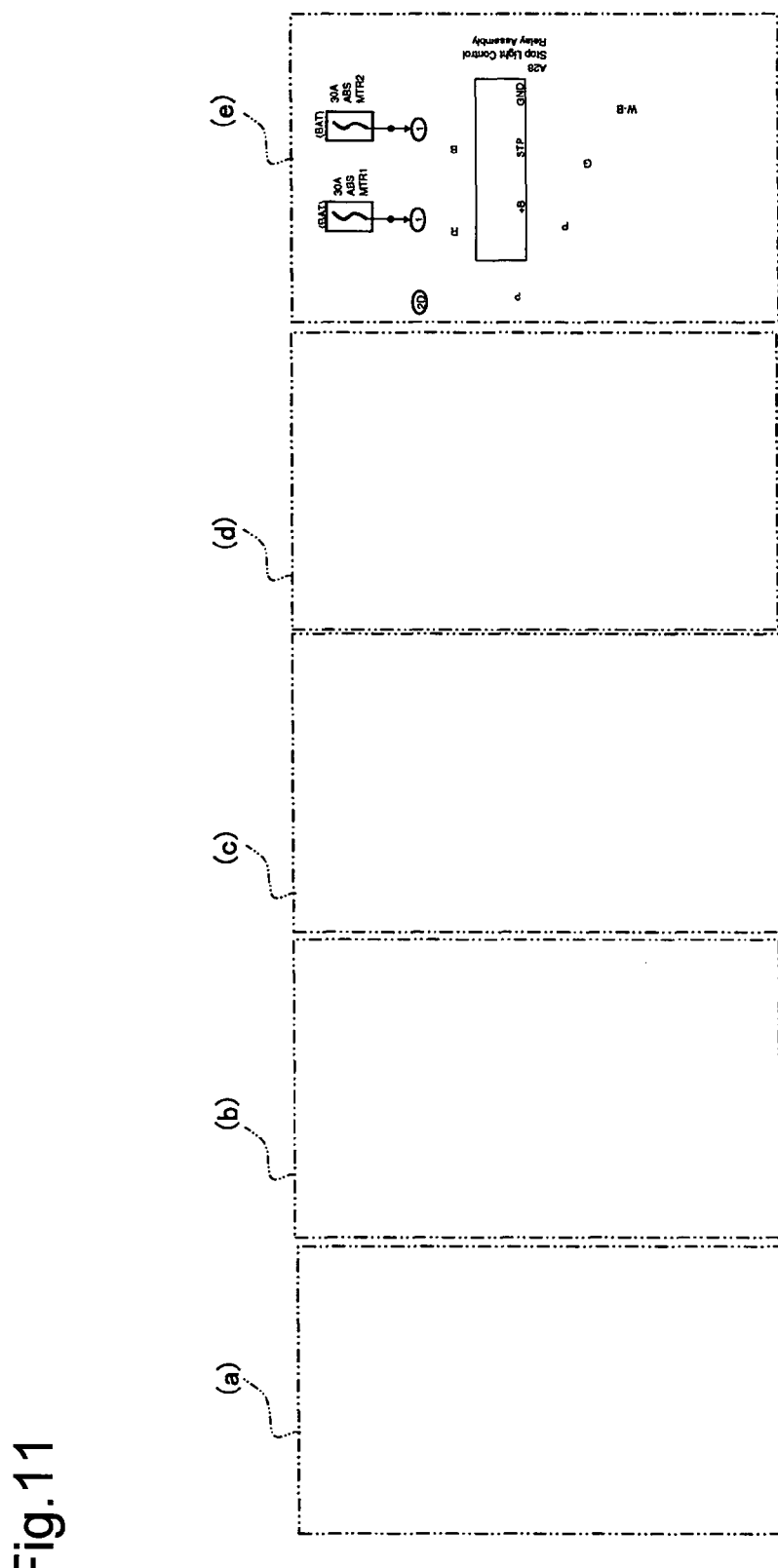
FIG. 11 is an explanatory view showing an aspect that circuit elements of a divisional area (e) in the device system circuit diagram of FIG. 5 are drawn based on circuit-element-drawing divisional circuit diagram data (e)

FIG. 7 is an explanatory view showing an aspect that circuit elements of the divisional area (a) in the device system circuit diagram of FIG. 5 are drawn based on circuit-element-drawing divisional circuit diagram data (a). FIG. 8 is an explanatory view showing an aspect that circuit elements of the divisional area (b) in the device system circuit diagram of FIG. 5 are drawn based on circuit-element-drawing divisional circuit diagram data (b). FIG. 9 is an explanatory view showing an aspect that circuit elements of the divisional area (c) in the device system circuit diagram of FIG. 5 are drawn based on circuit-element-drawing divisional circuit diagram data (c). FIG. 10 is an explanatory view showing an aspect that circuit elements of the divisional area (d) in the device system circuit diagram of FIG. 5 are drawn based on circuit-element-drawing divisional circuit diagram data (d). FIG. 11 is an explanatory view showing an aspect that circuit elements of the divisional area (e) in the device system circuit diagram of FIG. 5 are drawn based on circuit-element-drawing divisional circuit diagram data (e). Which divisional area text description based on part text information Pid, text description based on connection text information Lid, and text description based on terminal text information Cid belong to is determined based on xy-coordinates at left upper corner portion of the text description area. Therefore, as shown in FIGS. 7 and 9, the text description based on the part text information Pid reaches the neighboring divisional area. Also, as shown in FIG. 7, it is prepared that for some of the electrical component parts PSd, image data for drawing rectangular shapes representing those parts can be included. Further, as shown in FIGS. 8 and 9, part text information Pid showing internal wirings and functions of the electrical component parts PSd are also included in the circuit-element-drawing divisional circuit diagram data (a)-(n).

As described with reference to FIGS. 5 to 11, the server 30 stores therein, for example, drawing data for displaying an image of the device system circuit diagram shown in FIG. 5 as circuit diagram drawing data including part placement drawing data for displaying an image of a part placement diagram in which the electrical component parts PSd on a basis of an electrical component unit constituting the device system of FIG. 5 are arranged, as well as the remaining drawing data associated with drawing positions of the electrical component parts PSd. Then, the server 30 stores therein the remaining drawing data other than the electrical component parts PSd, as drawing data including connection drawing data for displaying an image in which connection diagrams LSd for making connections of electrical component parts PSd by reflecting actual connections among electrical component units are superimposed on a part placement diagram, connection information drawing data for displaying an image in which connection text information Lid representing connection information on connections in the connection diagrams LSd and terminal text information Cid representing connecting terminals of the connections are superimposed on the part placement diagram, and electrical-component information drawing data for displaying an image of electrical component-unit information on an electrical component unit corresponding to the electrical component parts PSd in the form that the part text information Pid is superimposed on the part placement diagram.

The link data of FIG. 4 constituting the circuit diagram drawing data in combination with the above-described part-connection-drawing overall circuit diagram data and the circuit-element-drawing divisional circuit diagram data (a)-(n) are data for prescribing relationships between drawing based on connection-drawing overall circuit diagram data and drawing based on the circuit-element-drawing divisional circuit diagram data (a)-(n), which determines a number of units of the circuit-element-drawing divisional circuit diagram data in which the circuit diagram drawing data are divided, superimposed writing start coordinates of an image based on individual circuit-element-drawing divisional circuit diagram data, and the like. FIG. 12 is an explanatory view schematically showing contents of link data on the device system circuit diagram shown in FIG. 5. In addition, the superimposed-write start coordinates shown in FIG. 12 may be either coordinates as an image of one group of a plurality of circuit elements included in the individual circuit-element-drawing divisional circuit diagram data (a)-(n) or coordinates on the basis of a plurality of circuit element.

Figure 13:
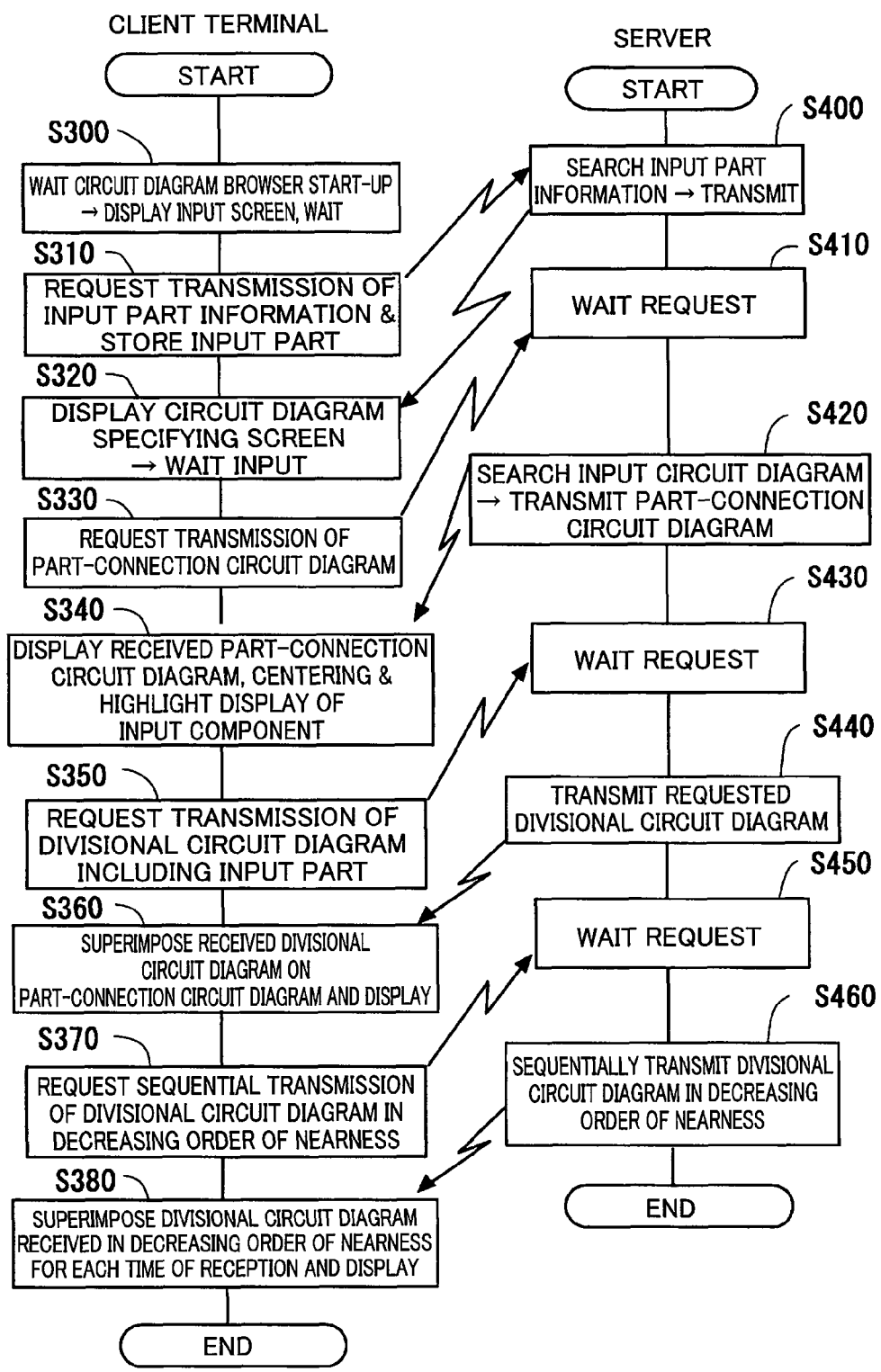
FIG. 13 is a flowchart showing circuit diagram supplying process to be executed by the circuit diagram supplying apparatus 10 as a client terminal.

Next, processing of the circuit diagram supplying apparatus 10 for fulfillment of circuit diagram supply to users will be described in association with the server 30. FIG. 13 is a flowchart showing circuit diagram supplying process to be executed by the circuit diagram supplying apparatus 10 as a client terminal.

Figure 14:
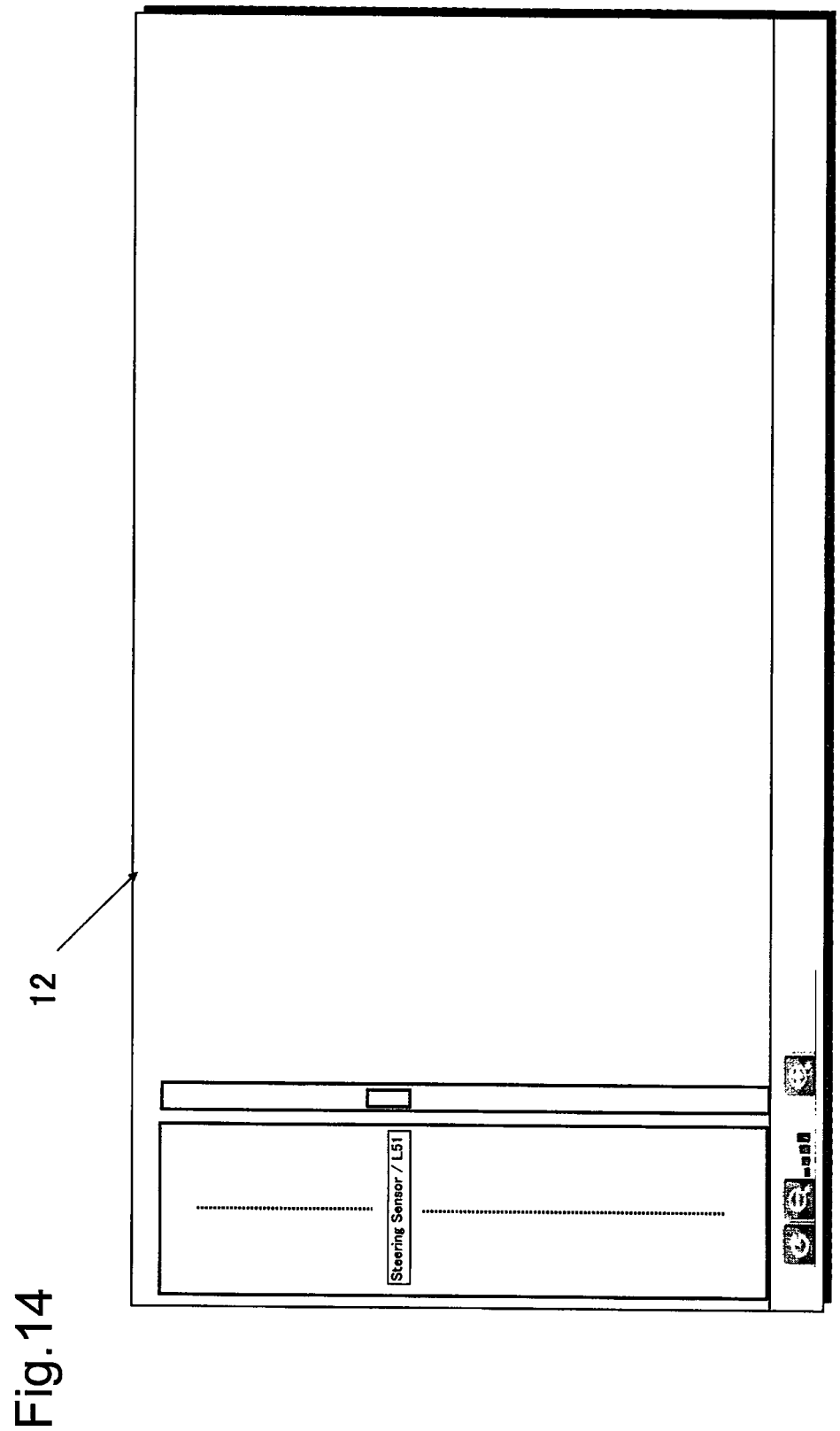
FIG. 14 is an explanatory view schematically showing an aspect of an initial input screen display followed by browser start-up by a user.

As shown in the figure, the circuit diagram supplying apparatus 10 being a client terminal first stands by for a circuit-diagram browser start-up request (input) by a user. In event of a browser start-up request, a Web browser 11a (see FIG. 3) is started up, presenting an initial input screen on the display 12 and waiting a part specification by the user (step S300). FIG. 14 is an explanatory view schematically showing an aspect of an initial input screen display to be displayed on the display 12 at a start-up of the browser. In this initial input screen, a part list of connectors or the like is displayed in list form in a left display area of the screen, where the user selects, from this list, parts to be included in a circuit diagram that is desired to be supplied. The circuit diagram supplying apparatus 10 waits input of part selection (specification) by the user. Since the circuit diagram supplying apparatus 10 has stored selectable part name in the ROM 28 or HDD 18 shown in FIG. 2, the circuit diagram supplying apparatus 10 displays stored part names in a list form on the initial input screen at the time of start-up of the Web browser 11a.

When part selection by the user is done on the initial input screen of FIG. 14, the circuit diagram supplying apparatus 10 requests the server 30 to transmit input-part information, which is selection-inputted part information (hereinafter, referred to as input part) and stores the input part (step S310). The input part stored in this way is used as a search key to display of later-described part placement diagrams.

The server 30 stands by for a transmission request of input-part information from the circuit diagram supplying apparatus 10. When a transmission request of an input part is received from the circuit diagram supplying apparatus 10 at step S310, the server 30 executes the processes shown in FIG. 13. The server 30, upon receiving a transmission request of input-part information from the circuit diagram supplying apparatus 10, searches the parts and connectors or the system circuit diagrams of FIG. 4 for information concerning the input part, and transmits, to the circuit diagram supplying apparatus 10, system circuit information representing, with use of abbreviations, a list of device system circuit diagram names into which an input part is incorporated, for example, a list of system names such as ABS system circuit, engine control system circuit and the like (step S400). Thereafter, the server 30 waits a new request from the circuit diagram supplying apparatus 10 (step S410). System circuit information transmitted from the server 30 to the circuit diagram supplying apparatus 10 include part shape data for displaying an image of a profile of an input part in addition to a system name.

Figure 15:
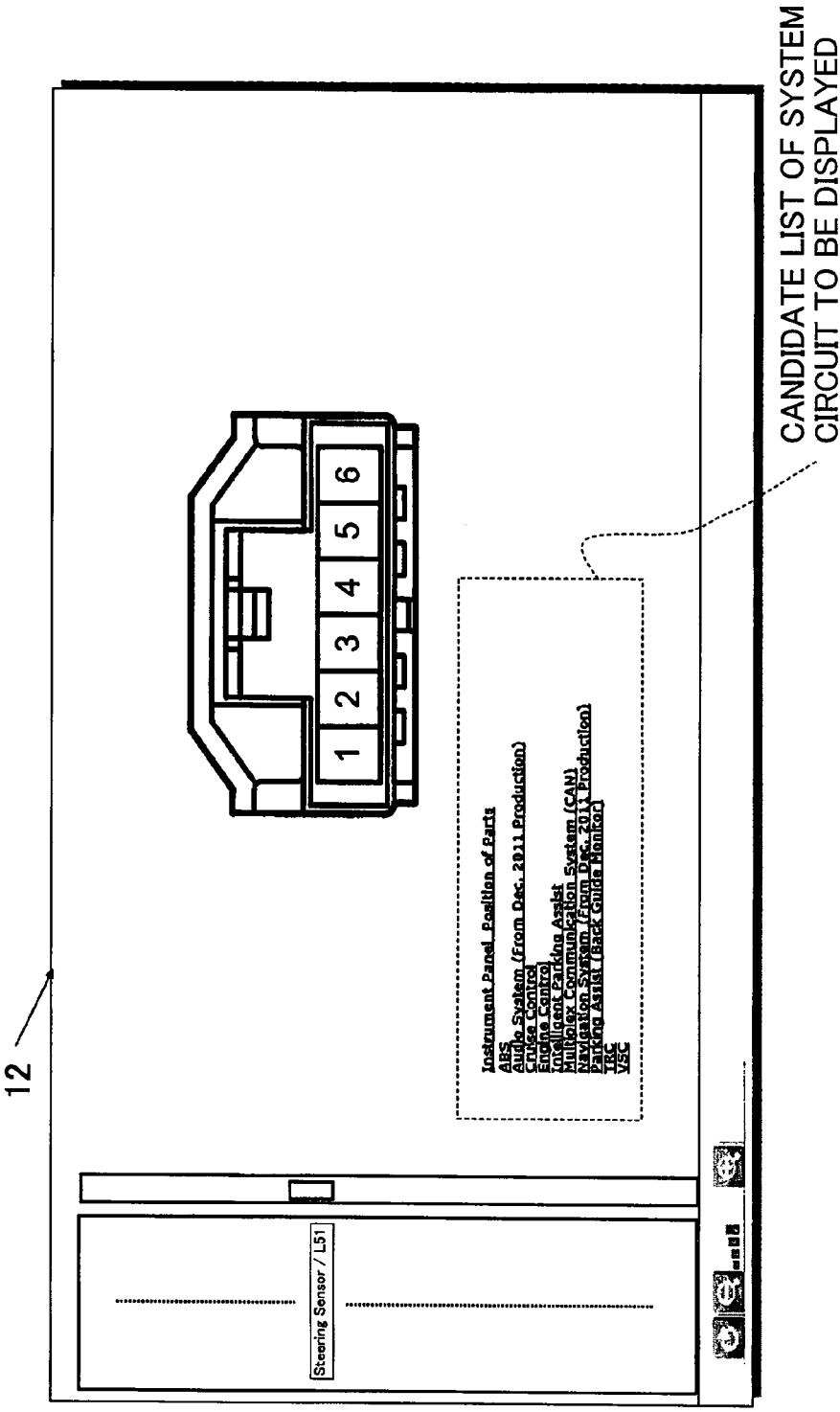
FIG. 15 is an explanatory view schematically showing an aspect of display of a circuit diagram specifying screen involved upon reception of system circuit information transmitted from the server 30.

The circuit diagram supplying apparatus 10, upon receiving transmission of system circuit information from server 30, displays on the display 12 a circuit diagram specifying screen in which system names and part profiles contained in the transmitted system circuit information are incorporated in the initial input screen shown in FIG. 14, waiting specification of a circuit diagram by the user (step S320). FIG. 15 is an explanatory view schematically showing an aspect of display of a circuit diagram specifying screen involved in reception of system circuit information transmitted from the server 30. In this circuit diagram specifying screen, a profile of an input part that has been specified by the user as well as a name list (candidate list of system circuit to be displayed) of device system circuits in which the input part is incorporated are displayed. Therefore, the user is allowed to recognize from part appearance whether an input part should be specified or not. Moreover, the user is allowed to select a circuit diagram to be supplied from among the candidate list of system circuit to be displayed, so that the circuit diagram supplying apparatus 10 waits specification of a circuit diagram by the user. The circuit diagram specifying screen shown in FIG. 15 can be stored in the form of history on the circuit diagram supplying apparatus 10 side. Therefore, in circuit diagram supply at the next time and following, the following processes may also be started from display of the circuit diagram specifying screen shown in FIG. 15.

Figure 16:
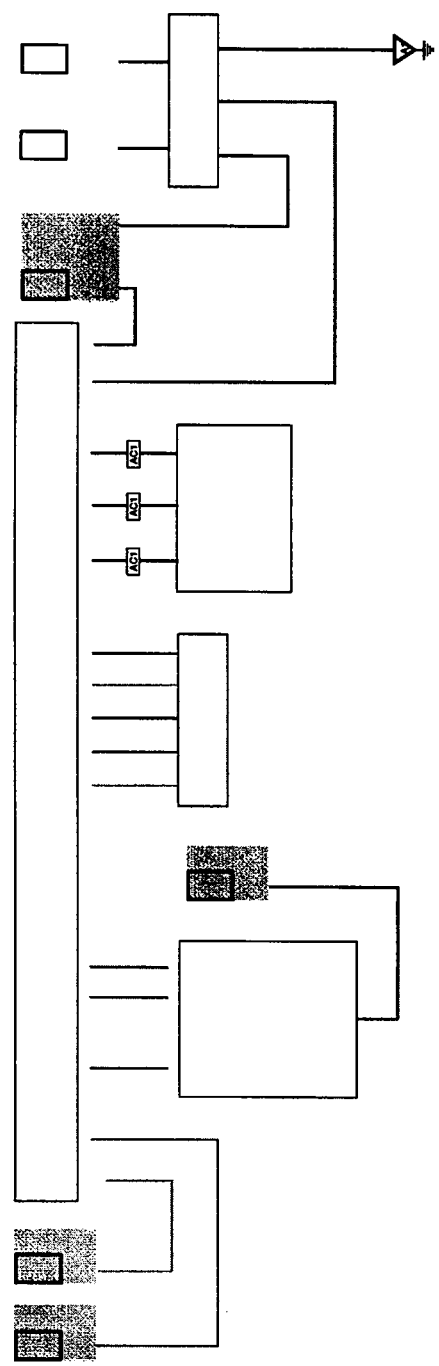
FIG. 16 is an explanatory view showing an image displayed by part-connection-drawing overall circuit diagram data transmitted from the server 30.

The circuit diagram supplying apparatus 10, upon receiving specification of a circuit diagram by the user in the circuit diagram specifying screen shown in FIG. 15, requests the server 30 to transmit drawing data of the part-wiring circuit diagram as to the specified system circuit diagram (step S330). Hereinafter, the following description will be based on the assumption that the user, desiring supply of the device system circuit diagram shown in FIG. 5, has specified the circuit diagram. The circuit diagram supplying apparatus 10 requests the server 30 to transmit drawing data of the part-wiring circuit diagram on the device system circuit diagram shown in FIG. 5. The server 30, upon receiving this request, searches the system circuit data of FIG. 4, more specifically, the system list data to extract part-connection-drawing overall circuit diagram data (see FIG. 4) for drawing of the part-connection-drawing overall circuit diagram data of FIG. 6 for the device system of FIG. 5. Then, the server 30 transmits the extracted part-connection-drawing overall circuit diagram data along with the link data (see FIG. 12) (step S420). FIG. 16 is an explanatory view showing an image displayed by part-connection-drawing overall circuit diagram data transmitted from the server 30.

Figure 17:
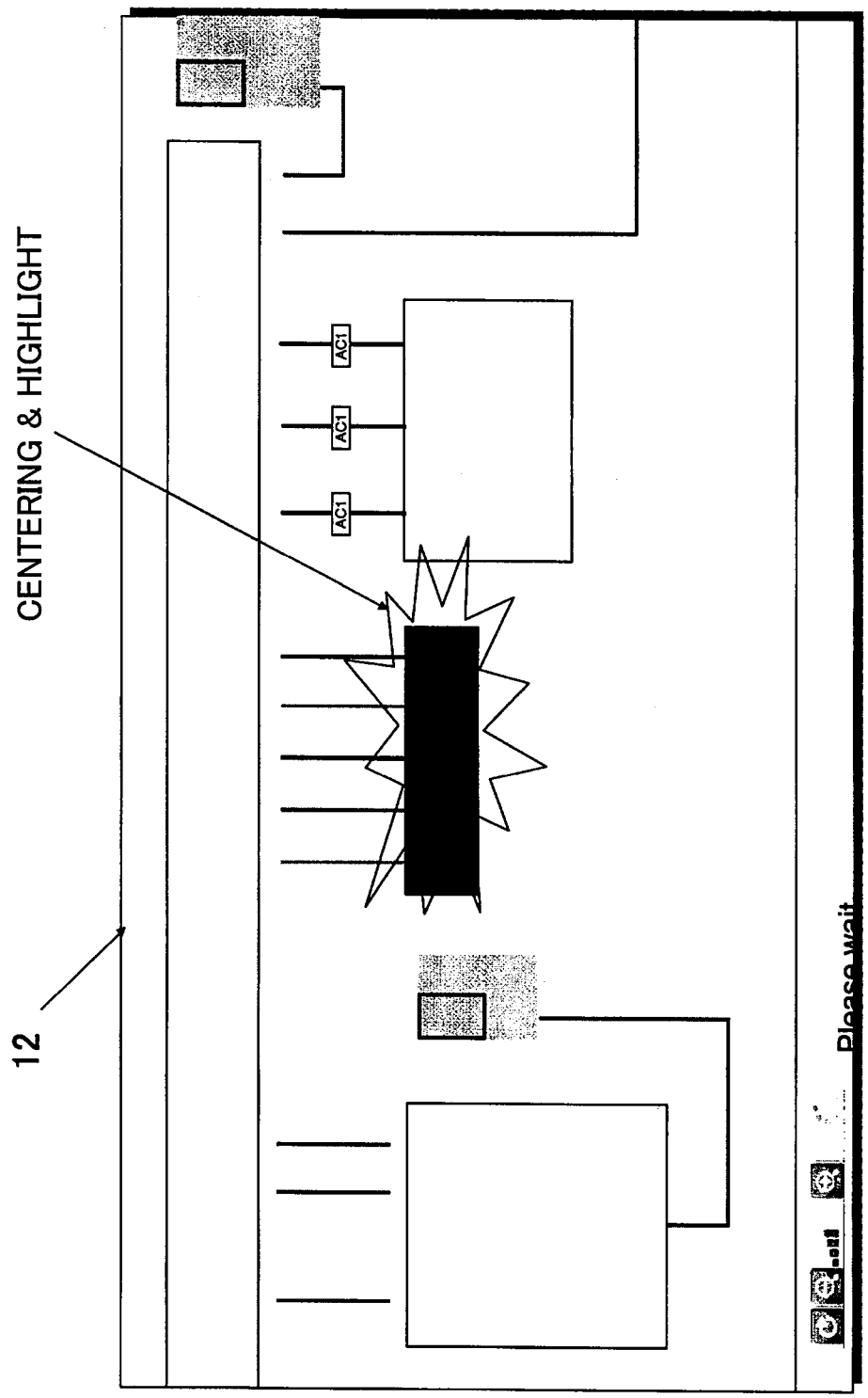
FIG. 17 is an explanatory view showing an aspect of image display of a part-connection-drawing overall circuit diagram based on part-connection-drawing overall circuit diagram data with centering and highlight display of an input part.

The circuit diagram supplying apparatus 10, having received the transmitted part-connection-drawing overall circuit diagram data, performs centering and highlight display of an input part inputted at step S300 in order to display, on the display 12, the part-connection-drawing overall circuit diagram of FIG. 16 based on the part-connection-drawing overall circuit diagram data (step S340). That is, the circuit diagram supplying apparatus 10 searches the part-connection-drawing overall circuit diagram data by taking as a search key the input part inputted and stored at step S300, and performs image display of the part-connection-drawing overall circuit diagram based on the part-connection-drawing overall circuit diagram so that while an electrical component part PSd corresponding to the input part is positioned at the center of the display 12, the electrical component part PSd is displayed in flash display in which the electrical component part PSd is displayed in a color other than those of others. FIG. 17 is an explanatory view showing an aspect of image display of the part-connection-drawing overall circuit diagram based on the part-connection-drawing overall circuit diagram data after the centering and highlight display of an input part is performed.

Figure 18:
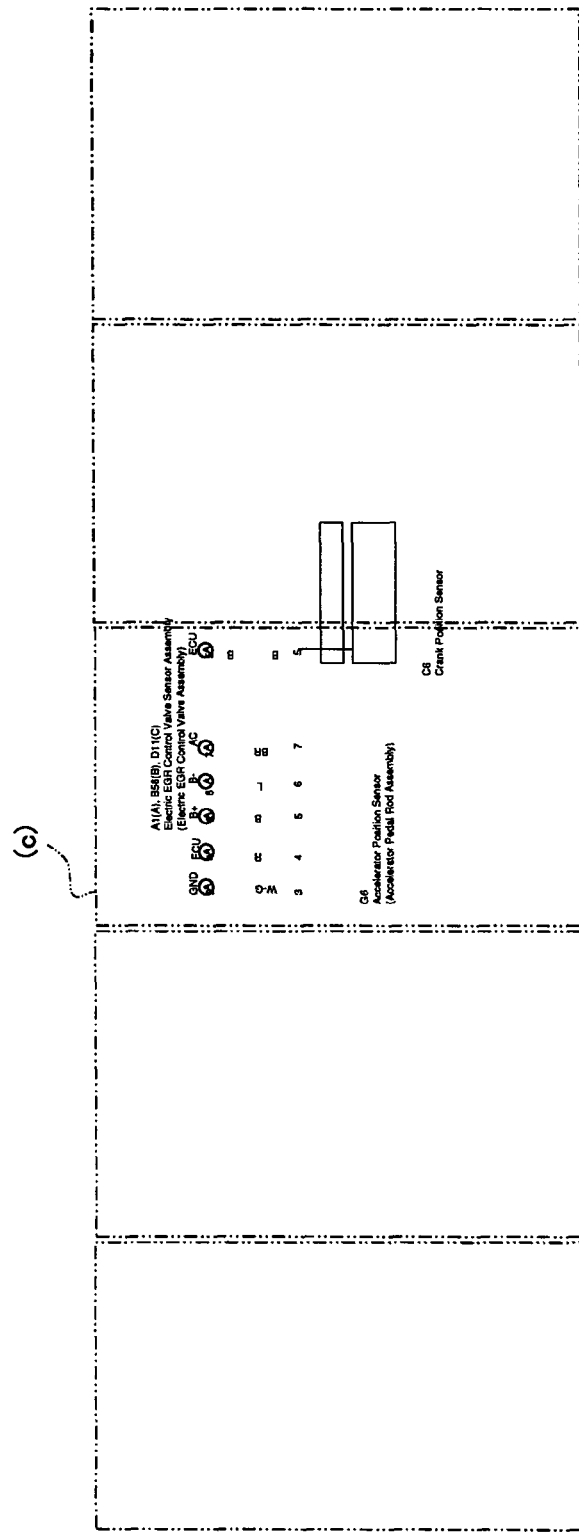
FIG. 18 is an explanatory view showing an image displayed by circuit-element-drawing divisional circuit diagram data (c) transmitted from the server 30.

In succession to the above-described centering and highlight display, the circuit diagram supplying apparatus 10 requests the server 30 to transmit circuit-element-drawing divisional circuit diagram data including an electrical component part PSd corresponding to the input part (step S350). The server 30, upon receiving this request, transmits to the circuit diagram supplying apparatus 10 the circuit-element-drawing divisional circuit diagram data (c) including the electrical component part PSd corresponding to the input part from among the circuit-element-drawing divisional circuit diagram data (a)-(e) of FIG. 5 (step S440), standing by for a following data transmission request (step S450). FIG. 18 is an explanatory view showing an image displayed by circuit-element-drawing divisional circuit diagram data (c) transmitted from the server 30.

Figure 19:
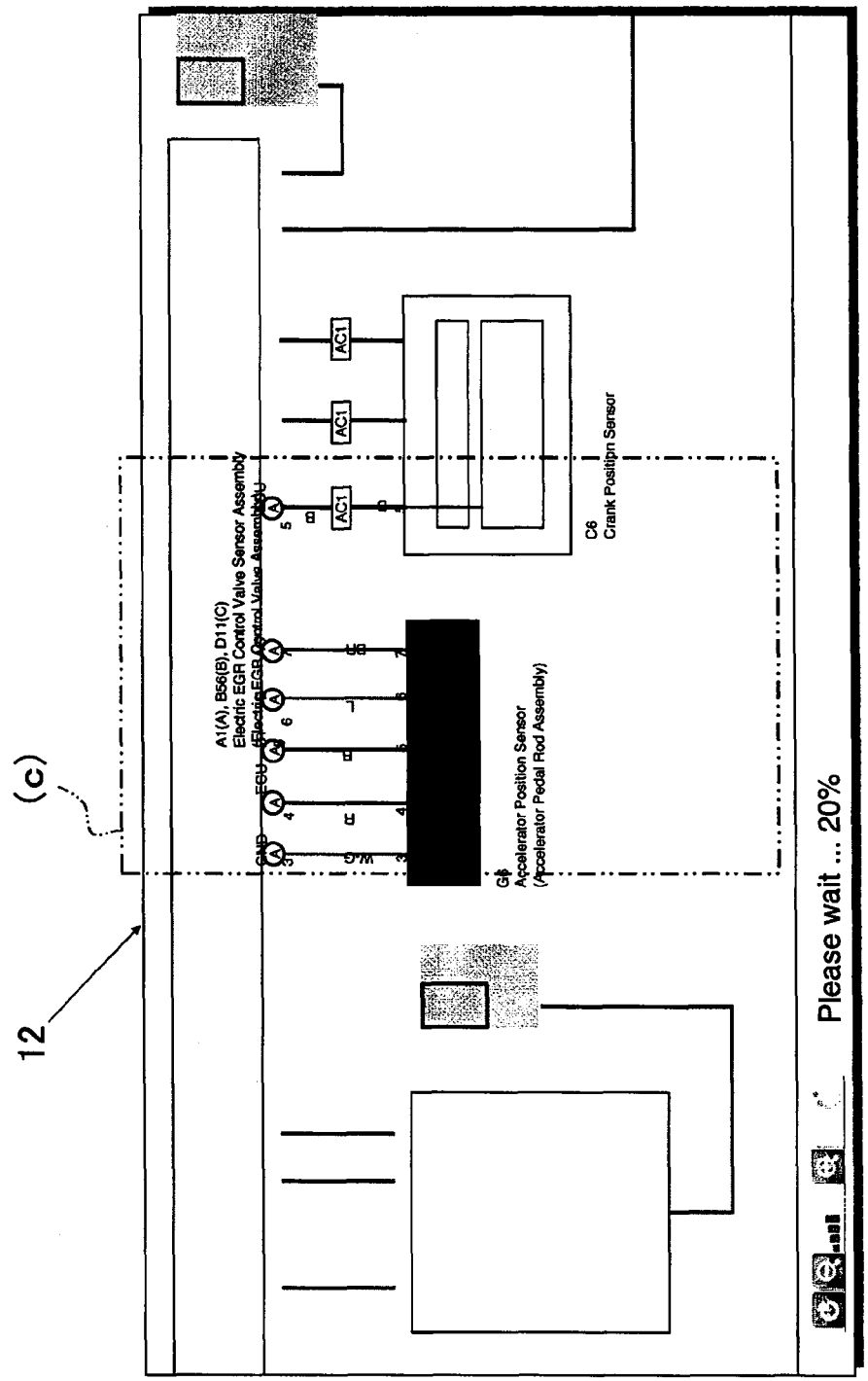
FIG. 19 is an explanatory view showing an aspect that an image based on the circuit-element-drawing divisional circuit diagram data (c) is superimposed on the already-displayed part-connection-drawing overall circuit diagram.

The circuit diagram supplying apparatus 10, having received the transmitted circuit-element-drawing divisional circuit diagram data (c), displays an image in which images based on the circuit-element-drawing divisional circuit diagram data (c), more specifically, the part text information Pid, the connection text information Lid and the terminal text information Cid other than the electrical component parts PSd and the connection diagrams LSd are superimposed on the part-connection-drawing overall circuit diagram, which has already been displayed on the display 12 (step S360). FIG. 19 is an explanatory view showing an aspect that an image based on circuit-element-drawing divisional circuit diagram data (c) is superimposed on the already-displayed part-connection-drawing overall circuit diagram. The circuit diagram supplying apparatus 10 receives transmission of the link data shown in FIG. 12 from the server 30 for fulfillment of centering display of an input part in above-described step S340. Therefore, the circuit diagram supplying apparatus 10 calculates a ratio occupied by the already-transmitted circuit-element-drawing divisional circuit diagram data (c) relative to the circuit-element-drawing divisional circuit diagram data (a)-(e) of FIG. 5 that are transmitted from the server 30 (i.e., transmitted data rate) based on the number of divided circuit diagram units of the link data and the units of already transmitted divisional circuit diagram data, and displays the calculated ratio in percentage at a lower stage of the display 12 as a progress status of the circuit diagram supply. In addition, this transmitted data rate of link data may also be calculated based on the number of divisional circuit diagram units of link data and the units of untransmitted divisional circuit diagram data.

In succession to superimposed image display based on the circuit-element-drawing divisional circuit diagram data (c), the circuit diagram supplying apparatus 10 requests the server 30 to transmit circuit-element-drawing divisional circuit diagram data other than the circuit-element-drawing divisional circuit diagram data (c) sequentially in decreasing order of nearness to the divisional circuit diagram containing the input part (step S370). In this embodiment, it is requested, with respect to the device system circuit diagram shown in FIG. 5, that the server 30 transmits the circuitelement-drawing divisional circuit diagram data sequentially in an order of the circuit-element-drawing divisional circuit diagram data (d) placed rightward next to a divisional circuit diagram corresponding to the circuit-element-drawing divisional circuit diagram data (c), to the circuit-element-drawing divisional circuit diagram data (b) placed leftward next to a divisional circuit diagram corresponding to the circuit-element-drawing divisional circuit diagram data (c), to the circuit-element-drawing divisional circuit diagram data (e) outside these data, and to the circuit-element-drawing divisional circuit diagram data (a).

Figure 20:
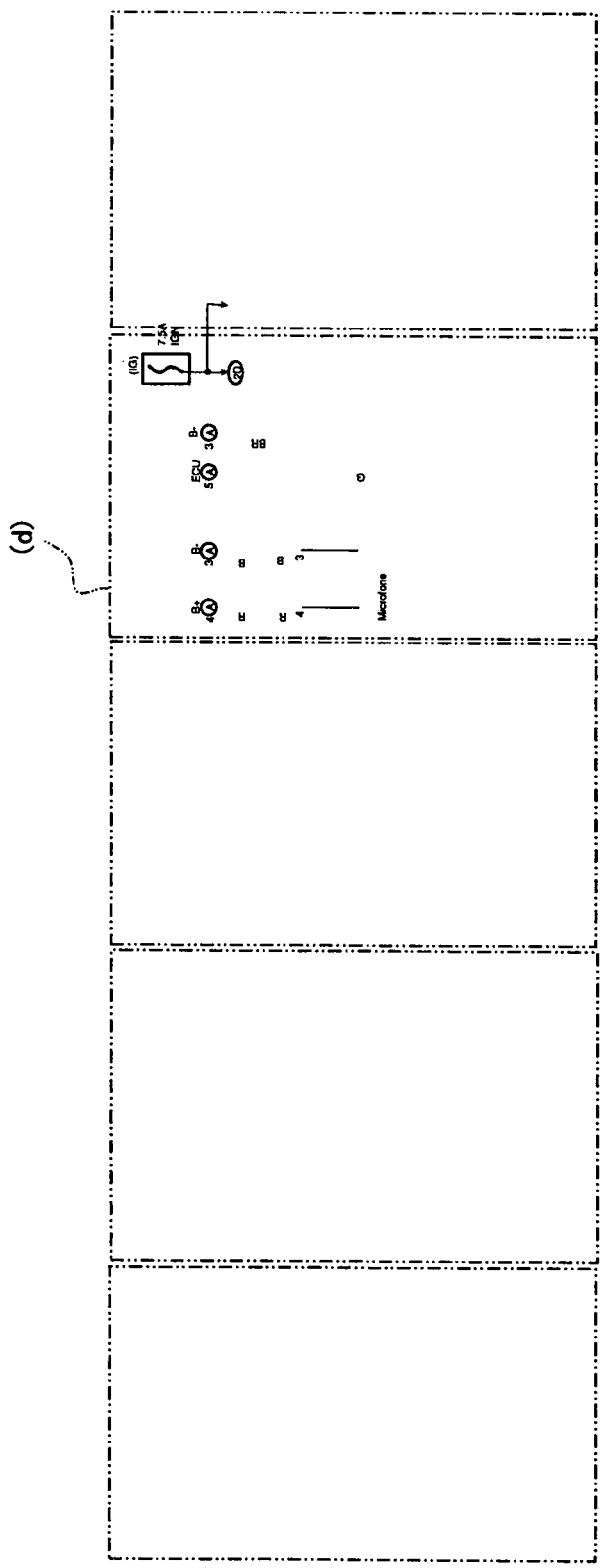
FIG. 20 is an explanatory view showing an image displayed by the circuit-element-drawing divisional circuit diagram data (d) transmitted from the server 30 in succession to the circuit-element-drawing divisional circuit diagram data (c)
Figure 21:
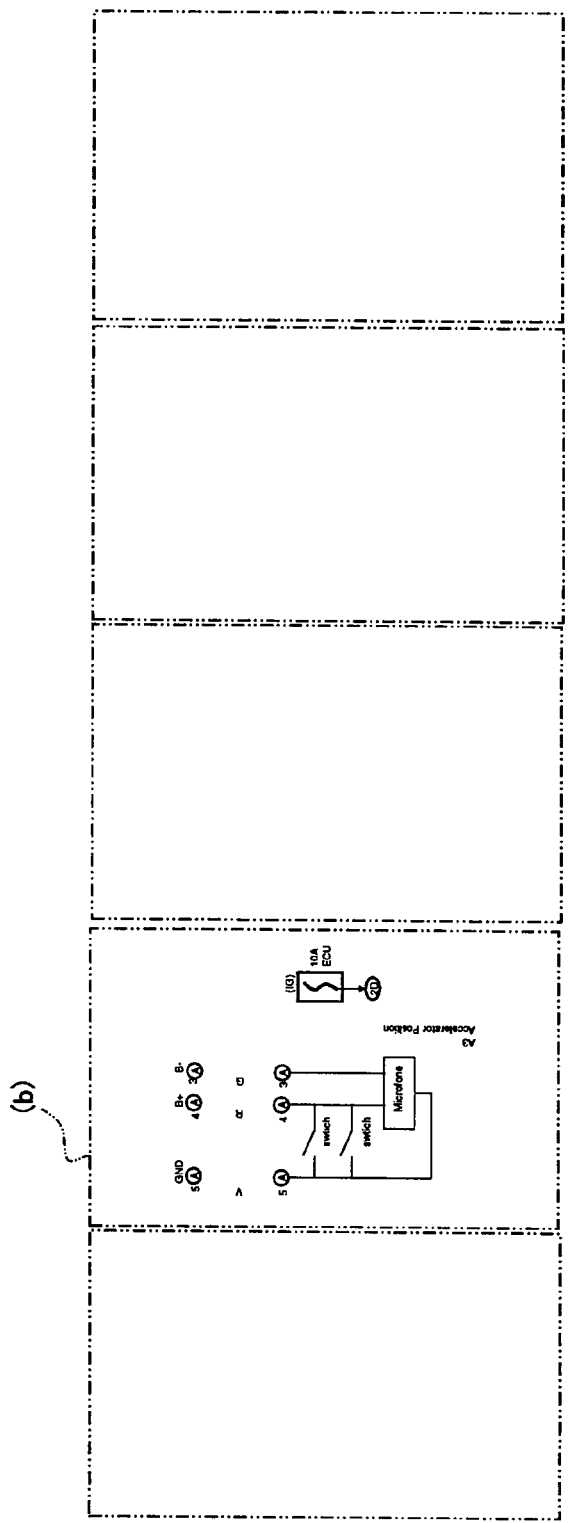
FIG. 21 is an explanatory view showing an image displayed by the circuit-element-drawing divisional circuit diagram data (b) transmitted from the server 30 in succession to the circuit-element-drawing divisional circuit diagram data (d)
Figure 22:
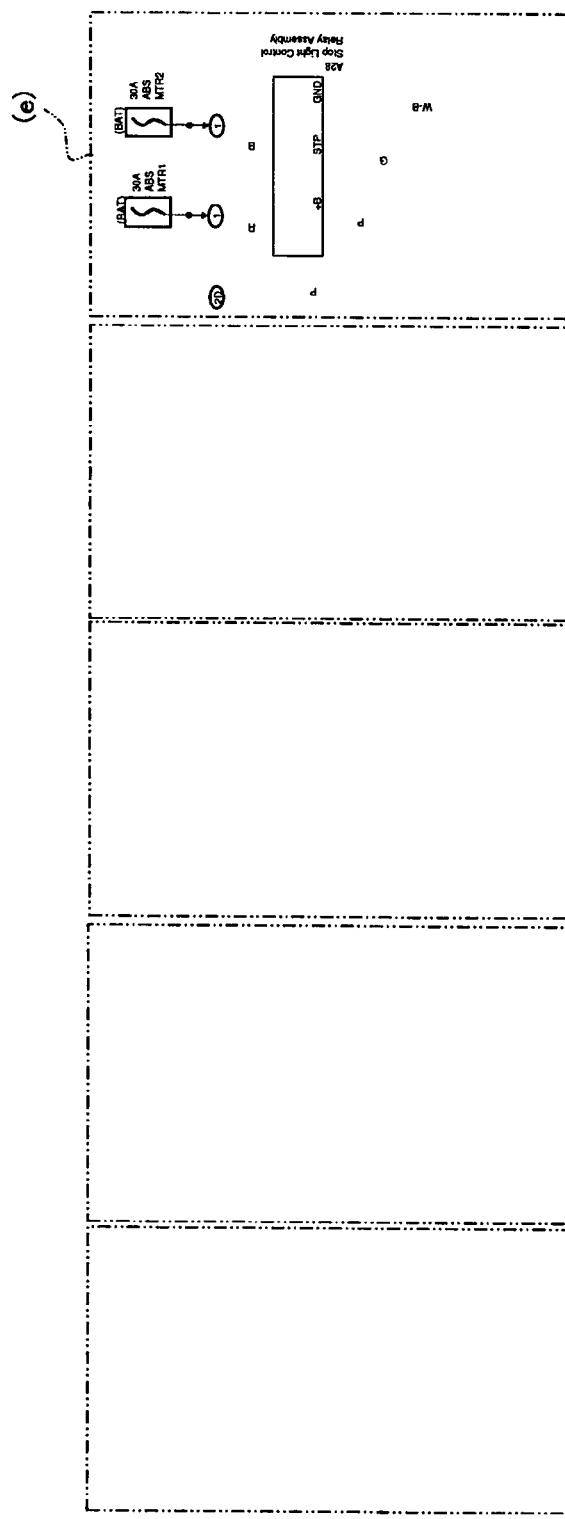
FIG. 22 is an explanatory view showing an image displayed by the circuit-element-drawing divisional circuit diagram data (e) transmitted from the server 30 in succession to the circuit-element-drawing divisional circuit diagram data (b)
Figure 23:
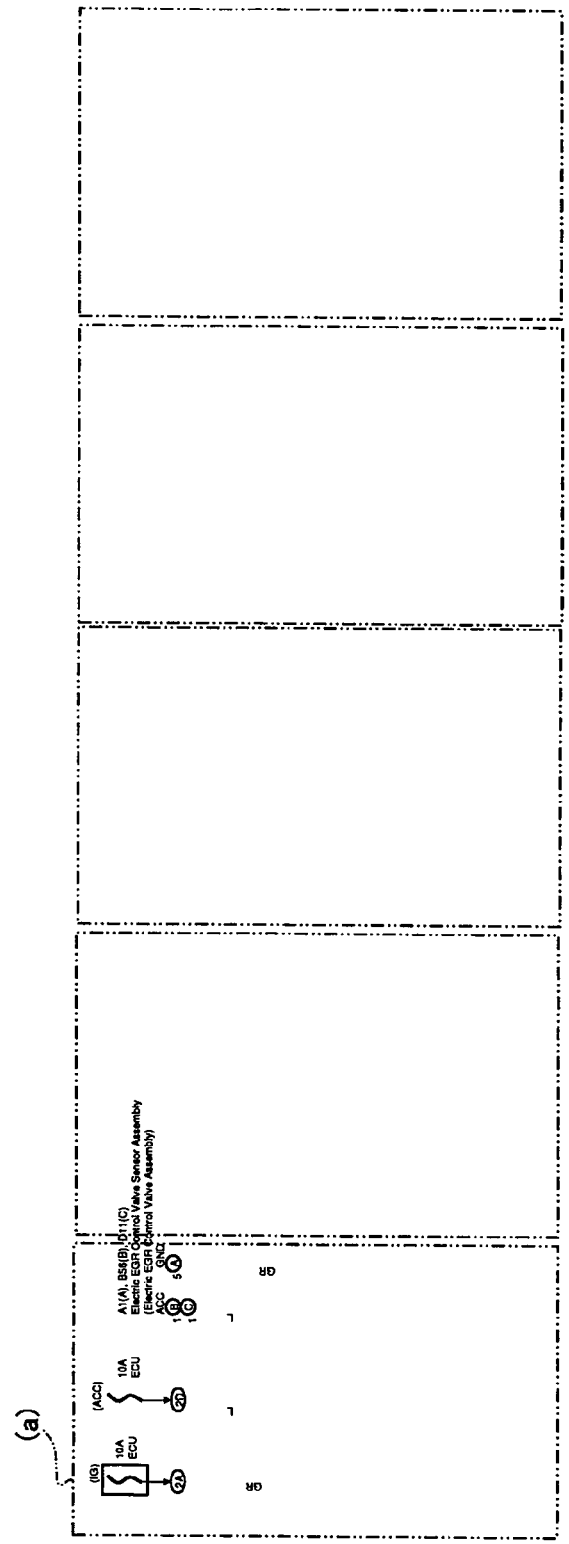
FIG. 23 is an explanatory view showing an image displayed by the circuit-element-drawing divisional circuit diagram data (a) transmitted from the server 30 in succession to the circuit-element-drawing divisional circuit diagram data (e)

The server 30, having received this request, transmits the circuit-element-drawing divisional circuit diagram data other than the circuit-element-drawing divisional circuit diagram data (c), sequentially in an order of the circuit-element-drawing divisional circuit diagram data (d), the circuit-element-drawing divisional circuit diagram data (b), the circuit-element-drawing divisional circuit diagram data (e) and the circuit-element-drawing divisional circuit diagram data (a) (step S460), ending the process. In this case, the circuit diagram supplying apparatus 10, each time having received circuit-element-drawing divisional circuit diagram data, may request the server 30 to transmit the next circuit-element-drawing divisional circuit diagram data. FIG. 20 is an explanatory view showing an image displayed by the circuit-element-drawing divisional circuit diagram data (d) transmitted from the server 30 in succession to the circuit-element-drawing divisional circuit diagram data (c). FIG. 21 is an explanatory view showing an image displayed by the circuit-element-drawing divisional circuit diagram data (b) transmitted from the server 30 in succession to the circuit-element-drawing divisional circuit diagram data (d). FIG. 22 is an explanatory view showing an image displayed by the circuit-element-drawing divisional circuit diagram data (e) transmitted from the server 30 in succession to the circuit-element-drawing divisional circuit diagram data (b). FIG. 23 is an explanatory view showing an image displayed by the circuit-element-drawing divisional circuit diagram data (a) transmitted from the server 30 in succession to the circuit-element-drawing divisional circuit diagram data (e).

Figure 24:
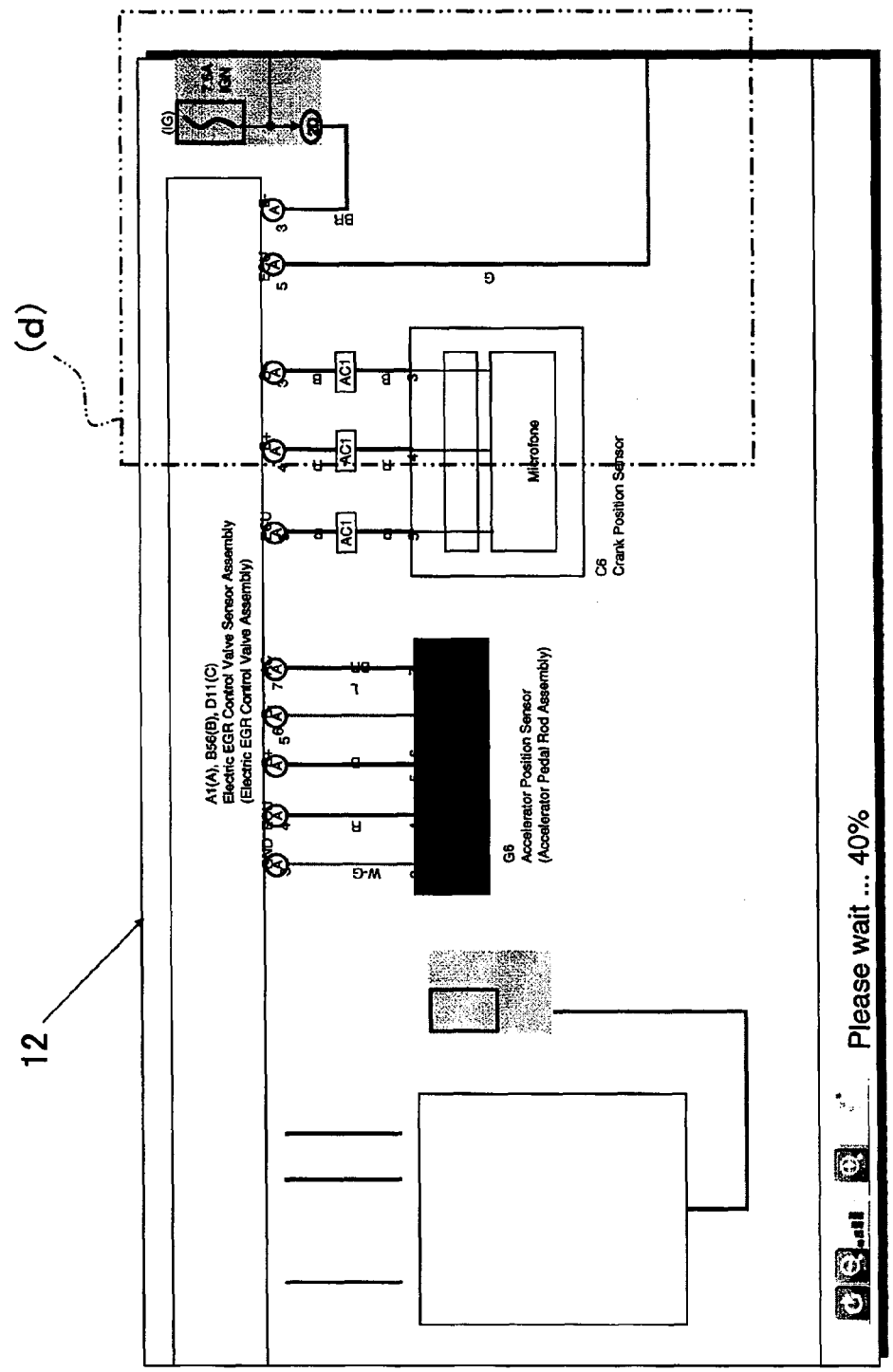
FIG. 24 is an explanatory view showing an aspect that an image based on the circuit-element-drawing divisional circuit diagram data (d) is superimposed on the already-displayed part-connection-drawing overall circuit diagram.
Figure 25:
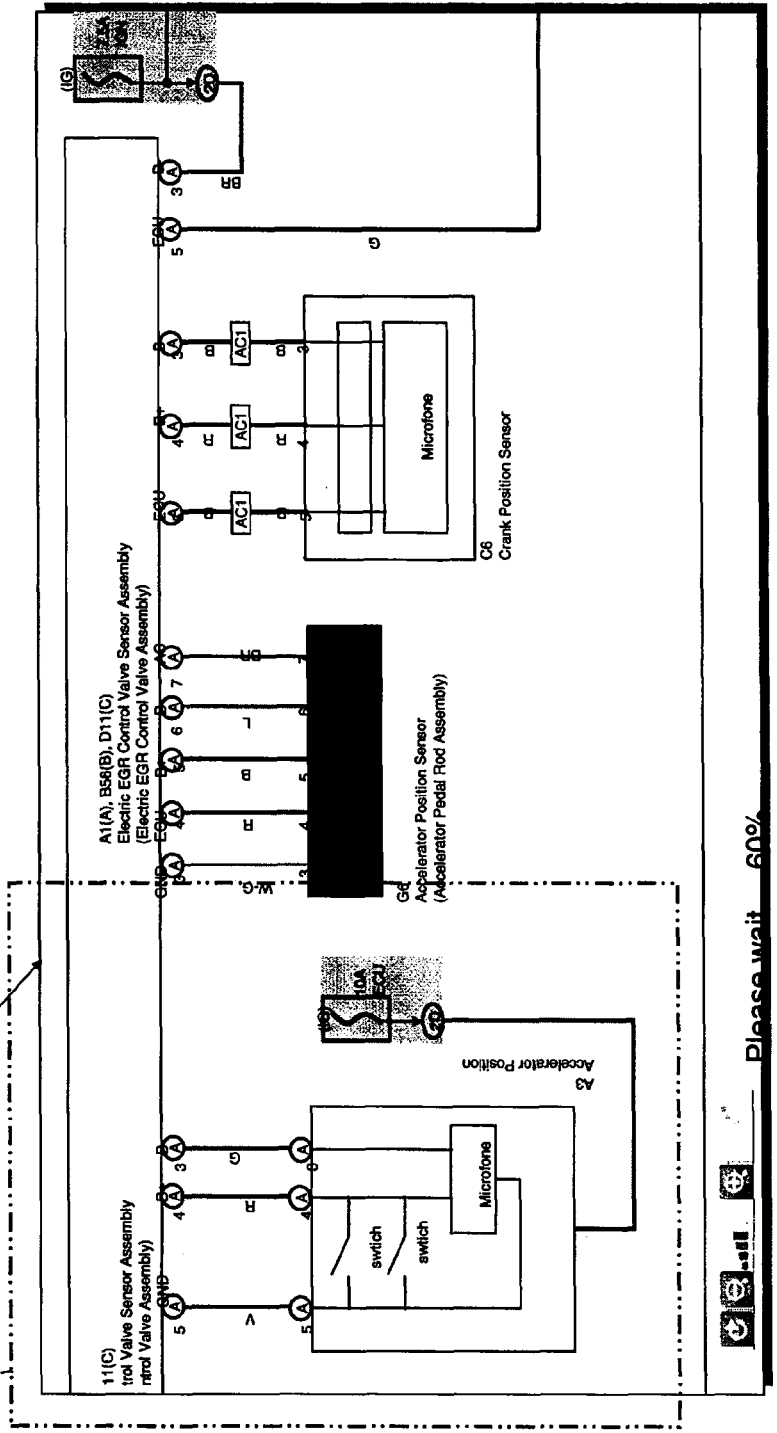
FIG. 25 is an explanatory view showing an aspect that an image based on the circuit-element-drawing divisional circuit diagram data (b) is superimposed on the already-displayed part-connection-drawing overall circuit diagram.
Figure 26:
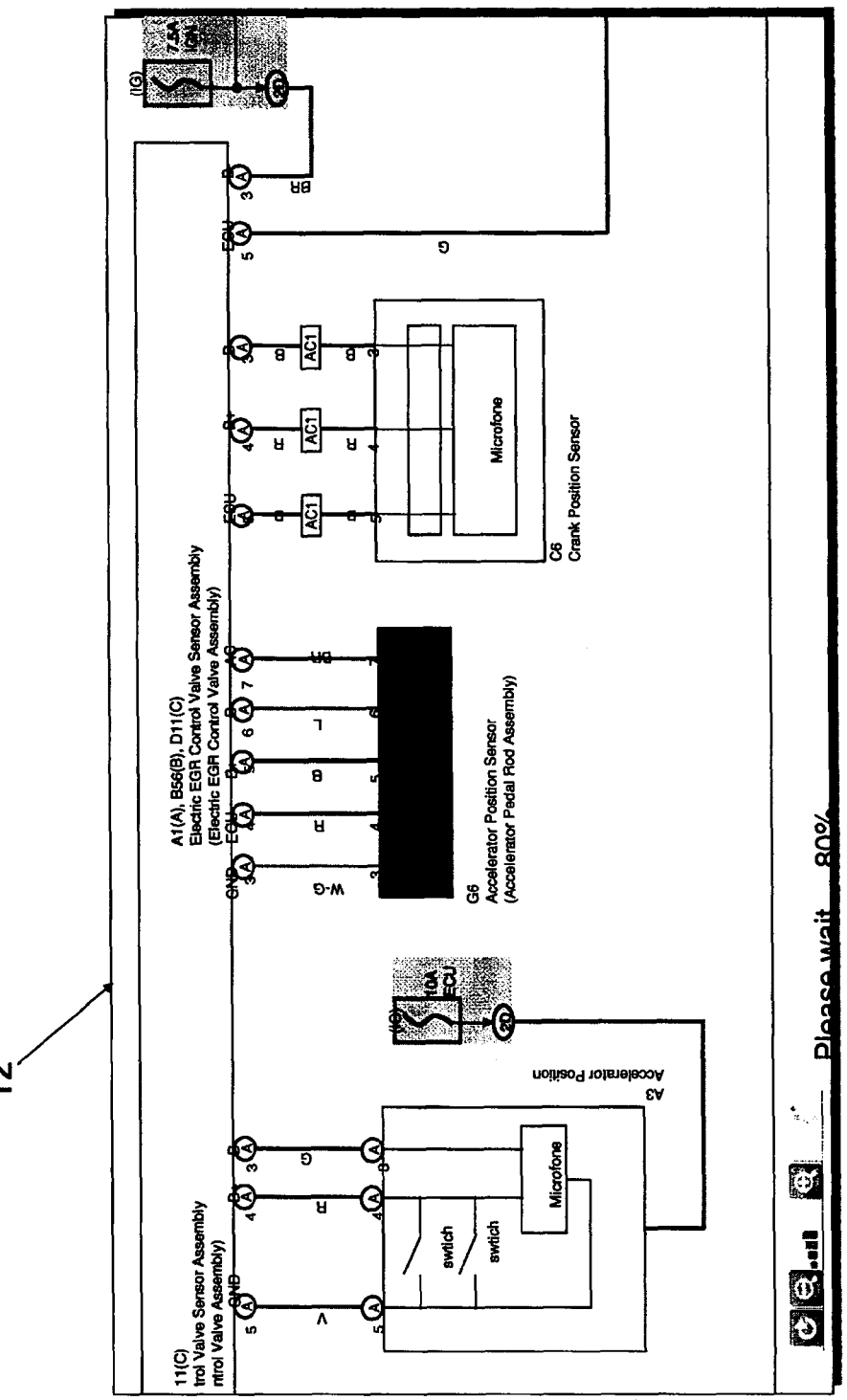
FIG. 26 is an explanatory view showing an aspect that an image based on the circuit-element-drawing divisional circuit diagram data (e) is superimposed on the already-displayed part-connection-drawing overall circuit diagram.
Figure 27:
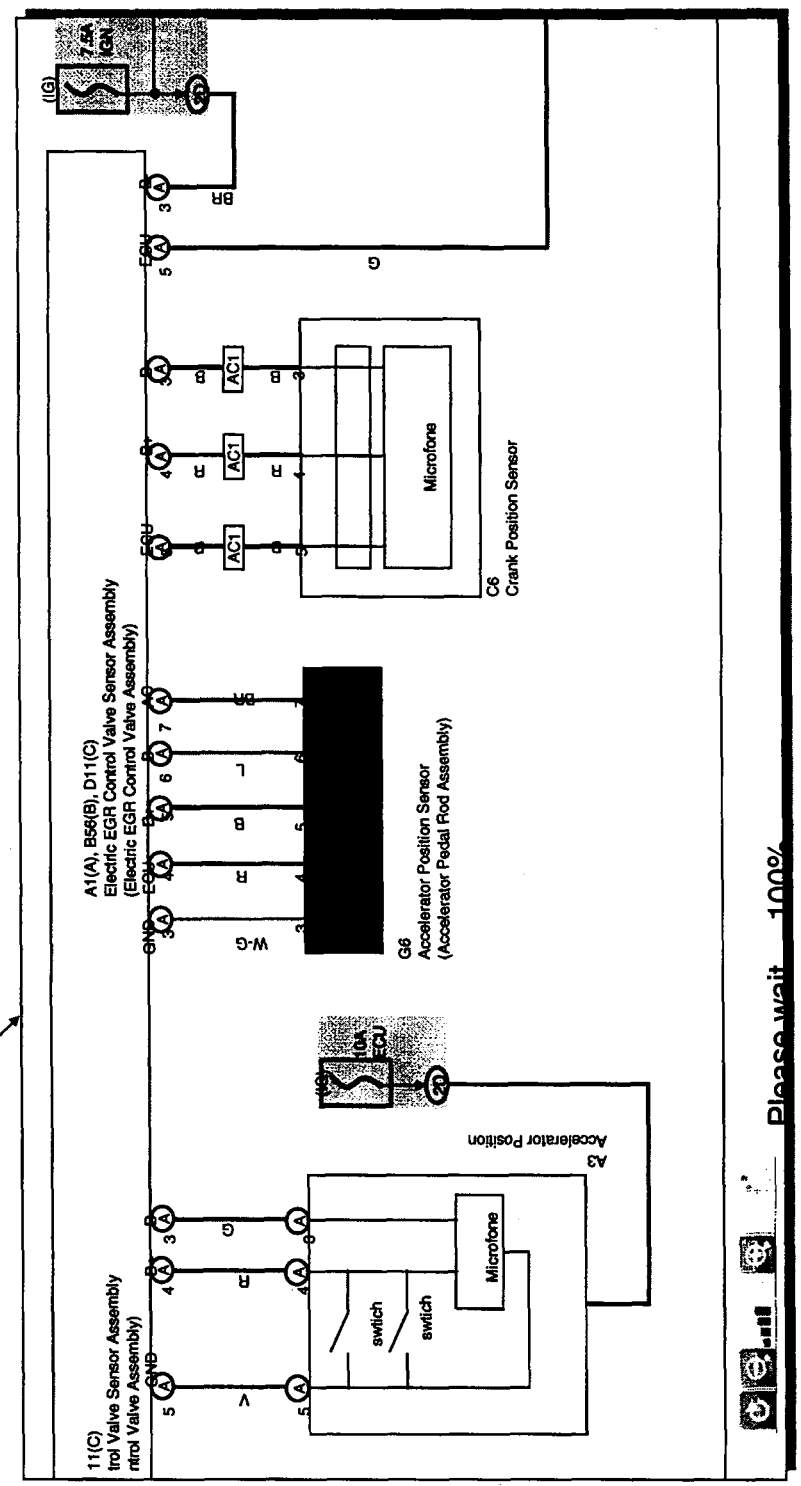
FIG. 27 is an explanatory view showing an aspect that an image based on the circuit-element-drawing divisional circuit diagram data (a) is superimposed on the already-displayed part-connection-drawing overall circuit diagram.

The circuit diagram supplying apparatus 10 displays images (part text information Pid, connection text information Lid and terminal text information Cid) based on the individual circuit-element-drawing divisional circuit diagram data as those images are superimposed on the part-connection-drawing overall circuit diagram already displayed on the display 12, in an order of reception in succession to the circuit-element-drawing divisional circuit diagram data (c) (step S380), then ending the process. In the step S380, the circuit diagram supplying apparatus 10 performs image display as follows. FIG. 24 is an explanatory view showing an aspect that an image based on the circuit-element-drawing divisional circuit diagram data (d) is superimposed on the already-displayed part-connection-drawing overall circuit diagram. FIG. 25 is an explanatory view showing an aspect that an image based on the circuit-element-drawing divisional circuit diagram data (b) is superimposed on the already-displayed part-connection-drawing overall circuit diagram. FIG. 26 is an explanatory view showing an aspect that an image based on the circuit-element-drawing divisional circuit diagram data (e) is superimposed on the already-displayed part-connection-drawing overall circuit diagram. FIG. 27 is an explanatory view showing an aspect that an image based on the circuit-element-drawing divisional circuit diagram data (a) is superimposed on the already-displayed part-connection-drawing overall circuit diagram.

The circuit diagram supplying apparatus 10, upon receiving, in succession to the circuit-element-drawing divisional circuit diagram data (c), the circuit-element-drawing divisional circuit diagram data (d) placed rightward next to the data (c), displays an image (part text information Pid, connection text information Lid and terminal text information Cid) based on the circuit-element-drawing divisional circuit diagram data (d) as it is superimposed on the already-displayed part-connection-drawing overall circuit diagram as shown in FIG. 24. In this case, since the image based on the circuit-element-drawing divisional circuit diagram data (c) has already been displayed, it follows that the image based on the circuit-element-drawing divisional circuit diagram data (d) is added to the image in FIG. 24. Then, the circuit diagram supplying apparatus 10 performs, in addition to the superimposed display of the image based on the circuit-element-drawing divisional circuit diagram data (d), a display in percentage of the progress status of circuit diagram supply, which represents a rate of finished superimposed display of the image based on the circuit-element-drawing divisional circuit diagram data (d), at a lower stage of the display 12.

Then, the circuit diagram supplying apparatus 10, upon receiving, in succession to the circuit-element-drawing divisional circuit diagram data (d), the circuit-element-drawing divisional circuit diagram data (b) placed leftward next to the circuit-element-drawing divisional circuit diagram data (c), displays an image (part text information Pid, connection text information Lid and terminal text information Cid) based on this circuit-element-drawing divisional circuit diagram data (b), as it is superimposed on the already-displayed part-connection-drawing overall circuit diagram, as shown in FIG. 25. In this case, since the images based on the circuit-element-drawing divisional circuit diagram data (c) to (d) have already been displayed (see FIG. 24), it follows that the image based on the circuit-element-drawing divisional circuit diagram data (b) is added in FIG. 25. Then, the circuit diagram supplying apparatus 10 performs, in addition to the superimposed display of the image based on the circuit-element-drawing divisional circuit diagram data (b), a display in percentage of the progress status of circuit diagram supply, which represents a rate of finished superimposed display of the image based on the circuit-element-drawing divisional circuit diagram data (b), at a lower stage of the display 12.

The circuit diagram supplying apparatus 10 receives, in succession to the circuit-element-drawing divisional circuit diagram data (b), the transmission of the circuit-element-drawing divisional circuit diagram data (e), which is placed leftward next to the circuit-element-drawing divisional circuit diagram data (d). The image (part text information Pid, connection text information Lid and terminal text information Cid) based on the transmitted circuit-element-drawing divisional circuit diagram data (e) is included in a region beyond the display area of the display 12 as it is center displayed as shown in FIG. 17, the image based on the circuit-element-drawing divisional circuit diagram data (e) is not displayed in FIG. 26. However, since the circuit diagram supplying apparatus 10 continues data processing for drawing the image based on the circuit-element-drawing divisional circuit diagram data (e), the image based on the circuit-element-drawing divisional circuit diagram data (e) is displayed by screen scroll operation by the user. In data processing for drawing of the image based on the circuit-element-drawing divisional circuit diagram data (e) like this, the circuit diagram supplying apparatus 10 displays the progress status of circuit diagram supply, which represents a rate of finished data processing for superimposed display of the image based on the circuit-element-drawing divisional circuit diagram data (e), at a lower stage of the display 12.

The circuit diagram supplying apparatus 10, in succession to the circuit-element-drawing divisional circuit diagram data (e), finally receives the transmission of the circuit-element-drawing divisional circuit diagram data (a) placed rightward next to the circuit-element-drawing divisional circuit diagram data (b). The image (part text information Pid, connection text information Lid and terminal text information Cid) based on the transmitted circuit-element-drawing divisional circuit diagram data (a) is included in a region beyond the display area of the display 12 as it is center displayed as shown in FIG. 17, the image based on the circuit-element-drawing divisional circuit diagram data (a) is not displayed in FIG. 27. However, since the circuit diagram supplying apparatus 10 continues data processing for drawing the image based on the circuit-element-drawing divisional circuit diagram data (a), the image based on the circuit-element-drawing divisional circuit diagram data (a) is displayed by screen scroll operation by the user. In data processing for drawing of the image based on the circuit-element-drawing divisional circuit diagram data (a) like this, the circuit diagram supplying apparatus 10 displays the progress status of circuit diagram supply, which represents a rate of finished data processing for superimposed display of the image based on the circuit-element-drawing divisional circuit diagram data (a), at a lower stage of the display 12.

The circuit diagram supplying apparatus 10 of this embodiment constituted as described above, in reception of the transmission of drawing data to be used for image display of circuit diagrams from the server 30, first of all, receives transmission of part-connection-drawing overall circuit diagram data (see FIGS. 6 and 16) for image display of a part-connection-drawing overall circuit diagram in which part-to-part connection diagrams LSd are superimposed on a part placement diagram having electrical component parts PSd arranged therein (step S340). The circuit diagram supplying apparatus 10, based on the first transmitted part-connection-drawing overall circuit diagram data, displays on the display 12 an image of the part-connection-drawing overall circuit diagram in which the connection diagrams LSd are superimposed on the part placement diagram having the electrical component part PSd arranged therein. The transmitted part-connection-drawing overall circuit diagram data, which are data sufficient to draw the superimposed image of the connection diagrams LSd on the part placement diagram having the electrical component part PSd arranged therein, are limited in data amount as compared with the circuit diagram drawing data that are all the data for displaying an image of the circuit diagrams on the basis of each device system. Thus, according to the circuit diagram supplying apparatus 10 of this embodiment, after requesting the server 30 to transmit the circuit diagram drawing data as to an device system specified by the user, image display of part-connection-drawing overall circuit diagrams (see FIG. 16) can promptly be displayed on the display 12, an incompatible feeling of system abnormality for the user can be suppressed.

The circuit diagram supplying apparatus 10 of this embodiment requests the server 30 to first transmit part-connection-drawing overall circuit diagram data for displaying an image of part-connection-drawing overall circuit diagrams in which part-to-part connection diagrams LSd are superimposed on the part placement diagram having the electrical component parts PSd arranged therein, and first displays on the display 12 the part-connection-drawing overall circuit diagram based on these part-connection-drawing overall circuit diagram data (see FIG. 17). Therefore, according to the circuit diagram supplying apparatus 10 of this embodiment, it is made implementable to supply the user from the beginning with part-connection-drawing overall circuit diagrams in which the part-to-part connection diagrams LSd are superimposed on the part placement diagram having the electrical component parts PSd arranged therein.

The circuit diagram supplying apparatus 10 of this embodiment receives transmission of remaining drawing data in succession to the transmission of the part-connection-drawing overall circuit diagram data sequentially in transmission units of circuit-element-drawing divisional circuit diagram data (see FIGS. 7 to 11, FIG. 18 and FIGS. 20 to 23) whose data amount is limited as compared with circuit diagram drawing data (step S350-S380), and sequentially displays images based on the circuit-element-drawing divisional circuit diagram data (a)-(n) transmitted in the transmission units as they are superimposed on the part-connection-drawing overall circuit diagram (see FIG. 19 and FIGS. 24 to 27). Therefore, according to the circuit diagram supplying apparatus 10 of this embodiment, since there is no need for establishing the transmitted circuit-element-drawing divisional circuit diagram data (a)-(n) into the undivided state, it is implementable to promptly display also images based on the circuit-element-drawing divisional circuit diagram data (a)-(n) that have been transmitted and received in succession. Therefore, according to the circuit diagram supplying apparatus 10 of this embodiment, an incompatible feeling of system abnormality for the user can be suppressed with high effectiveness. Still, since images based on the circuit-element-drawing divisional circuit diagram data (a)-(n) are only images that display the part text information Pid, the connection text information Lid and the terminal text information Cid except the electrical component parts PSd and the connection diagrams LSd contained in the individual display areas, the image display based on the circuit-element-drawing divisional circuit diagram data (a)-(n) that have been transmitted and received in succession is processed more promptly, contributing to suppression of the incompatible feeling.

The circuit diagram supplying apparatus 10 of this embodiment stores neither part-connection-drawing overall circuit diagram data for displaying an image of, for example, the device system circuit diagram shown in FIG. 5 nor the circuit-element-drawing divisional circuit diagram data (a)-(n), thus making it possible to achieve a cost reduction of the circuit diagram supplying apparatus 10. These data are stored in the server 30. Therefore, since the part-connection-drawing overall circuit diagram data and the circuit-element-drawing divisional circuit diagram data (a)-(n) can be subjected to corrections and additions and the like, as required, on the server 30 side, the circuit diagram supplying apparatus 10 of this embodiment can receive part-connection-drawing overall circuit diagram data and circuit-element-drawing divisional circuit diagram data (a)-(n) that have been subjected to such corrections, additions and the like, hence general-purpose utility is enhanced.

The circuit diagram supplying apparatus 10 of this embodiment, upon specification of an electrical component and an device system having this electrical component incorporated therein by the user (step S300-S310, FIG. 15), in a transmission request to the server 30 in units of the circuit-element-drawing divisional circuit diagram data (a)-(n), requests the transmission of circuit-element-drawing divisional circuit diagram data (c) including an electrical component part PSd corresponding to the specified electrical component (input part) (step S350). Then, the circuit diagram supplying apparatus 10 of this embodiment requests transmission of the circuit-element-drawing divisional circuit diagram data (a)-(n) in decreasing order of nearness to the circuit-element-drawing divisional circuit diagram data (c), more specifically, in an order of right-hand neighborhood, left-hand neighborhood, further outer right-hand neighborhood, outer left-hand neighborhood. Besides, the circuit diagram supplying apparatus 10 of this embodiment displays an image of the part-connection-drawing overall circuit diagram (see FIG. 16) based on the part-connection-drawing overall circuit diagram data transmitted from the server 30 with the first-of-all request for transmission, in such a fashion that an image based on the circuit-element-drawing divisional circuit diagram data (c) including electrical component parts PSd corresponding to a specified electrical component (input part) is included in the display area of the display 12. Therefore, according to the circuit diagram supplying apparatus 10 of this embodiment, the user can be supplied with the part-connection-drawing overall circuit diagram (see FIG. 16) including the electrical component part PSd corresponding to the electrical component specified by the user himself/herself. Thus, while an electrical component part PSd corresponding to the electrical component specified by the user himself/herself is presented, the user is allowed to present scroll display of part placement diagrams therearound or the like.

In presenting a display of the part-connection-drawing overall circuit diagram (see FIG. 16) based on part-connection-drawing overall circuit diagram data transmitted from the server 30 with a first-of-all transmission request, the circuit diagram supplying apparatus 10 of this embodiment displays an electrical component part PSd corresponding to an electrical component specified by the user as it is centered and highlighted (see FIG. 17). Therefore, according to the circuit diagram supplying apparatus 10 of this embodiment, it is implementable that while an electrical component part PSd corresponding to an electrical component specified by the user is presented, the user can be impressed with the electrical component part PSd, hence convenience is enhanced.

In displaying an image based on the circuit-element-drawing divisional circuit diagram data (a)-(n) in an order in which these data have been transmitted sequentially, the circuit diagram supplying apparatus 10 of this embodiment displays a ratio of already-transmitted circuit-element-drawing divisional circuit diagram data relative to all the circuit-element-drawing divisional circuit diagram data (a)-(n) to be transmitted sequentially, in percentage as a progress status of circuit diagram supply (see FIG. 19 and FIGS. 24 to 27). Therefore, according to the circuit diagram supplying apparatus 10 of this embodiment, the incompatible feeling of system abnormality for the user can be further suppressed by the presentation of the circuit diagram supply status.

Next, another embodiment will be described. This embodiment features in displaying an image of device system circuit diagrams without executing centering and highlight display. There are some cases where, for example, the user desires to grasp the whole content of a particular device system circuit diagram from the beginning. In such a case, it is appropriate to present the device system circuit diagram desired by the user, starting with a specified spot, e.g., a left end portion of the circuit diagram. In order to meet such a demand, the circuit diagram supplying apparatus 10 of this embodiment provides circuit diagram supply as described below. It is noted that this embodiment is also generally similar in hardware constitution to the already described embodiment.

In this embodiment, for example, a list of device system circuit diagrams is displayed at a left end of the initial input screen shown in FIG. 14, being subject to specification of an device system circuit diagram by a user. Otherwise, under the condition that check boxes as to whether or not centering display are necessary displayed in the circuit diagram specifying screen shown in FIG. 15, those check statuses make part specification unnecessary and specification of an device system circuit diagram by the user from the list of display-object system circuit candidates shown in FIG. 15 is awaited. The following description is also based on an assumption that the user has specified the device system circuit diagram shown in FIG. 5. Upon receiving specification of an device system circuit diagram from the user, the circuit diagram supplying apparatus 10 requests the servers 30 to transmit drawing data of part-connection circuit diagrams for the specified system circuit diagram at step S330 as already described. The server 30, receiving this request, searches for the device system circuit diagram specified by the user to extract part-connection-drawing overall circuit diagram data (see FIG. 4) for drawing the part-connection-drawing overall circuit diagram of FIG. 6, and then transmits the relevant data (see FIG. 16) along with link data (see FIG. 12) to the circuit diagram supplying apparatus 10 (step S420).

Figure 28:
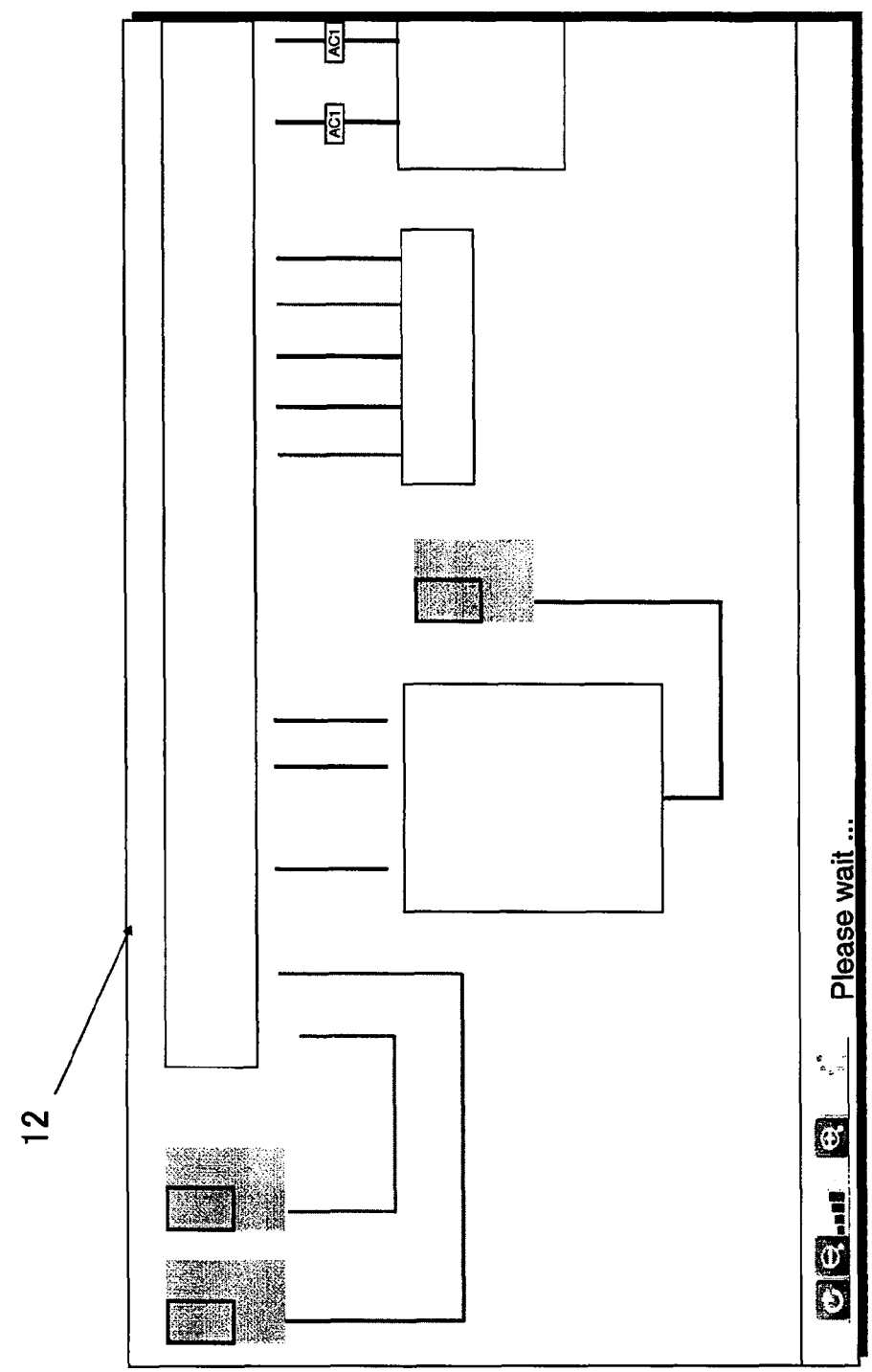
FIG. 28 is an explanatory view showing an aspect of image display of a part-connection-drawing overall circuit diagram based on part-connection-drawing overall circuit diagram data.

The circuit diagram supplying apparatus 10, having received the transmission of the part-connection-drawing overall circuit diagram data, displays the part-connection-drawing overall circuit diagram of FIG. 16 based on the part-connection-drawing overall circuit diagram data at step S340, starting with the left end side of the circuit diagram on the display 12. That is, in this embodiment, the centering and the highlight display executed in the already-described step S340 is skipped. FIG. 28 is an explanatory view showing an aspect of image display of the part-connection-drawing overall circuit diagram based on the part-connection-drawing overall circuit diagram data.

Figure 29:
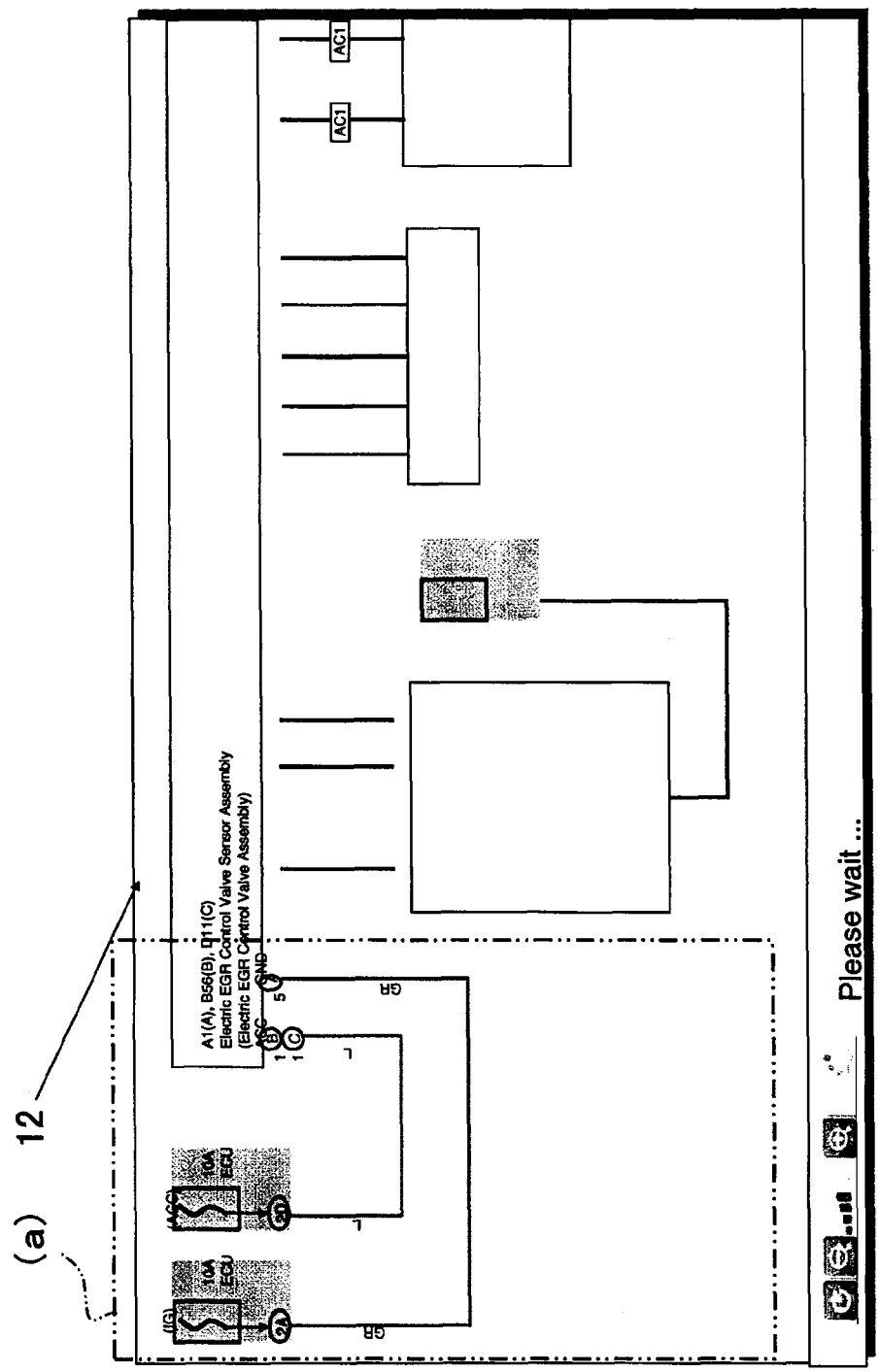
FIG. 29 is an explanatory view showing an image displayed by the circuit-element-drawing divisional circuit diagram data (a) transmitted in succession to the part-connection-drawing overall circuit diagram data.

In this embodiment, after receiving the transmission of the part-connection-drawing overall circuit diagram data, the circuit diagram supplying apparatus 10 requests the server 30 to transmit the individual divisional circuit diagrams, starting with the left-end side of the part-connection-drawing overall circuit diagram and in the order of the circuit-element-drawing divisional circuit diagram data (a) to (e) of FIG. 5. The server 30, having received the request for sequential transmission, transmits the individual divisional circuit diagram data, in the order of circuit-element-drawing divisional circuit diagram data (a) to (e) of FIG. 5, to the circuit diagram supplying apparatus 10. FIG. 29 is an explanatory view showing an image displayed by the circuit-element-drawing divisional circuit diagram data (a) transmitted in succession to the part-connection-drawing overall circuit diagram data. Since the circuit diagram supplying apparatus 10 thereafter receives the transmission of the divisional circuit diagram data in the order of circuit-element-drawing divisional circuit diagram data (b) to (e), the circuit diagram supplying apparatus 10 sequentially superimposes, on the displayed image of FIG. 29, an image based on the circuit-element-drawing divisional circuit diagram data (e), an image based on the circuit-element-drawing divisional circuit diagram data (c), an image based on the circuit-element-drawing divisional circuit diagram data (d), and an image based on the circuit-element-drawing divisional circuit diagram data (e). Also the circuit diagram supplying apparatus 10 of this embodiment is enabled to implement prompt image display of the part-connection-drawing overall circuit diagram (see FIG. 16) on the display 12 after requesting the server 30 for transmission of the circuit diagram drawing data as to the device system specified by the user. Thus, an example of suppressing the incompatible feeling of system abnormality can be produced as in the case of the already-described embodiment.

Figure 30:
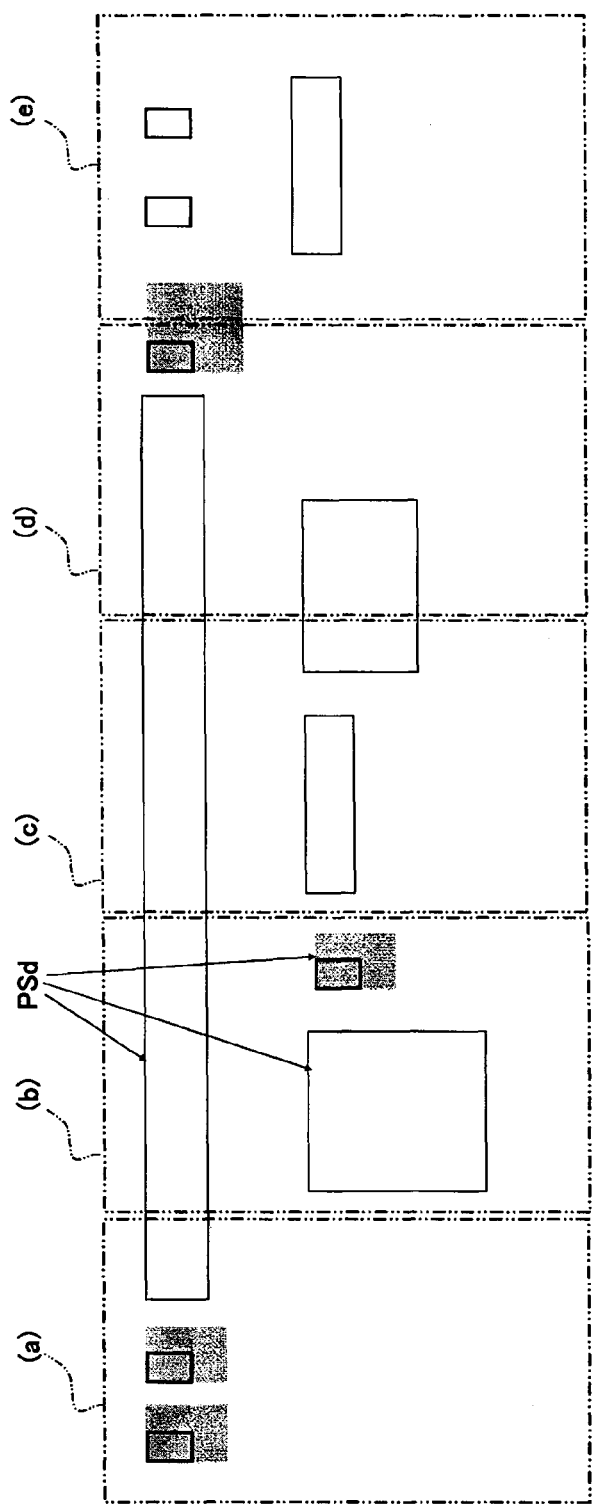
FIG. 30 is an explanatory view showing an aspect that a part placement diagram of electrical component parts PSd in the device system circuit diagram of FIG. 5 is drawn based on part placement diagram data.
Figure 31:
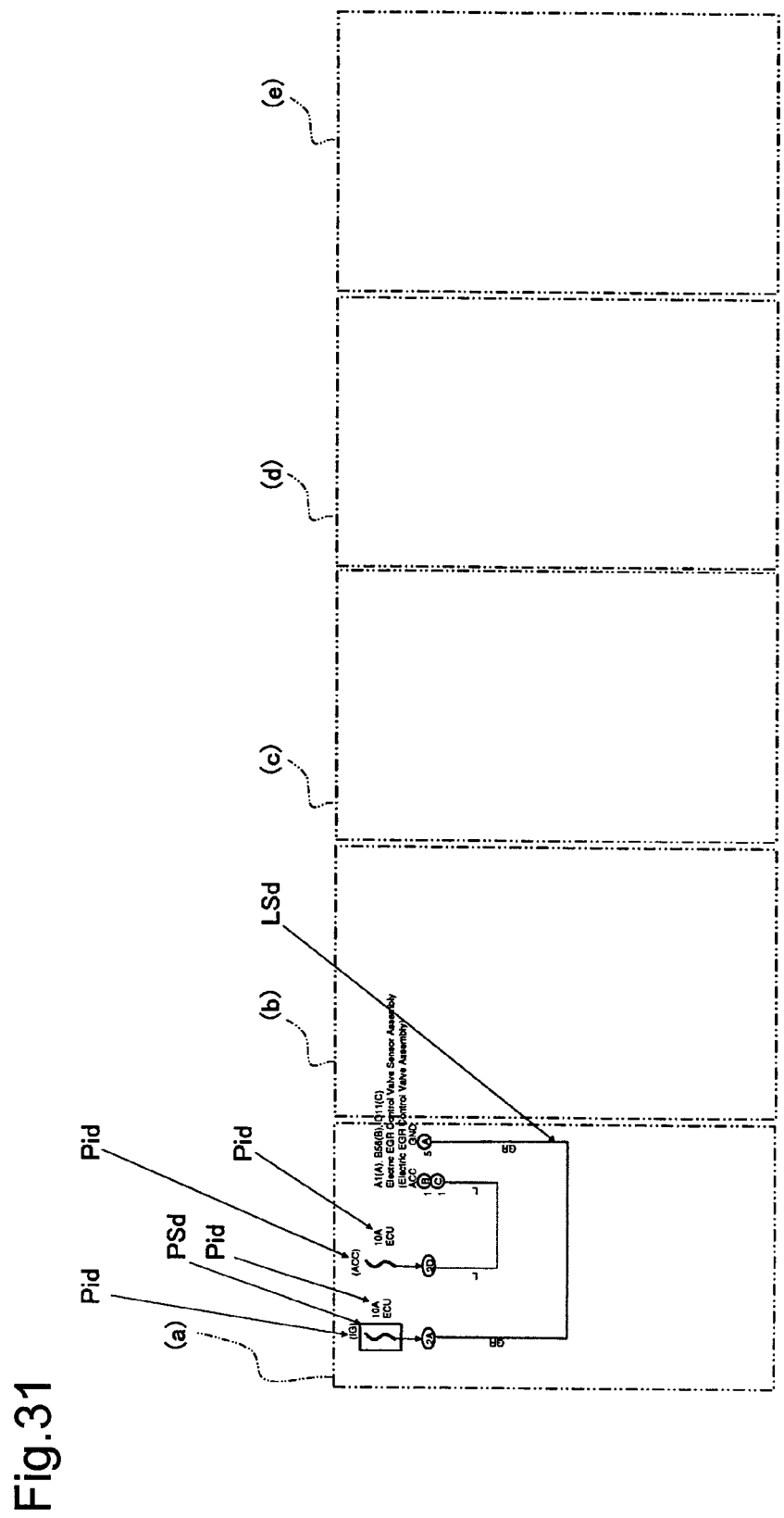
FIG. 31 is an explanatory view showing an aspect that circuit elements of the divisional area (a) in the device system circuit diagram of FIG. 5 are drawn based on the circuit-element-drawing divisional circuit diagram data (a) including a connection diagram LSd.
Figure 32:
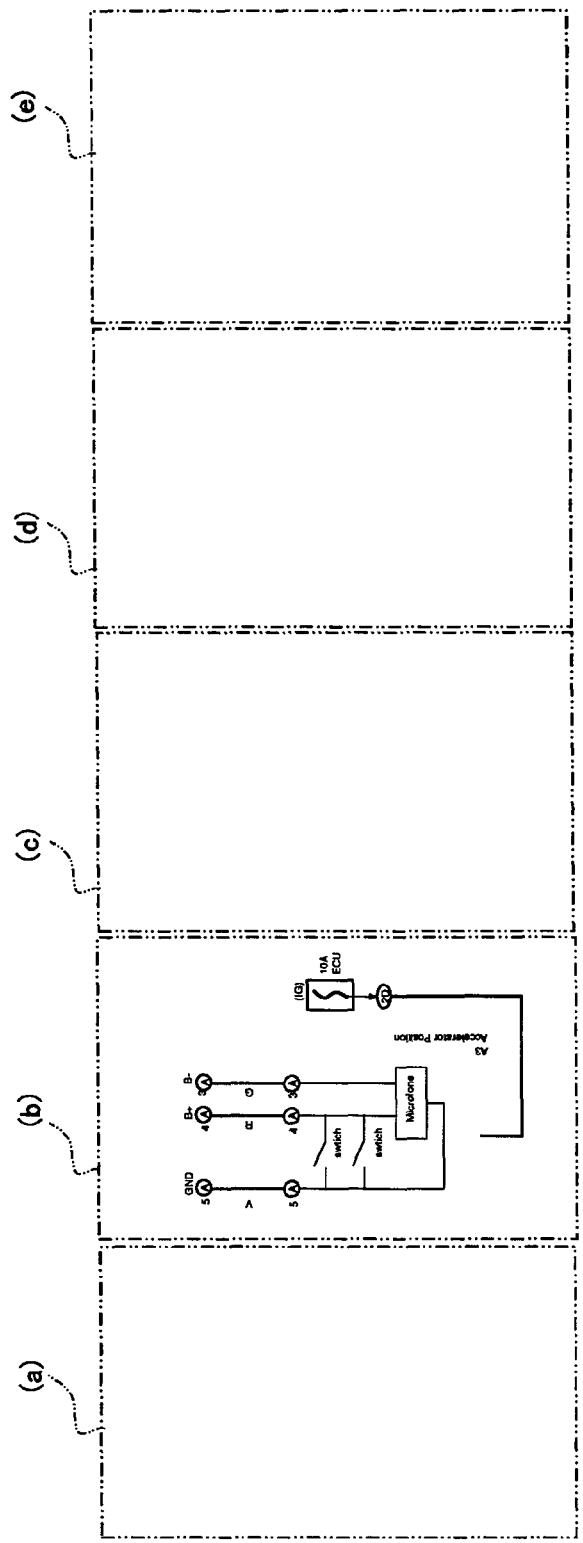
FIG. 32 is an explanatory view showing an aspect that circuit elements of the divisional area (b) in the device system circuit diagram of FIG. 5 are drawn based on the circuit-element-drawing divisional circuit diagram data (b) including a connection diagram LSd.
Figure 33:
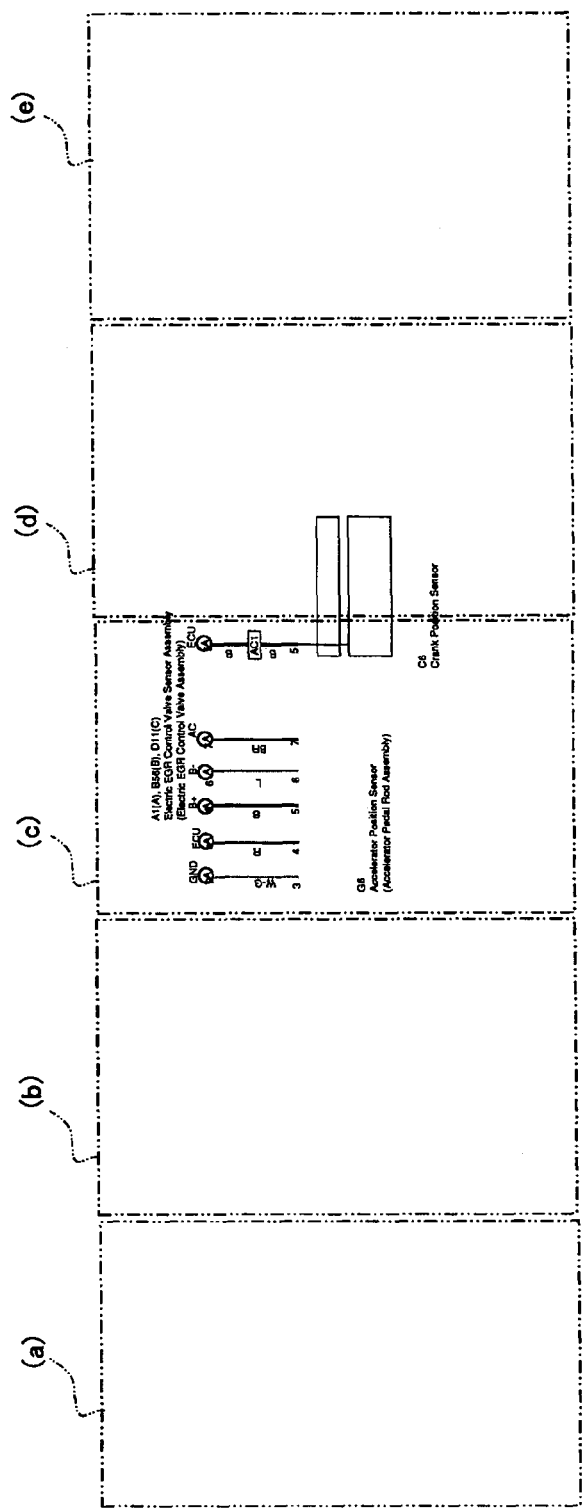
FIG. 33 is an explanatory view showing an aspect that circuit elements of the divisional area (c) in the device system circuit diagram of FIG. 5 are drawn based on the circuit-element-drawing divisional circuit diagram data (c) including a connection diagram LSd.
Figure 34:
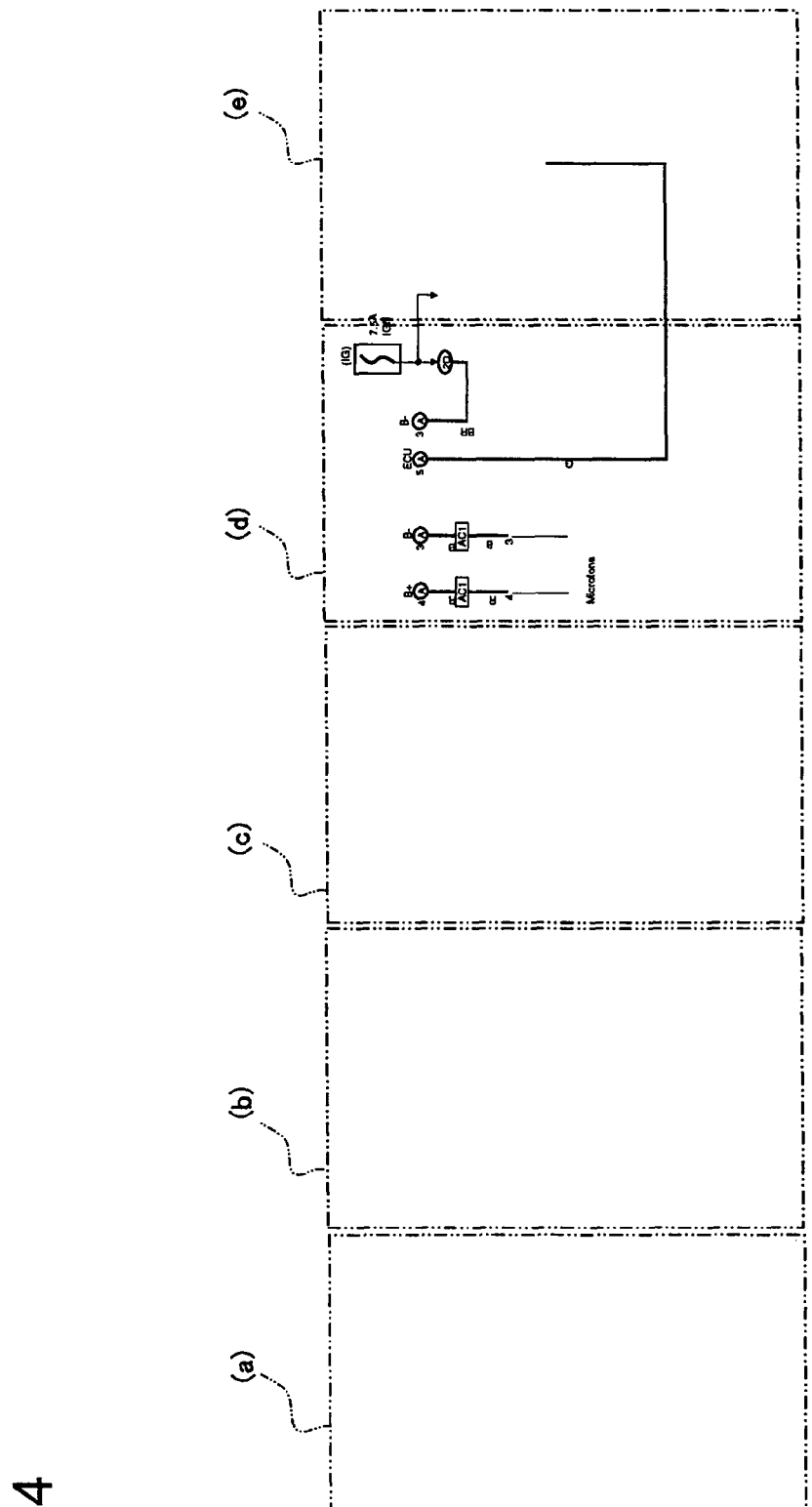
FIG. 34 is an explanatory view showing an aspect that circuit elements of the divisional area (d) in the device system circuit diagram of FIG. 5 are drawn based on the circuit-element-drawing divisional circuit diagram data (d) including a connection diagram LSd.
Figure 35:
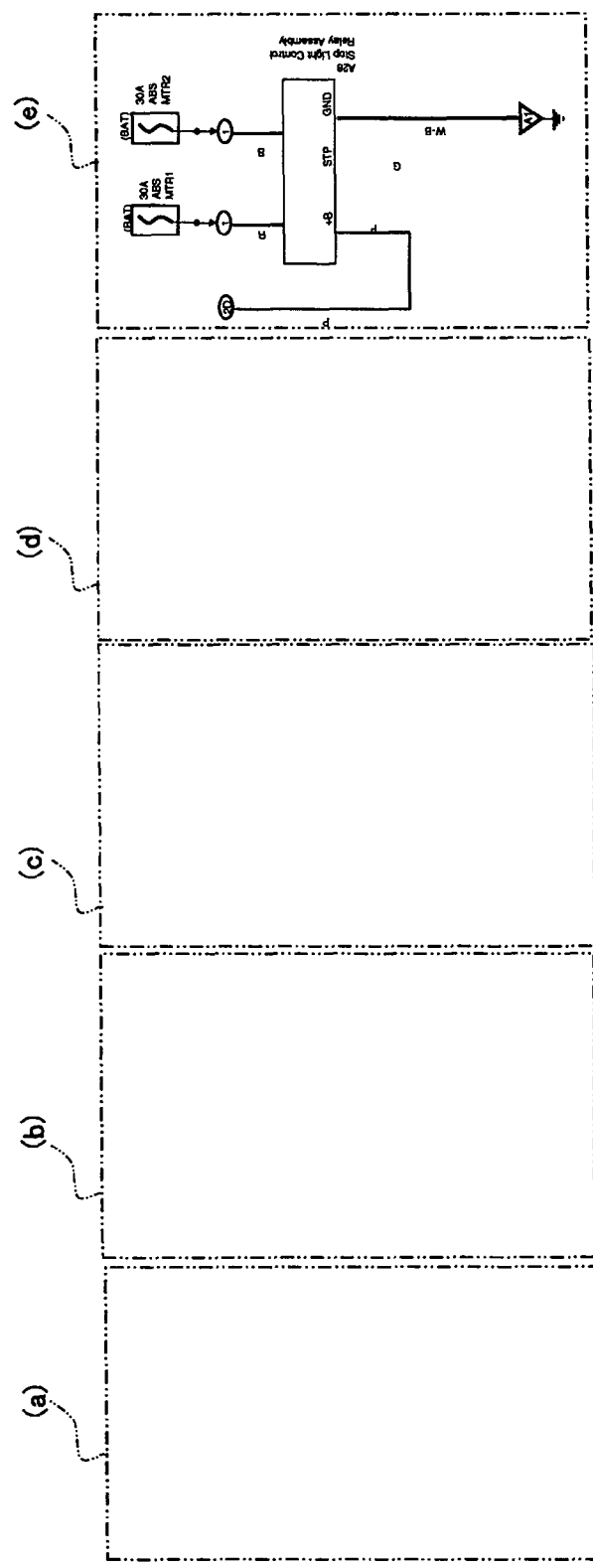
FIG. 35 is an explanatory view showing an aspect that circuit elements of the divisional area (e) in the device system circuit diagram of FIG. 5 are drawn based on the circuit-element-drawing divisional circuit diagram data (e) including a connection diagram LSd.

Next, still another embodiment will be described. This embodiment features in that connection diagrams LSd for making connections individual electrical component parts PSd in the part placement diagram by reflecting actual connections are treated in the same manner as those of the already-described connection text information Lid, terminal text information Cid and part text information Pid. Therefore, in this embodiment, data for displaying an image of the connection diagrams LSd are stored in the server 30 together with the connection text information Lid or the like as they are contained in the circuit-element-drawing divisional circuit diagram data (a)-(n), while data (part placement diagram data) for displaying an image of the part placement diagram having the electrical component parts PSd arranged therein are treated solely. FIG. 30 is an explanatory view showing an aspect that a part placement diagram of electrical component parts PSd in the device system circuit diagram of FIG. 5 is drawn based on the part placement diagram data. FIG. 31 is an explanatory view showing an aspect that circuit elements of the divisional area (a) in the device system circuit diagram of FIG. 5 are drawn based on the circuit-element-drawing divisional circuit diagram data (a) including a connection diagram LSd. FIG. 32 is an explanatory view showing an aspect that circuit elements of the divisional area (b) in the device system circuit diagram of FIG. 5 are drawn based on the circuit-element-drawing divisional circuit diagram data (b) including a connection diagram LSd. FIG. 33 is an explanatory view showing an aspect that circuit elements of the divisional area (c) in the device system circuit diagram of FIG. 5 are drawn based on the circuit-element-drawing divisional circuit diagram data (c) including a connection diagram LSd. FIG. 34 is an explanatory view showing an aspect that circuit elements of the divisional area (d) in the device system circuit diagram of FIG. 5 are drawn based on the circuit-element-drawing divisional circuit diagram data (d) including a connection diagram LSd. FIG. 35 is an explanatory view showing an aspect that circuit elements of the divisional area (e) in the device system circuit diagram of FIG. 5 are drawn based on the circuit-element-drawing divisional circuit diagram data (e) including a connection diagram LSd.

In this embodiment, the server 30, upon receiving the transmission of drawing data as to the system circuit diagram specified by the user from the circuit diagram supplying apparatus 10, searches for the device system circuit diagram specified by the user and transmits part placement diagram data for drawing the part placement diagram of FIG. 30 along with the link data (see FIG. 12) to the circuit diagram supplying apparatus 10 (step S420). The circuit diagram supplying apparatus 10 in this embodiment, having received the transmission of the part placement diagram data, displays on the display 12 the part placement diagram of FIG. 30 based on the part placement diagram data, where centering and highlight display are involved in this display as already described (step S340). Processing after this on is similar to that of the foregoing embodiment, and so the already described effects can be produced even with the circuit diagram supplying apparatus 10 of this embodiment.

The present invention is not limited to the above-described embodiments and may be fulfilled in various configurations unless those configurations depart from the gist of the invention. For example, technical features in the individual embodiments corresponding to technical features in the individual aspects described in the section of Summary of the Invention may be replaced or combined with one another, as required, in order to solve part or entirety of the above-described problems or to achieve part or entirety of the above-described advantageous effects. Moreover, those technical features may be deleted, as required, unless herein otherwise described as indispensable.

In the above-described embodiments, after reception of the transmission of the circuit-element-drawing divisional circuit diagram data (c) including an input part specified by the user, the circuit diagram supplying apparatus requests the server 30 to transmit circuit-element-drawing divisional circuit diagram data sequentially in the order of the circuit-element-drawing divisional circuit diagram data (d) which is a divisional circuit diagram rightward next to a divisional circuit diagram corresponding to the circuit-element-drawing divisional circuit diagram data (c), the circuit-element-drawing divisional circuit diagram data (b) which is a divisional circuit diagram placed leftward next to a divisional circuit diagram corresponding to the circuit-element-drawing divisional circuit diagram data (c), the circuit-element-drawing divisional circuit diagram data (e) and circuit-element-drawing divisional circuit diagram data (a) both of which are placed outside the foregoing data. However, this is not limitative. That is, the circuit diagram supplying apparatus, after receiving the transmission of the circuit-element-drawing divisional circuit diagram data (c), may request the transmission in an order of circuit-element-drawing divisional circuit diagram data (b) which is a divisional circuit diagram placed leftward next to the received data, then the circuit-element-drawing divisional circuit diagram data (d) which is a divisional circuit diagram placed rightward-next neighborhood, and thereafter the circuit-element-drawing divisional circuit diagram data (a) and the circuit-element-drawing divisional circuit diagram data (e).

In addition, it is also allowable to adopt a circuit diagram supplying apparatus in the following mode. That is, the circuit diagram supplying apparatus acquire circuit diagrams as to each device system constituted by including a plurality of electrical components from a server, to which the circuit diagram supplying apparatus is connected so as to be enabled to perform data transmission to each other, and displays the circuit diagrams on a display unit, thus the circuit diagram supplying apparatus fulfilling supply of the circuit diagrams to a user. In this case, the server stores circuit diagram drawing data for making an image display of the circuit diagrams for each device system in the form of a plurality of divided-circuit-diagram drawing data, which are data divided in units of display areas that can be displayed on the display unit. The circuit diagram supplying apparatus includes: a transmission requester for accepting from a user specification of the device system as an object for supply of the circuit diagrams and specification of an electrical component contained in the specified device system, and for requesting the server to perform sequential transmission of the divided-circuit-diagram drawing data; and a display controller for displaying on the display unit an image of the circuit diagrams based on the divided-circuit-diagram drawing data transmitted from the server. The transmission requester requests first transmission of the divided-circuit-diagram drawing data including an electrical component part diagram corresponding to the specified electrical component out of the circuit diagram drawing data as to the specified device system, and moreover requests transmission of the other divided-circuit-diagram drawing data in decreasing order of nearness to the divided-circuit-diagram drawing data including the electrical component part diagram corresponding to the specified electrical component. According to the circuit diagram supplying apparatus in this mode, it is implementable to supply circuits to the user, starting with an electrical component part diagram corresponding to an electrical component specified by the user himself/herself. Still, since data amount of divided-circuit-diagram drawing data is limited as compared with the circuit diagram drawing data that are all of the data for displaying circuit diagrams for each device system, it is implementable, also with the circuit diagram supplying apparatus of this mode, that after the request to the server of transmission of circuit diagram drawing data for the device system specified by the user, circuit diagrams can promptly be displayed divisionally on the display unit, so that the incompatible feeling of system abnormality for the user can be suppressed.

Figure 36:
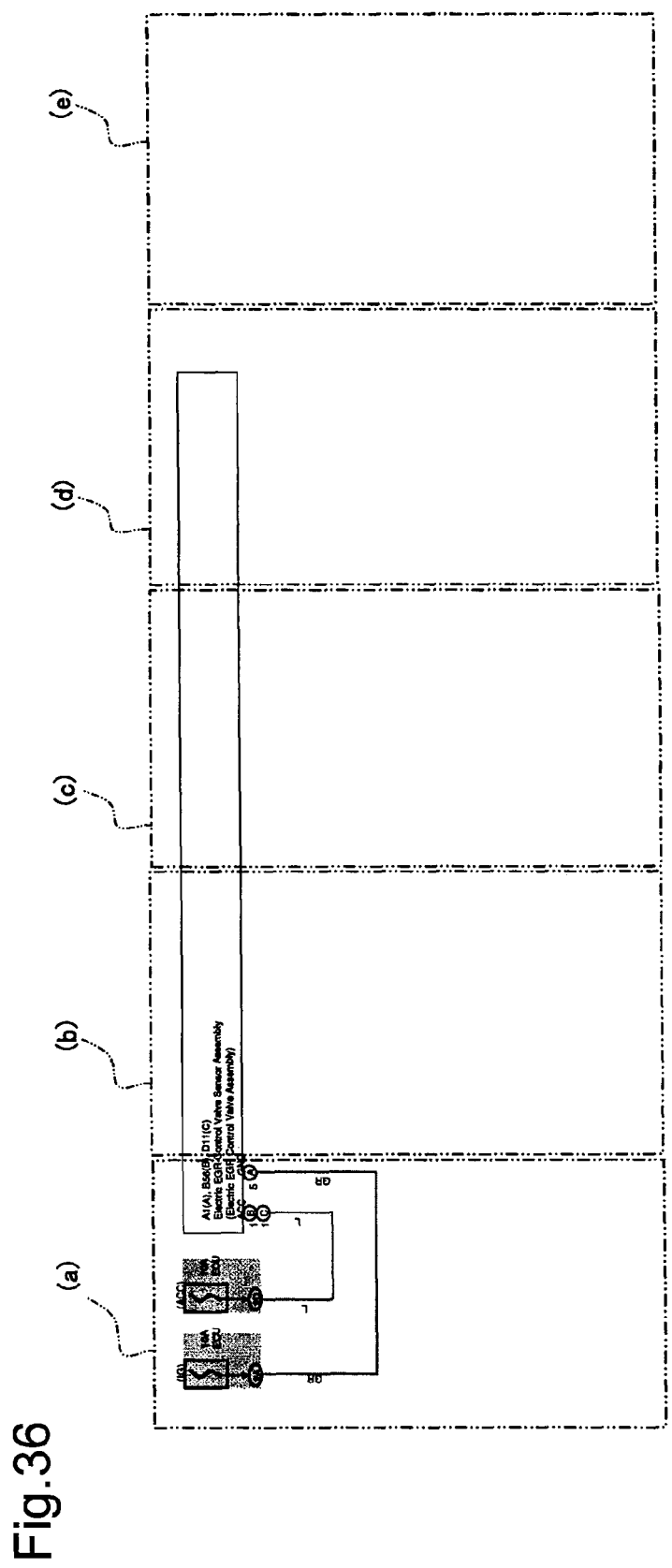
FIG. 36 is an explanatory view showing an aspect that circuit elements of the divisional area (a) in the device system circuit diagram of FIG. 5 are drawn based on the circuit-element-drawing divisional circuit diagram data (a) including electrical component parts PSd.
Figure 37:
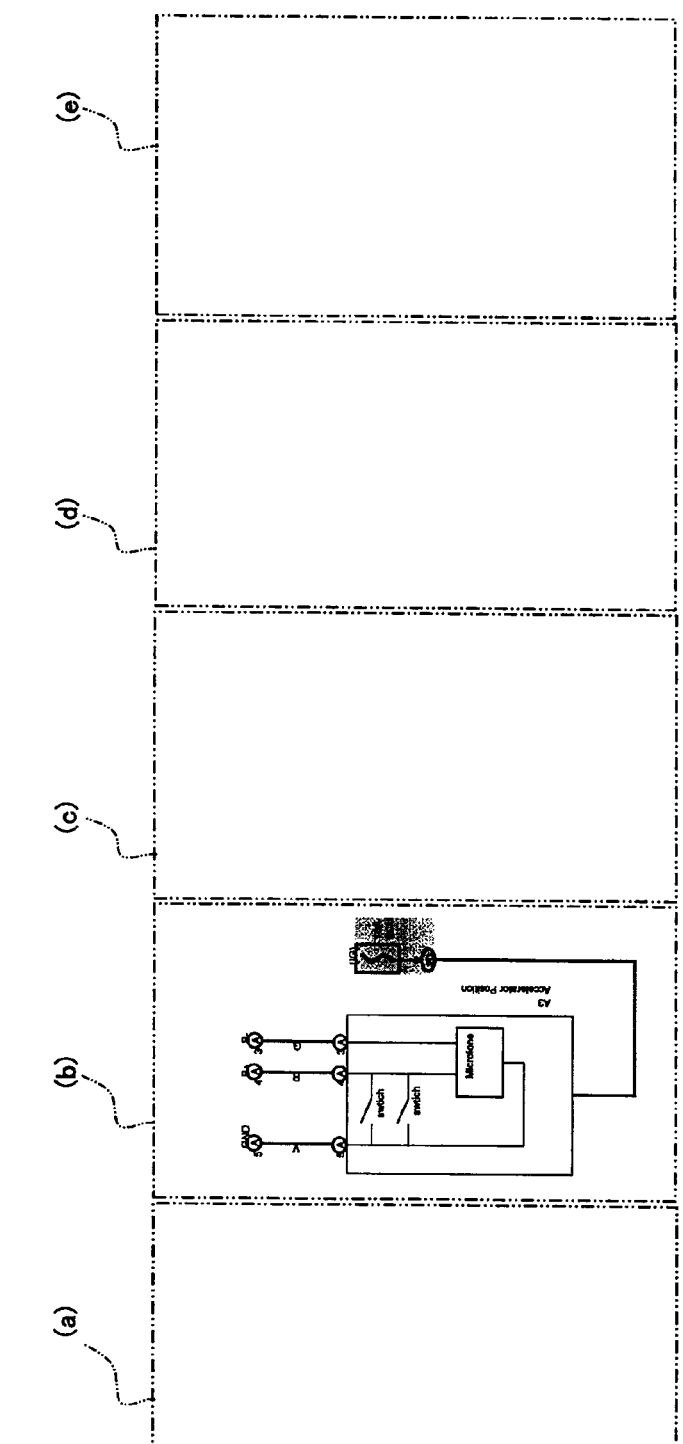
FIG. 37 is an explanatory view showing an aspect that circuit elements of the divisional area (b) in the device system circuit diagram of FIG. 5 are drawn based on the circuit-element-drawing divisional circuit diagram data (b) including an electrical component part PSd.
Figure 38:
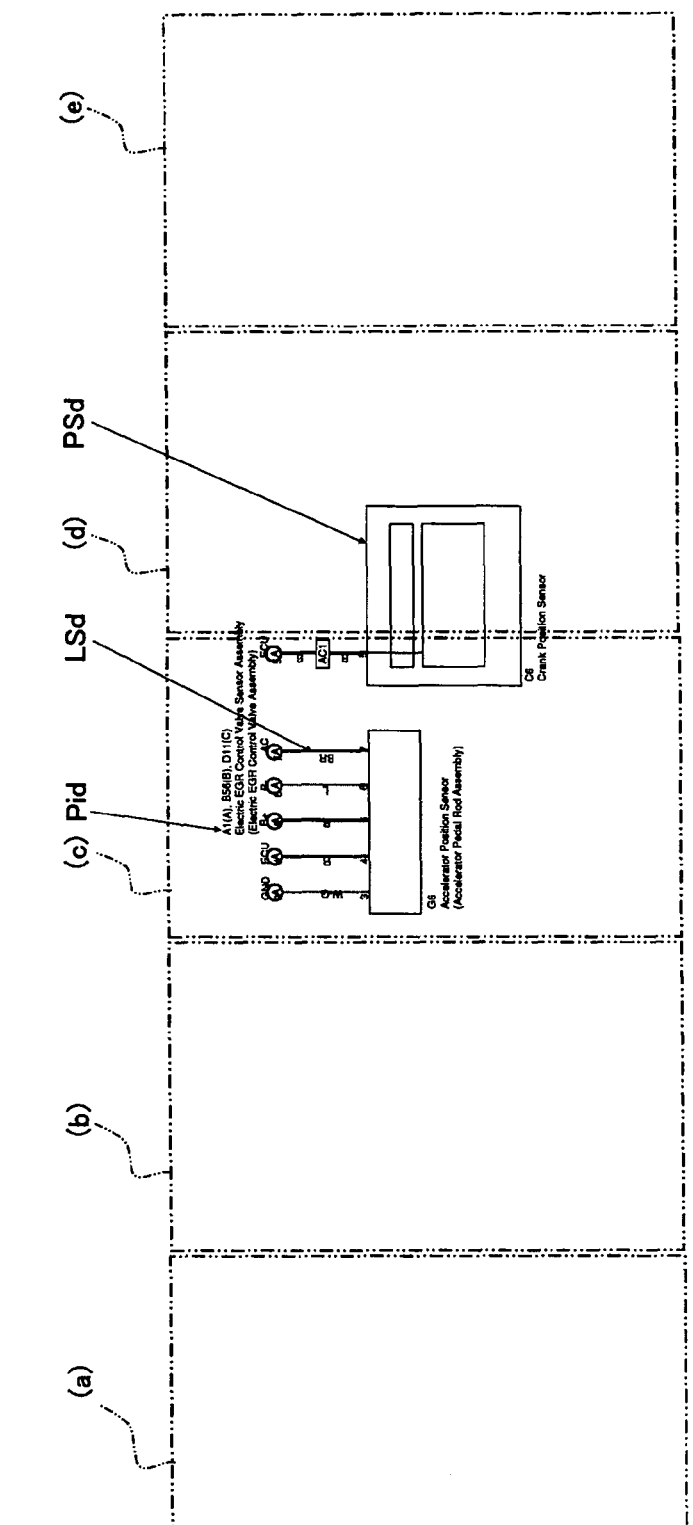
FIG. 38 is an explanatory view showing an aspect that circuit elements of the divisional area (c) in the device system circuit diagram of FIG. 5 are drawn based on the circuit-element-drawing divisional circuit diagram data (c) including an electrical component part PSd.
Figure 39:
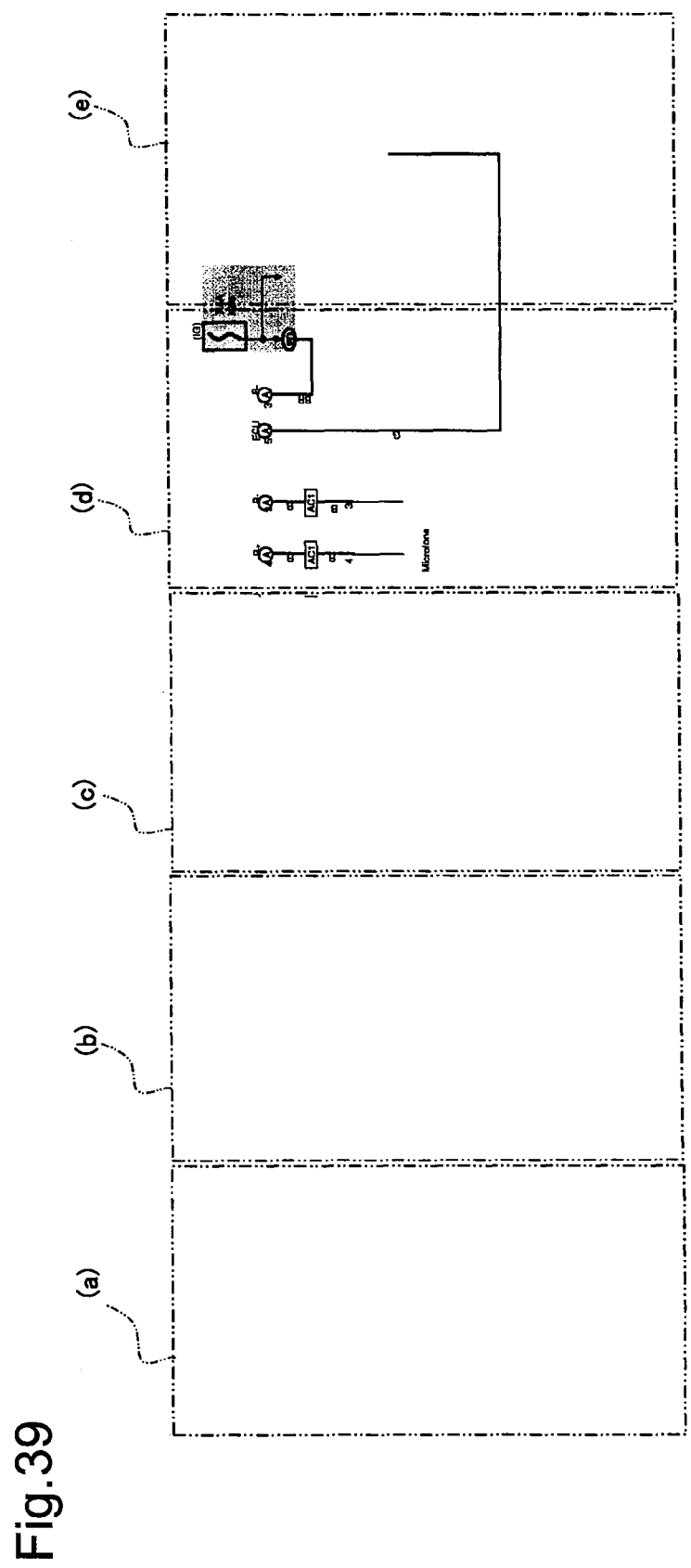
FIG. 39 is an explanatory view showing an aspect that circuit elements of the divisional area (d) in the device system circuit diagram of FIG. 5 are drawn based on the circuit-element-drawing divisional circuit diagram data (d) including an electrical component part PSd.
Figure 40:
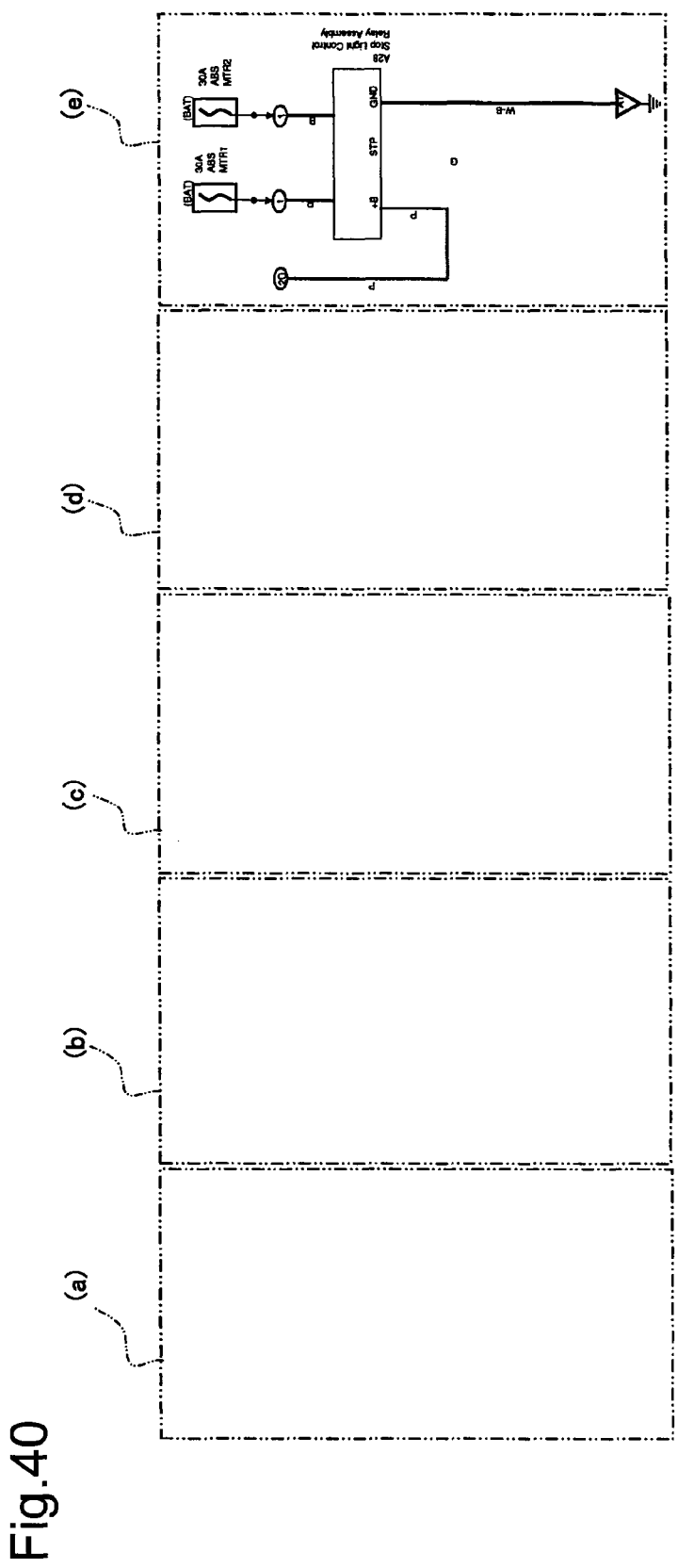
FIG. 40 is an explanatory view showing an aspect that circuit elements of the divisional area (e) in the device system circuit diagram of FIG. 5 are drawn based on the circuit-element-drawing divisional circuit diagram data (e) including an electrical component part PSd.

The above-described circuit diagram supplying apparatus treat also electrical component parts PSd in the already-described embodiments, in the same manner as with the connection text information Lid or the like. Then, in the above-described embodiments of the circuit diagram supplying apparatus, part placement diagram data for displaying images of the part placement diagram having the electrical component parts PSd arranged therein are stored in the server 30 as they are contained in the circuit-element-drawing divisional circuit diagram data (a)-(n), and transmission request and data transmission are executed in the units of circuit-element-drawing divisional circuit diagram data. FIG. 36 is an explanatory view showing an aspect that circuit elements of the divisional area (a) in the device system circuit diagram of FIG. 5 are drawn based on the circuit-element-drawing divisional circuit diagram data (a) including the electrical component parts PSd. FIG. 37 is an explanatory view showing an aspect that circuit elements of the divisional area (b) in the device system circuit diagram of FIG. 5 are drawn based on the circuit-element-drawing divisional circuit diagram data (b) including an electrical component part PSd. FIG. 38 is an explanatory view showing an aspect that circuit elements of the divisional area (c) in the device system circuit diagram of FIG. 5 are drawn based on the circuit-element-drawing divisional circuit diagram data (c) including an electrical component part PSd. FIG. 39 is an explanatory view showing an aspect that circuit elements of the divisional area (d) in the device system circuit diagram of FIG. 5 are drawn based on the circuit-element-drawing divisional circuit diagram data (d) including an electrical component part PSd. FIG. 40 is an explanatory view showing an aspect that circuit elements of the divisional area (e) in the device system circuit diagram of FIG. 5 are drawn based on the circuit-element-drawing divisional circuit diagram data (e) including an electrical component part PSd. Throughout these figures, which divisional area text description belongs to based on the electrical component parts PSd, the connection diagrams LSd, the part text information Pid and the like is determined based on rectangular shapes, connection loci or xy-coordinates at left upper corner portion of the text description area. Therefore, the electrical component parts PSd of a rectangular shape at the uppermost place in FIG. 36 extends up to the divisional area (d).

Also, the circuit diagrams shown in the above-described embodiments are assumed as extending in the left-and-right direction relative to the display 12, for example, as shown in FIG. 5. However, the circuit diagrams may be provided so as to extend in the longitudinal direction relative to the display 12 or extend in the longitudinal-and-lateral, left-and-right directions relative to the display 12.

In this embodiment, data transmission request is given from the circuit diagram supplying apparatus 10 to the server 30 in transmission units of data belonging to the divisional areas shown in FIGS. 36 to 40, where the server 30 sequentially transmits the data belonging to the divisional areas shown in FIGS. 36 to 40, as requested, to the circuit diagram supplying apparatus 10. The procedure of transmission request may be follow the already-described embodiments.

What is claimed is:

1. A circuit diagram supplying apparatus that acquires, from a server, a circuit diagram for a device system including a plurality of electrical components and displays the circuit diagram on a display unit, the circuit diagram supplying apparatus comprising:

upon receiving specification of a device system as a supply object of the circuit diagram, a transmission requester configured to request the server for transmission of circuit diagram drawing data for displaying an image of the circuit diagram of the specified device system, wherein the circuit diagram drawing data includes part placement drawing data for displaying an image of a part placement diagram locating electrical component part diagram for each electrical component included in the specified device system, and remaining circuit-diagram-element drawing data for displaying an image of remaining circuit diagram elements other than the electrical component part diagram in association with a drawing position of the electrical component part diagram in the part placement diagram, and a display controller configured to display an image of the circuit diagram on the display unit based on the circuit diagram drawing data received from the server, wherein the transmission requester:

requests the server for transmission of at least the part placement drawing data of the circuit diagram drawing data for the specified device system, and after request of transmission of the part placement drawing data, requests for transmission of the remaining circuit-diagram-element drawing data in transmission units of divided drawing data, the transmission units of divided drawing data being different portions of the remaining circuit-diagram-element drawing data that are individually received from the server and are a result of dividing the remaining circuit-diagram-element drawing data in units of a display area displayable on the display unit, and the display controller after displaying an image of, on the display unit, the part placement diagram based on the part placement drawing data received from the server, displays an image based on the divided drawing data divided-circuit-diagram drawing data received in the transmission units by superimposing on the part placement diagram being displayed on the display unit, and when sequentially receiving the remaining circuit-diagram-element drawing data in transmission units of the divided drawing data, receives data for calculating a ratio of the received divided drawing data to the whole remaining circuit-diagram-element drawing data to be sequentially received, and displaying an image of the calculated ratio on the display unit.

2. The circuit diagram supplying apparatus in accordance with claim 1, wherein the transmission requester, upon receiving specification of an electrical component included in the specified device system, further requests transmission of the divided drawing data including the electrical component part diagram corresponding to the specified electrical component in a transmission request to the server for the remaining circuit-diagram-element drawing data in the transmission units of the divided drawing data, and thereafter requests sequential transmission of the divided drawing data placed next to the divided drawing data including the electrical component part diagram corresponding to the specified electrical component, and the display controller displays on the display unit an image of the part placement diagram based on the part placement drawing data received from the server so that the electrical component part diagram corresponding to the specified electrical component is contained in the display area of the display unit.

3. The circuit diagram supplying apparatus in accordance with claim 2, wherein the display controller displays the electrical component part diagram corresponding to the specified electrical component in highlight display when displaying the part placement diagram based on the part placement drawing data received from the server.

4. The circuit diagram supplying apparatus in accordance with claim 3, wherein the remaining circuit-diagram-element drawing data includes: connection drawing data for displaying an image of a connection diagram for connecting the electrical component part diagram in the part placement diagram by reflecting actual connections between the electrical component by superimposing on the part placement diagram, connection information drawing data for displaying an image of connection information for connections of the connection diagram and terminal information for connecting terminals of the connections by superimposing on the part placement diagram, and electrical-component information drawing data for displaying an image of electrical-component information as to an electrical component corresponding to the electrical component part diagram in the part placement diagram by superimposing on the part placement diagram, the transmission requester further requests transmission of the connection drawing data before transmission request of the remaining circuit-diagram-element drawing data, and the display controller displays an image of the connection diagram based on the connection drawing data by superimposing on the part placement diagram based on the part placement drawing data.

5. The circuit diagram supplying apparatus in accordance with claim 2, wherein the remaining circuit-diagram-element drawing data includes: connection drawing data for displaying an image of a connection diagram for connecting the electrical component part diagram in the part placement diagram by reflecting actual connections between the electrical component by superimposing on the part placement diagram, connection information drawing data for displaying an image of connection information for connections of the connection diagram and terminal information for connecting terminals of the connections by superimposing on the part placement diagram, and electrical-component information drawing data for displaying an image of electrical-component information as to an electrical component corresponding to the electrical component part diagram in the part placement diagram by superimposing on the part placement diagram, the transmission requester further requests transmission of the connection drawing data before transmission request of the remaining circuit-diagram-element drawing data, and the display controller displays an image of the connection diagram based on the connection drawing data by superimposing on the part placement diagram based on the part placement drawing data.

6. The circuit diagram supplying apparatus in accordance with claim 1, wherein the remaining circuit-diagram-element drawing data includes: connection drawing data for displaying an image of a connection diagram for connecting the electrical component part diagram in the part placement diagram by reflecting actual connections between the electrical component by superimposing on the part placement diagram, connection information drawing data for displaying an image of connection information for connections of the connection diagram and terminal information for connecting terminals of the connections by superimposing on the part placement diagram, and electrical-component information drawing data for displaying an image of electrical-component information as to an electrical component corresponding to the electrical component part diagram in the part placement diagram by superimposing on the part placement diagram, the transmission requester further requests transmission of the connection drawing data before transmission request of the remaining circuit-diagram-element drawing data, and the display controller displays an image of the connection diagram based on the connection drawing data by superimposing on the part placement diagram based on the part placement drawing data.

7. A circuit diagram supplying system comprising:

the circuit diagram supplying apparatus according to claim 1, a server as the server, including:

a storage unit configured to store the part placement drawing data and the remaining circuit-diagram-element drawing data; and a transmitter configured to transmit, to the circuit diagram supplying apparatus, the part placement drawing data and the remaining circuit-diagram-element drawing data requested from the circuit diagram supplying apparatus.

8. The circuit diagram supplying system according to claim 7, wherein:

the remaining circuit-diagram-element drawing data includes: connection drawing data for displaying an image of a connection diagram for connecting the electrical component part diagram in the part placement diagram by reflecting actual connections between the electrical component by superimposing on the part placement diagram, connection information drawing data for displaying an image of connection information for connections of the connection diagram and terminal information for connecting terminals of the connections by superimposing on the part placement diagram, and electrical-component information drawing data for displaying an image of electrical-component information as to an electrical component corresponding to the electrical component part diagram in the part placement diagram by superimposing on the part placement diagram, the transmission requester further requests transmission of the connection drawing data before transmission request of the remaining circuit-diagram-element drawing data, the display controller displays an image of the connection diagram based on the connection drawing data by superimposing on the part placement diagram based on the part placement drawing data.

9. A circuit diagram supplying method of acquiring, from a server, a circuit diagram for a device system including a plurality of electrical components and displaying the circuit diagram on a display unit, the circuit diagram supplying method comprising:

receiving specification of the device system as a supply object of the circuit diagrams;

in requesting to the server for transmission of circuit diagram drawing data for displaying an image of the circuit diagrams of the specified device system, requesting transmission of at least the part placement drawing data of the circuit diagram drawing data for the specified device system, and after that requesting sequential transmission of the remaining circuit-diagram-element drawing data in transmission units of divided drawing data, the transmission units of divided drawing data being different portions of the remaining circuit-diagram-element drawing data that are individually received from the server and are a result of dividing the remaining circuit-diagram-element drawing data in units of display areas displayable on the display unit, the circuit diagram drawing data including: part placement drawing data for displaying an image of a part placement diagram locating electrical component part diagram for each electrical components included in the specified device system, and remaining circuit-diagram-element drawing data for displaying an image of remaining circuit diagram elements other than the electrical component part diagram in association with drawing positions of the electrical component part diagrams in the part placement diagram;

in displaying, on the display unit, an image of the circuit diagram based on the circuit diagram drawing data received from the server, displaying the part placement diagram based on the part placement drawing data received from the server on the display unit, and after that displaying images based on the divided drawing data received in the transmission units by superimposing on the part placement diagram being displayed on the display unit; and in sequentially receiving the remaining circuit-diagram-element drawing data in transmission units of the divided drawing data, receiving data for calculating a ratio of the received divided drawing data to the whole remaining circuit-diagram-element drawing data to be sequentially received, and displaying an image of the calculated ratio on the display unit.

10. The circuit diagram supplying method in accordance with claim 9, further comprising:

receiving specification of electrical components included in the specified device system from a user;

in requesting to the server for transmission of the remaining circuit-diagram-element drawing data in transmission units of the divided drawing data, requesting transmission of the divided drawing data including the electrical component part diagram corresponding to the specified electrical component, and after that requesting sequential transmission of the divided drawing data placed next to the divided drawing data including the electrical component part diagram corresponding to the specified electrical component; and displaying on the display unit an image of the part placement diagram based on the part placement drawing data received from the server so that the electrical component part diagram corresponding to the specified electrical component is contained in a display area of the display unit.

11. The circuit diagram supplying method in accordance with claim 10, further comprising:

in displaying the part placement diagram based on the part placement drawing data received from the server, displaying in highlight the electrical component part diagram corresponding to the specified electrical component.

12. The circuit diagram supplying method in accordance with claim 11, wherein the remaining circuit-diagram-element drawing data includes: connection drawing data for displaying an image of a connection diagram for connecting the electrical component part diagram in the part placement diagram by reflecting actual connections between the electrical components by superimposing on the part placement diagram; connection information drawing data for displaying an image of connection information for connections of the connection diagram and terminal information representing connecting terminals of the connections by superimposing on the part placement diagram, and electrical-component information drawing data for displaying an image of electrical component information as to an electrical component corresponding to the electrical component part diagram in the part placement diagram by superimposing on the part placement diagram, the method further comprising:

requesting transmission of the connection drawing data before requesting transmission of the remaining circuit-diagram-element drawing data;

displaying an image of the connection diagram based on the connection drawing data by superimposing on the part placement diagram based on the part placement drawing data.

13. The circuit diagram supplying method in accordance with claim 10, wherein the remaining circuit-diagram-element drawing data includes: connection drawing data for displaying an image of a connection diagram for connecting the electrical component part diagram in the part placement diagram by reflecting actual connections between the electrical components by superimposing on the part placement diagram; connection information drawing data for displaying an image of connection information for connections of the connection diagram and terminal information representing connecting terminals of the connections by superimposing on the part placement diagram, and electrical-component information drawing data for displaying an image of electrical component information as to an electrical component corresponding to the electrical component part diagram in the part placement diagram by superimposing on the part placement diagram, the method further comprising:

requesting transmission of the connection drawing data before requesting transmission of the remaining circuit-diagram-element drawing data;

displaying an image of the connection diagram based on the connection drawing data by superimposing on the part placement diagram based on the part placement drawing data.

14. The circuit diagram supplying method in accordance with claim 9, wherein the remaining circuit-diagram-element drawing data includes: connection drawing data for displaying an image of a connection diagram for connecting the electrical component part diagram in the part placement diagram by reflecting actual connections between the electrical components by superimposing on the part placement diagram; connection information drawing data for displaying an image of connection information for connections of the connection diagram and terminal information representing connecting terminals of the connections by superimposing on the part placement diagram, and electrical-component information drawing data for displaying an image of electrical component information as to an electrical component corresponding to the electrical component part diagram in the part placement diagram by superimposing on the part placement diagram, the method further comprising:

requesting transmission of the connection drawing data before requesting transmission of the remaining circuit-diagram-element drawing data;

displaying an image of the connection diagram based on the connection drawing data by superimposing on the part placement diagram based on the part placement drawing data.

* * * * *